United States Patent
Sasagawa et al.

(10) Patent No.: US 9,842,940 B2
(45) Date of Patent: *Dec. 12, 2017

(54) SEMICONDUCTOR DEVICE

(71) Applicant: Semiconductor Energy Laboratory Co., Ltd., Atsugi-shi, Kanagawa-ken (JP)

(72) Inventors: Shinya Sasagawa, Kanagawa (JP);
Motomu Kurata, Kanagawa (JP);
Kazuya Hanaoka, Kanagawa (JP);
Yoshiyuki Kobayashi, Kanagawa (JP);
Daisuke Matsubayashi, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/062,268

(22) Filed: Mar. 7, 2016

(65) Prior Publication Data

US 2016/0190347 A1 Jun. 30, 2016

Related U.S. Application Data

(63) Continuation of application No. 14/571,993, filed on Dec. 16, 2014, now Pat. No. 9,287,410.

(30) Foreign Application Priority Data

Dec. 18, 2013 (JP) .................................. 2013-261600

(51) Int. Cl.
*H01L 29/78* (2006.01)
*H01L 29/786* (2006.01)
(Continued)

(52) U.S. Cl.
CPC ...... *H01L 29/78696* (2013.01); *H01L 29/045* (2013.01); *H01L 29/24* (2013.01); *H01L 29/7869* (2013.01)

(58) Field of Classification Search
CPC .................................................... H01L 29/7868
(Continued)

(56) References Cited

U.S. PATENT DOCUMENTS 5,089,870 A 2/1992 Haond
5,731,856 A 3/1998 Kim et al.
(Continued)

FOREIGN PATENT DOCUMENTS

EP 1737044 A 12/2006
EP 2226847 A 9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Michael Lebentritt
(74) *Attorney, Agent, or Firm* — Fish & Richardson P.C.

(57) ABSTRACT

A semiconductor device with favorable electrical characteristics is provided. The semiconductor device includes an insulating layer, a semiconductor layer over the insulating layer, a source electrode layer and a drain electrode layer electrically connected to the semiconductor layer, a gate insulating film over the semiconductor layer, the source electrode layer, and the drain electrode layer, and a gate electrode layer overlapping with part of the semiconductor layer, part of the source electrode layer, and part of the drain electrode layer with the gate insulating film therebetween. A (Continued)

cross section of the semiconductor layer in the channel width direction is substantially triangular or substantially trapezoidal. The effective channel width is shorter than that for a rectangular cross section.

22 Claims, 49 Drawing Sheets

(51) Int. Cl.
  *H01L 29/04* (2006.01)
  *H01L 29/24* (2006.01)
(58) Field of Classification Search
  USPC .......................................................... 257/777
  See application file for complete search history.

(56) References Cited

U.S. PATENT DOCUMENTS

| | | |
|---|---|---|
| 5,744,864 A | 4/1998 | Cillessen et al. |
| 5,821,766 A | 10/1998 | Kim et al. |
| 6,246,973 B1 | 6/2001 | Sekine |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,750,673 B1 | 6/2004 | Huang et al. |
| 6,821,834 B2 | 11/2004 | Ando |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,504,678 B2 | 3/2009 | Chau et al. |
| 7,674,650 B2 | 3/2010 | Akimoto et al. |
| 7,732,819 B2 | 6/2010 | Akimoto et al. |
| 8,134,156 B2 | 3/2012 | Akimoto |
| 8,426,283 B1 | 4/2013 | Wang et al. |
| 8,492,228 B1 | 7/2013 | Leobandung et al. |
| 8,669,556 B2 | 3/2014 | Yamazaki et al. |
| 8,709,889 B2 | 4/2014 | Saito |
| 8,728,883 B2 | 5/2014 | Yamazaki et al. |
| 8,754,409 B2 | 6/2014 | Yamazaki et al. |
| 8,884,282 B2 | 11/2014 | Yamazaki |
| 9,006,736 B2 | 4/2015 | Sasagawa et al. |
| 9,287,410 B2 * | 3/2016 | Sasagawa ............ H01L 29/7869 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0277739 A1 | 11/2008 | Curatola |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0147840 A1 | 6/2011 | Cea et al. |
| 2012/0223304 A1 | 9/2012 | Yoneda |
| 2012/0292713 A1 | 11/2012 | Ohnuki |
| 2012/0313170 A1 | 12/2012 | Chang et al. |
| 2013/0175530 A1 | 7/2013 | Noda et al. |
| 2014/0151691 A1 | 6/2014 | Matsubayashi et al. |
| 2014/0252353 A1 | 9/2014 | Yamazaki et al. |
| 2014/0264324 A1 | 9/2014 | Yamazaki |
| 2014/0361293 A1 | 12/2014 | Yamazaki et al. |
| 2015/0021596 A1 | 1/2015 | Yamazaki et al. |
| 2015/0060844 A1 | 3/2015 | Miyairi et al. |
| 2015/0069384 A1 | 3/2015 | Kobayashi et al. |
| 2015/0077162 A1 | 3/2015 | Yamazaki et al. |
| 2015/0102342 A1 | 4/2015 | Yamazaki |
| 2015/0108552 A1 | 4/2015 | Yamazaki |
| 2015/0214381 A1 | 7/2015 | Sasagawa et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |

(56) References Cited

FOREIGN PATENT DOCUMENTS

| | | |
|---|---|---|
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A) May 1, 1984, vol. 29, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Syposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Syposium Digest of Technical Papers, 2007, vol. 38, pp. 1731-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "SPINEL,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

(56) References Cited

OTHER PUBLICATIONS

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT"SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

* cited by examiner $D \approx 2\sqrt{(a/2)^2 + b^2}$ $D \approx c + 2\sqrt{((a-c)/2)^2 + b^2}$ $D \approx a/3 + 2\sqrt{(a/3)^2 + b^2}$ $D \approx a/2 + 2\sqrt{(a/4)^2 + b^2}$ $D \approx a + 2b$ $J \approx h + 2\sqrt{((f-h)/2)^2 + g^2}$ $J > 2\sqrt{(f/2)^2 + g^2}$ $J \approx f/2 + 2\sqrt{(f/4)^2 + g^2}$ $J \approx 2f/3 + 2\sqrt{(f/6)^2 + g^2}$ $J \approx f + 2g$ $Q \approx 2\sqrt{(m/2)^2 + n^2}$ $Q \approx p + 2\sqrt{((m-p)/2)^2 + n^2}$ $Q \approx m/3 + 2\sqrt{(m/3)^2 + n^2}$ $Q \approx m/2 + 2\sqrt{(m/4)^2 + n^2}$ $Q \approx m + 2n$

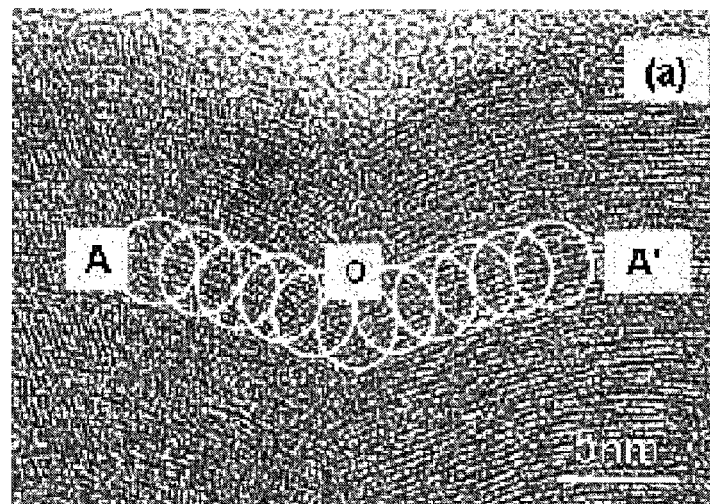
FIG. 16A
FIG. 16B
FIG. 16C
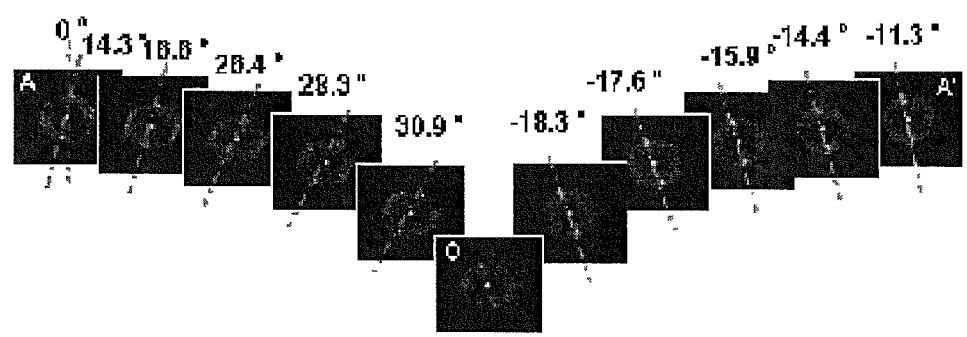

CAAC-OS nc-OS as-sputtered after a thermal treatment at 450°C

FIG. 20A DM1
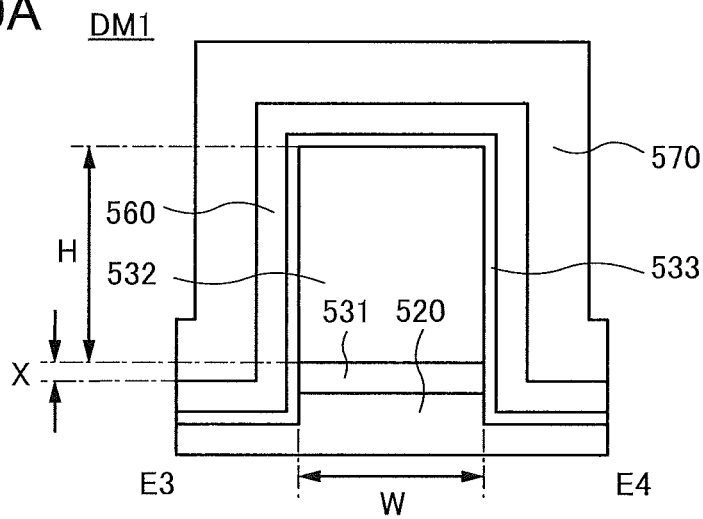
FIG. 20B DM2
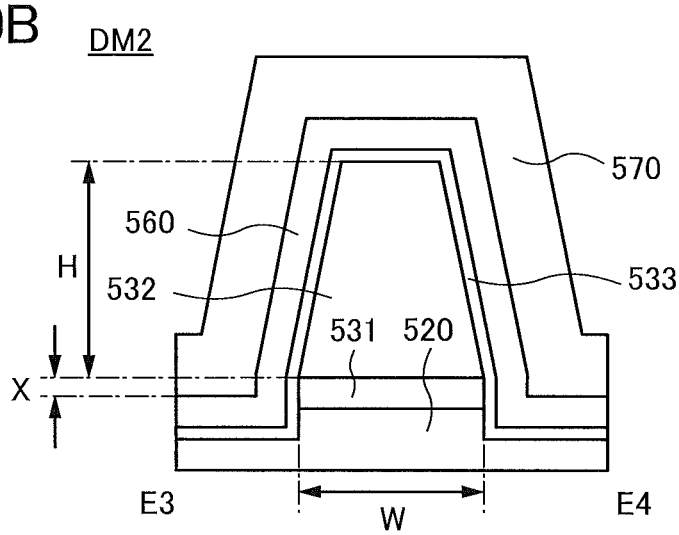
FIG. 20C DM3
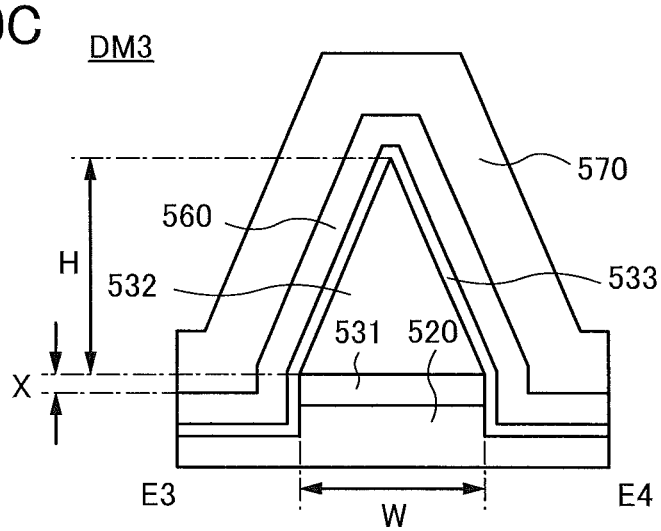

In the case of a same thickness
for the 2nd semiconductor layers

In the case of a same cross-sectional surface for the channels

In the case of a same effective channel width

FIG. 27A
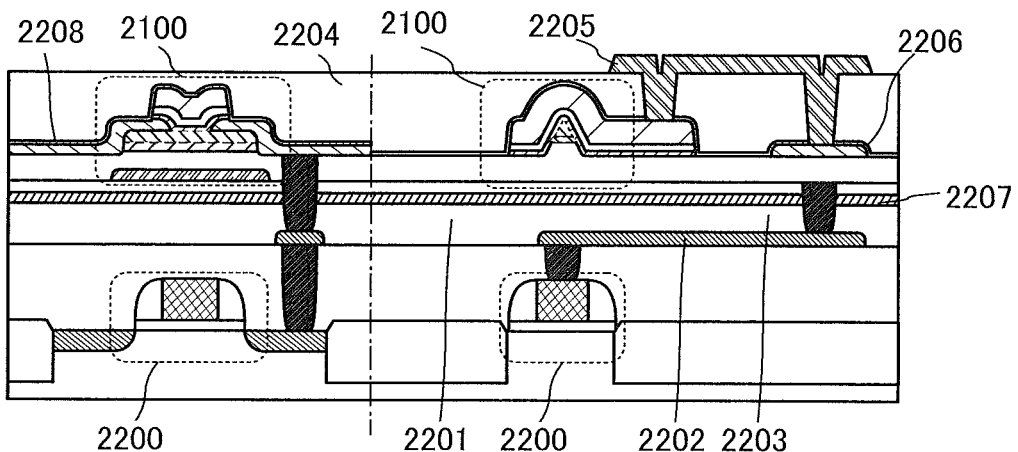
FIG. 27B    FIG. 27C
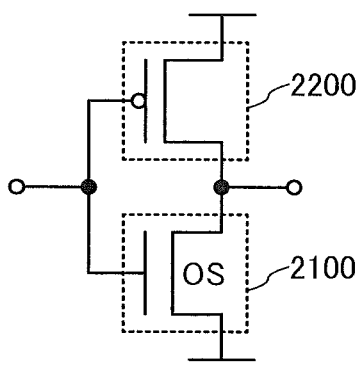 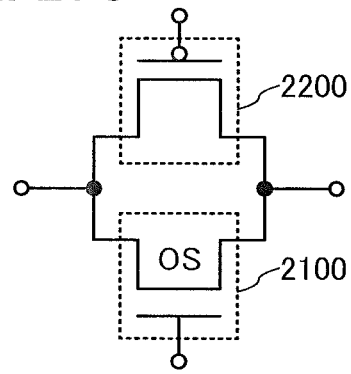
FIG. 27D
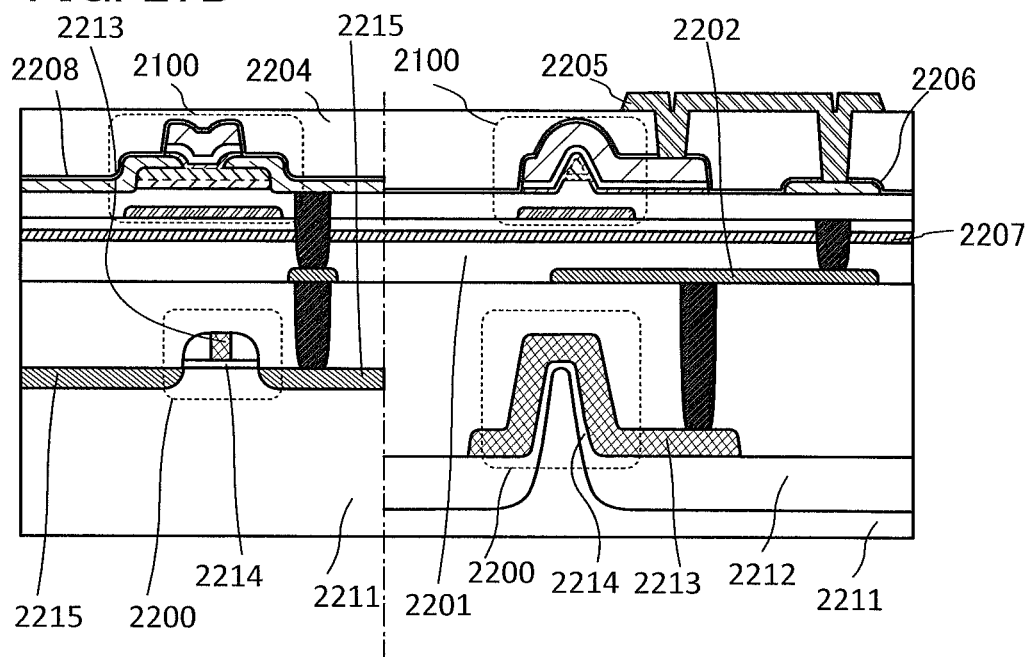

sample1 sample2 sample3 sample4

SEMICONDUCTOR DEVICE

CROSS-REFERENCE TO RELATED APPLICATIONS

This application is a continuation of U.S. application Ser. No. 14/571,993, filed Dec. 16, 2014, now allowed, which claims the benefit of a foreign priority application filed in Japan as Serial No. 2013-261600 on Dec. 18, 2013, both of which are incorporated by reference.

BACKGROUND OF THE INVENTION

1. Field of the Invention

The present invention relates to an object, a method, or a manufacturing method. Further, the present invention relates to a process, a machine, manufacture, or a composition of matter. In particular, one embodiment of the present invention relates to a semiconductor device, a display device, a light-emitting device, a memory device, an arithmetic device, an imaging device, a driving method thereof, or a manufacturing method thereof.

In this specification and the like, a semiconductor device generally means a device that can function by utilizing semiconductor characteristics. A transistor and a semiconductor circuit are embodiments of semiconductor devices. In some cases, a memory device, a display device, or an electronic device includes a semiconductor device.

2. Description of the Related Art

A technique by which transistors are formed using semiconductor thin films formed over a substrate having an insulating surface has been attracting attention. The transistor is used in a wide range of electronic devices such as an integrated circuit (IC) or an image display device (also simply referred to as a display device). A silicon-based semiconductor material is widely known as a material for a semiconductor thin film applicable to a transistor. As another material, an oxide semiconductor has been attracting attention.

For example, a technique for forming a transistor using zinc oxide or an In—Ga—Zn-based oxide semiconductor as an oxide semiconductor is disclosed (see Patent Documents 1 and 2).

In recent years, demand for integrated circuits in which semiconductor elements such as miniaturized transistors are integrated with high density has risen with increased performance and reductions in the size and weight of electronic devices.

REFERENCE

Patent Document

[Patent Document 1] Japanese Published Patent Application No. 2007-123861
[Patent Document 2] Japanese Published Patent Application No. 2007-96055

SUMMARY OF THE INVENTION

An object of one embodiment of the present invention is to provide a semiconductor device with favorable electrical characteristics. Another object is to provide a semiconductor device that is suitable for miniaturization. Another object is to provide a highly integrated semiconductor device. Another object is to provide a semiconductor device with low power consumption. Another object is to provide a highly reliable semiconductor device. Another object is to provide a semiconductor device which can retain data even when power supply is stopped. Another object is to provide a novel semiconductor device.

Note that the descriptions of these objects do not preclude the existence of other objects. In one embodiment of the present invention, there is no need to achieve all the objects. Other objects will be apparent from and can be derived from the description of the specification, the drawings, the claims, and the like.

One embodiment of the present invention relates to a transistor in which an oxide semiconductor layer is used for a channel formation region and which is characterized by a cross-sectional shape of the oxide semiconductor layer in a channel width (W) direction.

One embodiment of the present invention is a semiconductor device including an insulating layer, a semiconductor layer over the insulating layer, a source electrode layer and a drain electrode layer electrically connected to the semiconductor layer, a gate insulating film over the semiconductor layer, the source electrode layer, and the drain electrode layer, and a gate electrode layer overlapping with part of the semiconductor layer, part of the source electrode layer, and part of the drain electrode layer with the gate insulating film therebetween. When the length of a side of the semiconductor layer, which is in contact with the insulating layer, is a and the height of the semiconductor layer is b in a cross section in the channel width direction, the length D of a region where the semiconductor layer and the gate insulating film are in contact with each other is in a range expressed by the following formula (1).

[Formula 1]

$$2\sqrt{(a/2)^2+b^2} \leq D < a+2b \quad (1)$$

The length a of the side of the semiconductor layer, which is in contact with the insulating layer, is preferably longer than 10 nm and shorter than or equal to 100 nm.

The height b of the semiconductor layer is preferably greater than or equal to 10 nm and less than or equal to 200 nm.

An oxide semiconductor layer can be used as the semiconductor layer.

The oxide semiconductor layer preferably includes a crystal with c-axis alignment.

In the above structure, a conductive layer may be provided to overlap with the semiconductor layer with the insulating layer therebetween.

Another embodiment of the present invention is a semiconductor device including an insulating layer, a stack including a first semiconductor layer, a second semiconductor layer, and a third semiconductor layer formed in this order over the insulating layer, a source electrode layer and a drain electrode layer electrically connected to the stack, a gate insulating film over the stack, the source electrode layer, and the drain electrode layer, and a gate electrode layer overlapping with part of the stack, part of the source electrode layer, and part of the drain electrode layer with the gate insulating film therebetween. When the length of a side of the second semiconductor layer, which is in contact with the first semiconductor layer, is f and the height of the second semiconductor layer is g in a cross section in the channel width direction, the length J of a region where the second semiconductor layer is in contact with the gate insulating film and the third semiconductor layer is in a range expressed by the following formula (2).

[Formula 2]

$$2\sqrt{(f/2)^2+g^2} < J < f+2g \qquad (2)$$

Note that in this specification and the like, ordinal numbers such as "first", "second", and the like are used in order to avoid confusion among components and do not limit the number.

The length f of the side of the second semiconductor layer, which is in contact with the first semiconductor layer, is preferably longer than 10 nm and shorter than or equal to 100 nm.

The height g of the second semiconductor layer is preferably greater than or equal to 10 nm and less than or equal to 200 nm.

In the above structure, a conductive layer may be provided to overlap with the stack with the insulating layer therebetween.

Another embodiment of the present invention is a semiconductor device including an insulating layer, a stack including a first semiconductor layer and a second semiconductor layer formed in this order over the insulating layer, a source electrode layer and a drain electrode layer electrically connected to part of the stack, a third semiconductor layer covering part of the stack, part of the source electrode layer, and part of the drain electrode layer, and a gate insulating film and a gate electrode layer each overlapping with part of the stack, part of the source electrode layer, part of the drain electrode layer, and the third semiconductor layer. When the length of a side of the second semiconductor layer, which is in contact with the first semiconductor layer, is in and the height of the second semiconductor layer is n in a cross section in the channel width direction, the length Q of a region where the second semiconductor layer and the third semiconductor layer are in contact with each other is in a range expressed by the following formula (3).

[Formula 3]

$$2\sqrt{(m/2)^2+n^2} \leq Q < m+2n \qquad (3)$$

The length m of the side of the second semiconductor layer, which is in contact with the first semiconductor layer, is preferably longer than 10 nm and shorter than or equal to 100 nm.

The height n of the second semiconductor layer is preferably greater than or equal to 10 nm and less than or equal to 200 nm.

In the above structure, a conductive layer may be provided to overlap with the stack with the insulating layer therebetween.

In the above two structures, the first, second, and third semiconductor layers may be first, second, and third oxide semiconductor layers, respectively.

It is preferable that the first to the third oxide semiconductor layers each contain an In-M-Zn oxide (M is Al, Ti, Ga, Sn, Y, Zr, La, Ce, Nd, or Hf), and that an atomic ratio of M to In in each of the first oxide semiconductor layer and the third oxide semiconductor layer be higher than an atomic ratio of M to In in the second oxide semiconductor layer.

Each of the first to third oxide semiconductor layers preferably includes a crystal with c-axis alignment.

According to one embodiment of the present invention, a semiconductor device with favorable electrical characteristics can be provided. A semiconductor device that is suitable for miniaturization can be provided. A highly integrated semiconductor device can be provided. A semiconductor device with low power consumption can be provided. A highly reliable semiconductor device can be provided. A semiconductor device which can retain data even when power supply is stopped can be provided. A novel semiconductor device can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

In the accompanying drawings:

FIGS. 16A to 16C are cross-sectional TEM images and a local Fourier transform image of an oxide semiconductor;

FIGS. 20A to 20C are cross-sectional views illustrating device models;

FIGS. 27A to 27D are cross-sectional views and circuit diagrams of semiconductor devices;

DETAILED DESCRIPTION OF THE INVENTION

Figure 1A:
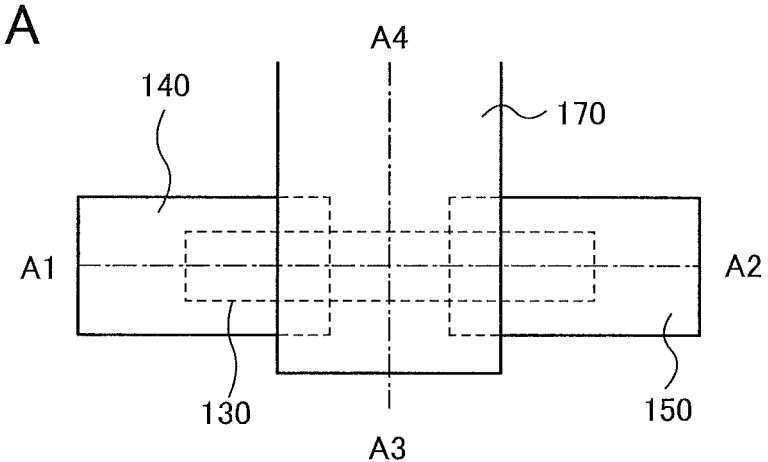
FIG. 1A is a top view illustrating a transistor and FIG. 1B is a cross-sectional view in a channel length direction of the transistor.

Embodiments and an example will be described in detail with reference to the drawings. Note that the present invention is not limited to the following description and it will be readily appreciated by those skilled in the art that modes and details can be modified in various ways without departing from the spirit and the scope of the present invention. Therefore, the present invention should not be construed as being limited to the description of the embodiments and the example below. Note that in the structures of the present invention described below, the same portions or portions having similar functions are denoted by the same reference numerals in different drawings, and the description thereof is not repeated in some cases. It is also to be noted that the same components are denoted by different hatching patterns in different drawings, or the hatching patterns are omitted in some cases.

For example, in this specification and the like, an explicit description "X and Y are connected" means that X and Y are electrically connected, X and Y are functionally connected, and X and Y are directly connected. Accordingly, without being limited to a predetermined connection relation, for example, a connection relation shown in drawings or texts, another connection relation is disclosed in the drawings or the texts.

Here, X and Y each denote an object (e.g., a device, an element, a circuit, a wiring, an electrode, a terminal, a conductive film, or a layer).

For example, in the case where X and Y are directly connected, X and Y can be connected via an element having for sole function electrical connection (e.g., a connection wiring), without an additional element that also enables electrical connection between X and Y (e.g., a switch, a transistor, a capacitor, an inductor, a resistor, a diode, a display element, a light-emitting element, or a load) interposed between X and Y.

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; or a control circuit) can be connected between X and Y. For example, even when another circuit is interposed between X and Y, X and Y are functionally connected if a signal output from X is transmitted to Y. Note that the case where X and Y are functionally connected includes the case where X and Y are directly connected and X and Y are electrically connected.

Note that in this specification and the like, an explicit description "X and Y are electrically connected" means that X and Y are electrically connected (i.e., the case where X and Y are connected with another element or circuit provided therebetween), X and Y are functionally connected (i.e., the case where X and Y are functionally connected with another circuit provided therebetween), and X and Y are directly connected (i.e., the case where X and Y are connected without another element or circuit provided therebetween). That is, in this specification and the like, the explicit expression "X and Y are electrically connected" is the same as the explicit simple expression "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope.

Other examples of the expressions include "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path", "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path", and "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that one embodiment of the present invention is not limited to these expressions which are just examples. Here, each of X, Y, Z1, and Z2 denotes an object (e.g., a device, an element, a circuit, a wiring, an electrode, a terminal, a conductive film, a layer, or the like).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

Embodiment 1

In this embodiment, a semiconductor device of one embodiment of the present invention is described with reference to drawings.

In a transistor of one embodiment of the present invention, silicon (e.g., single crystal silicon, polycrystalline silicon, or amorphous silicon), germanium, silicon germanium, silicon carbide, gallium arsenide, aluminum gallium arsenide, indium phosphide, gallium nitride, an organic semiconductor, an oxide semiconductor, or the like can be used for a channel formation region. It is particularly preferable to use an oxide semiconductor having a wider band gap than silicon for the channel formation region.

For example, the oxide semiconductor preferably contains at least indium (In) or zinc (Zn). More preferably, the oxide semiconductor contains an oxide represented by an In-M-Zn-based oxide (M is a metal such as Al, Ti, Ga, Ge, Y, Zr, Sn, La, Ce, or Hf).

In the description below, unless otherwise specified, a semiconductor device described as an example includes an oxide semiconductor in a channel formation region.

Figure 1B:
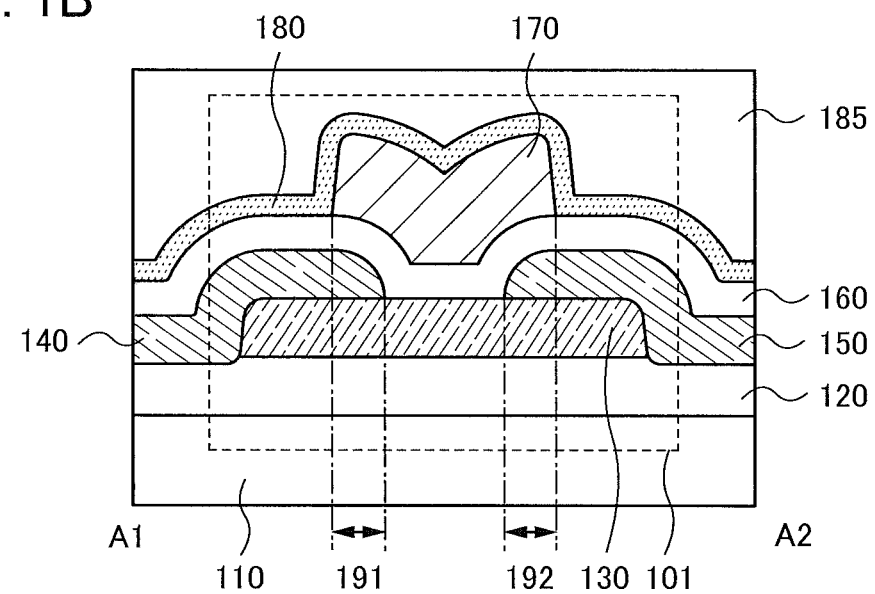
Figure 2A:
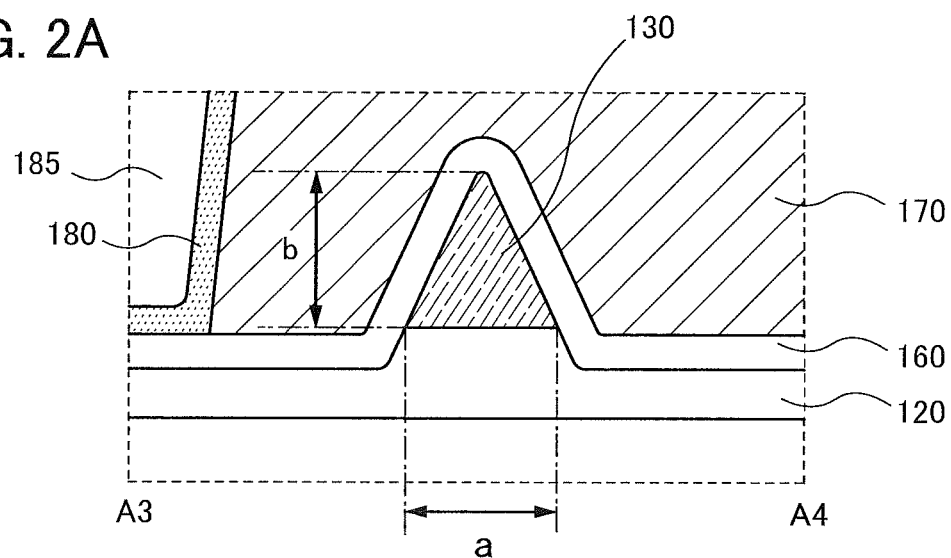
FIGS. 2A and 2B each illustrate a cross section of a transistor in a channel width direction.
Figure 2B:
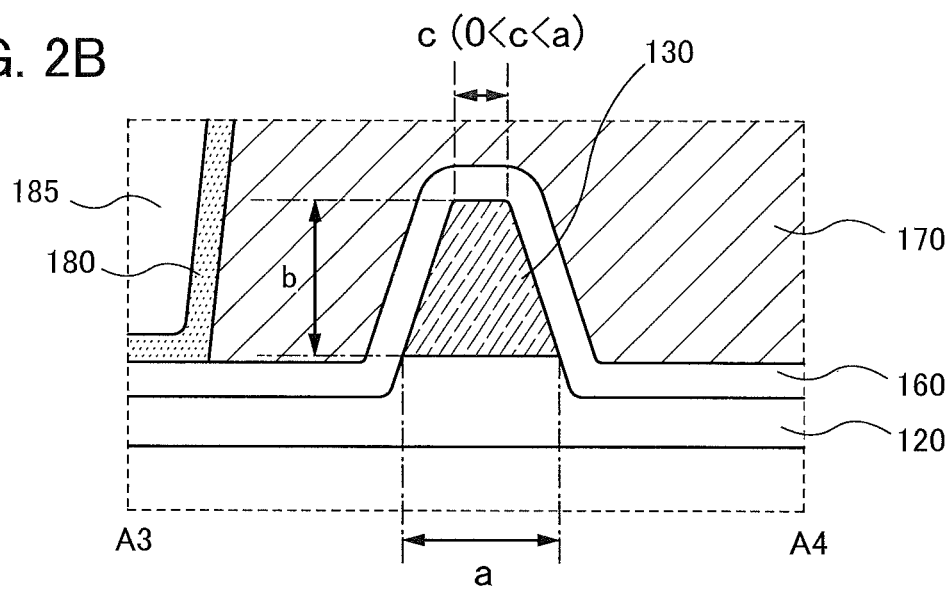

FIGS. 1A and 1B and FIGS. 2A and 2B are a top view and cross-sectional views of a transistor 101 of one embodiment of the present invention. FIG. 1A is the top view. FIG. 1B illustrates a cross section in the direction of a dashed-dotted line A1-A2 in FIG. 1A. FIGS. 2A and 2B each illustrate a cross section in the direction of a dashed-dotted line A3-A4 in FIG. 1A. In FIGS. 1A and 1B and FIGS. 2A and 2B, some components are enlarged, reduced in size, or omitted for easy understanding. In some cases, the direction of the dashed-dotted line A1-A2 is referred to as a channel length direction, and the direction of the dashed-dotted line A3-A4 is referred to as a channel width direction.

Note that the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions do not necessarily have the same value. In other words, a channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is actually formed (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of a semiconductor in some cases. In that case, an effective channel width obtained when a channel is actually formed is greater than an apparent channel width shown in the top view.

In a transistor having a three-dimensional structure, an effective channel width is difficult to measure in some cases. For example, estimation of an effective channel width from a design value requires an assumption that the shape of a semiconductor is known. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Further, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, a value different from one in the case where an effective channel width is used for the calculation is obtained in some cases.

The transistor 101 includes an insulating layer 120 over a substrate 110; an oxide semiconductor layer 130 over the insulating layer 120; a source electrode layer 140 and a drain electrode layer 150 electrically connected to the oxide semiconductor layer 130; a gate insulating film 160 over the oxide semiconductor layer 130, the source electrode layer 140, and the drain electrode layer 150; and a gate electrode layer 170 overlapping with part of the oxide semiconductor layer 130, part of the source electrode layer 140, and part of the drain electrode layer 150 with the gate insulating film 160 therebetween. In addition, an insulating layer 180 may be provided over the gate insulating film 160 and the gate electrode layer 170. Further, an insulating layer 185 formed using an oxide may be formed over the insulating layer 180. The insulating layers 180 and 185 may be provided as needed and another insulating layer may be further provided thereover.

Note that functions of a "source" and a "drain" of a transistor are sometimes replaced with each other when a transistor of opposite polarity is used or when the direction of current flow is changed in circuit operation, for example. Therefore, the terms "source" and "drain" can be replaced with each other in this specification.

Note that at least part (or the whole) of the source electrode layer 140 (and/or the drain electrode layer 150) is provided on at least part (or the whole) of a surface, a side surface, a top surface, and/or a bottom surface of a semiconductor layer such as the oxide semiconductor layer 130.

Alternatively, at least part (or the whole) of the source electrode layer 140 (and/or the drain electrode layer 150) is in contact with at least part (or the whole) of a surface, a side surface, a top surface, and/or a bottom surface of a semiconductor layer such as the oxide semiconductor layer 130. Alternatively, at least part (or the whole) of the source electrode layer 140 (and/or the drain electrode layer 150) is in contact with at least part (or the whole) of a semiconductor layer such as the oxide semiconductor layer 130.

Alternatively, at least part (or the whole) of the source electrode layer 140 (and/or the drain electrode layer 150) is electrically connected to at least part (or the whole) of a surface, a side surface, a top surface, and/or a bottom surface of a semiconductor layer such as the oxide semiconductor layer 130. Alternatively, at least part (or the whole) of the source electrode layer 140 (and/or the drain electrode layer 150) is electrically connected to at least part (or the whole) of a semiconductor layer such as the oxide semiconductor layer 130.

Alternatively, at least part (or the whole) of the source electrode layer 140 (and/or the drain electrode layer 150) is provided near at least part (or the whole) of a surface, a side surface, a top surface, and/or a bottom surface of a semiconductor layer such as the oxide semiconductor layer 130. Alternatively, at least part (or the whole) of the source electrode layer 140 (and/or the drain electrode layer 150) is provided near at least part (or the whole) of a semiconductor layer such as the oxide semiconductor layer 130.

Alternatively, at least part (or the whole) of the source electrode layer 140 (and/or the drain electrode layer 150) is provided next to at least part (or the whole) of a surface, a side surface, a top surface, and/or a bottom surface of a semiconductor layer such as the oxide semiconductor layer 130. Alternatively, at least part (or the whole) of the source electrode layer 140 (and/or the drain electrode layer 150) is provided next to at least part (or the whole) of a semiconductor layer such as the oxide semiconductor layer 130.

Alternatively, at least part (or the whole) of the source electrode layer 140 (and/or the drain electrode layer 150) is provided obliquely above at least part (or the whole) of a surface, a side surface, a top surface, and/or a bottom surface of a semiconductor layer such as the oxide semiconductor layer 130. Alternatively, at least part (or the whole) of the source electrode layer 140 (and/or the drain electrode layer 150) is provided obliquely above at least part (or the whole) of a semiconductor layer such as the oxide semiconductor layer 130.

Alternatively, at least part (or the whole) of the source electrode layer 140 (and/or the drain electrode layer 150) is provided above at least part (or the whole) of a surface, a side surface, a top surface, and/or a bottom surface of a semiconductor layer such as the oxide semiconductor layer 130. Alternatively, at least part (or the whole) of the source electrode layer 140 (and/or the drain electrode layer 150) is provided above at least part (or the whole) of a semiconductor layer such as the oxide semiconductor layer 130.

Figure 43A:
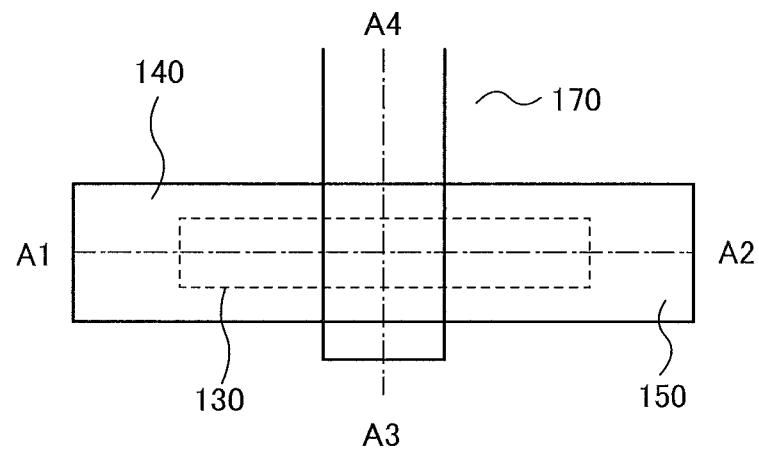
FIGS. 43A and 43B are a top view and a cross-sectional view illustrating a transistor, the cross-sectional view being taken in a channel length direction of the transistor.
Figure 43B:
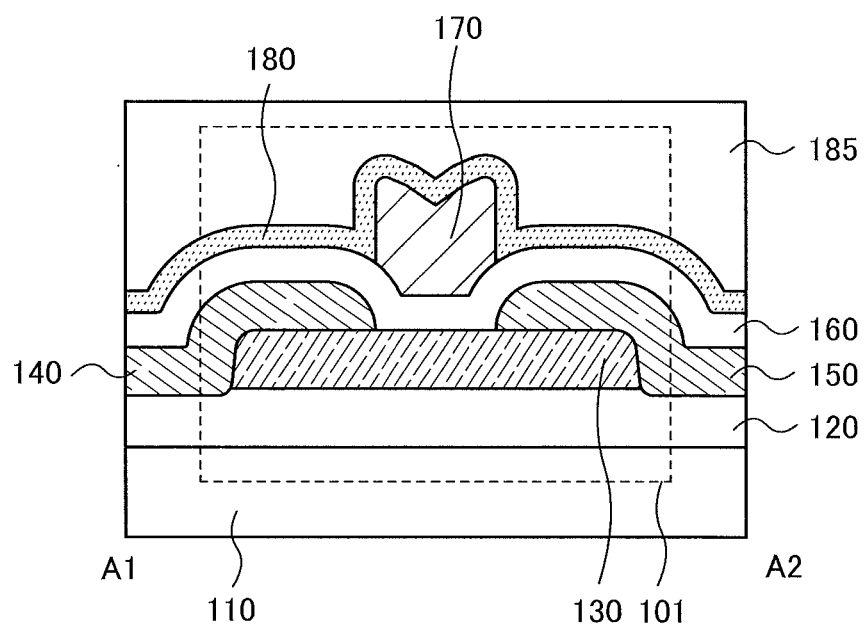
Figure 44A:
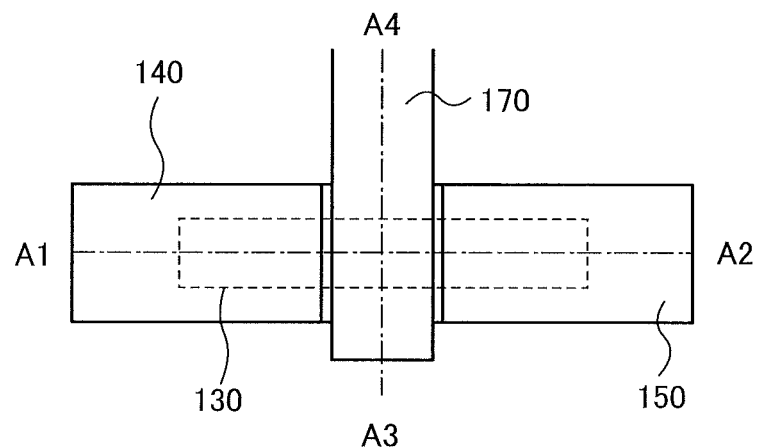
FIGS. 44A and 44B are a top view and a cross-sectional view illustrating a transistor, the cross-sectional view being taken in a channel length direction of the transistor.
Figure 44B:
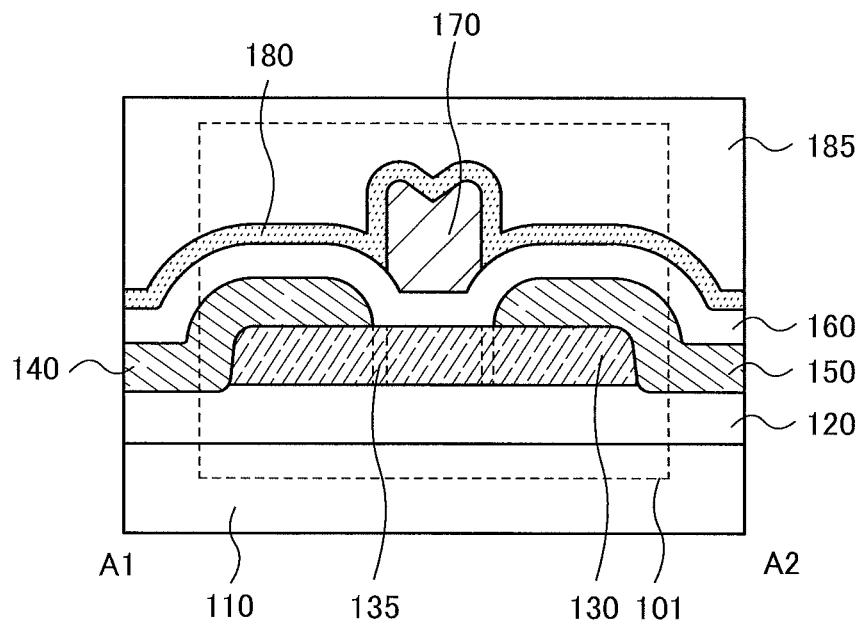

The transistor of one embodiment of the present invention has a top-gate structure with a channel length greater than or equal to 10 nm and less than or equal to 300 nm. The transistor includes a region 191 (LovS) where the gate electrode layer 170 overlaps with the source electrode layer 140 and a region 192 (LovD) where the gate electrode layer 170 overlaps with the drain electrode layer 150. To reduce parasitic capacitance, the width of each of the regions 191 and 192 in the channel length direction is preferably greater than or equal to 3 nm and less than 300 nm. Alternatively, a structure in which the regions 191 and 192 are not provided may be employed, which is illustrated in FIGS. 43A and 43B. Further alternatively, offset regions 135 may be provided between the gate electrode layer 170 and the source electrode layer 140 and between the gate electrode layer 170 and the drain electrode layer 150, respectively, which is illustrated in FIGS. 44A and 44B.

FIG. 2A illustrates one mode of a cross section of the transistor 101 in FIG. 1A in the direction of the dashed-dotted line A3-A4 (in the channel width direction). In the cross section in the channel width direction, the oxide semiconductor layer 130 is substantially triangular. Note that a "substantially triangular" shape also includes a triangular shape one or more of vertexes of which have curvatures, and a triangular shape one or more of sides of which are curved lines or bent lines.

The cross section of the oxide semiconductor layer 130 in the channel width direction may be substantially trapezoidal as illustrated in FIG. 2B. Note that a "substantially trapezoidal" shape also includes a trapezoidal shape one or more of vertexes of which have curvatures, and a trapezoidal shape one or more of sides of which are curved lines or bent lines.

As illustrated in FIG. 2A or 2B, the cross section of the oxide semiconductor layer 130 of the transistor of one embodiment of the present invention in the channel width direction is substantially triangular or substantially trapezoidal. Here, in the cross section in the channel width direction, when the length a of a side of the oxide semiconductor layer 130, which is in contact with the insulating layer 120, is equal to the height b thereof, the length of a region of the oxide semiconductor layer 130, which is in contact with the gate insulating film 160, is shorter than that in the case where the cross section is rectangular. It is also preferable that the height b be equal to or greater than the length a (b≥a). In the case where b is equal to or greater than a, the effective channel width and the on-state current of the transistors can be increased.

In the case where a channel of a transistor is formed on a surface of a semiconductor layer and a cross section of the semiconductor layer where the channel is formed is substantially triangular or substantially trapezoidal in the channel width direction, the surface area is smaller than that in the case where the cross section is rectangular. Accordingly, the effective channel width is shortened and the on-state current is slightly decreased. However, because the volume of the semiconductor layer under a gate electrode layer is reduced, an electric field of the gate electrode layer is likely to be applied to the inside of the semiconductor layer and the subthreshold swing (S value) can be reduced. Accordingly, Icut (current at a gate voltage of 0 V) is extremely small and the overall electrical characteristics of the transistor can be improved. Note that the other transistors having different structures and described in this specification also produce this effect.

When the cross section of the semiconductor layer in the channel width direction is substantially triangular or substantially trapezoidal, the coverage of the semiconductor layer with the gate insulating film is increased; thus, the gate insulating film can be easily thinned. In addition, a transistor with high gate withstand voltage can be obtained owing to an increase in the coverage with the gate insulating film.

In order that an electric field of the gate electrode is easily applied to the inside of the semiconductor layer, the cross section of the semiconductor layer in the channel width direction is preferably substantially trapezoidal, more preferably substantially trapezoidal with a short upper base, still more preferably substantially triangular. The cross sectional shape is described in detail with reference to FIGS. 3A to 3D.

Figure 3A:
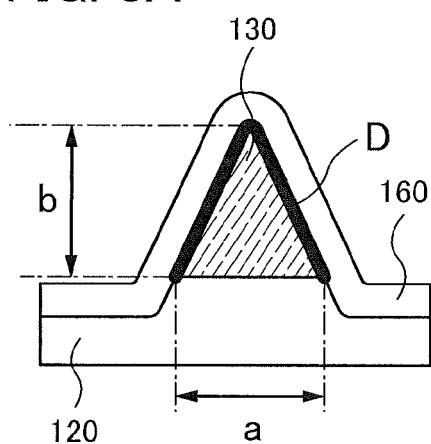
FIGS. 3A to 3D each illustrate a cross section of a transistor in a channel width direction.
Figure 3B:
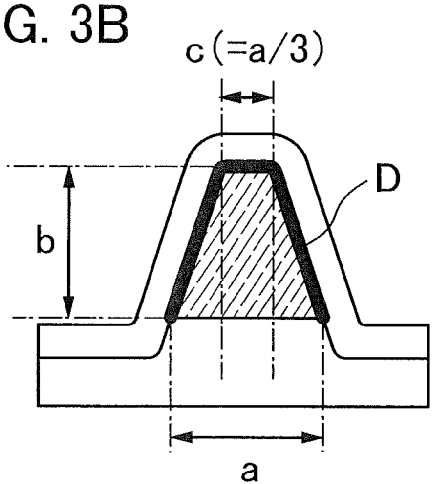
Figure 3C:
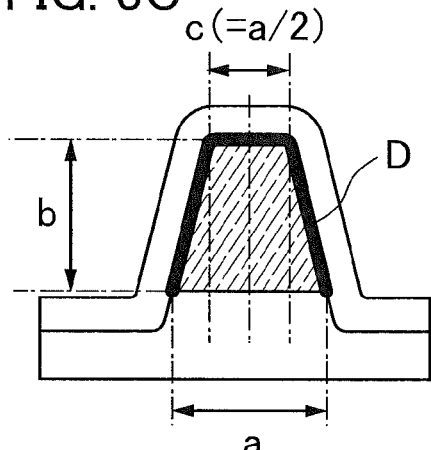
Figure 3D:
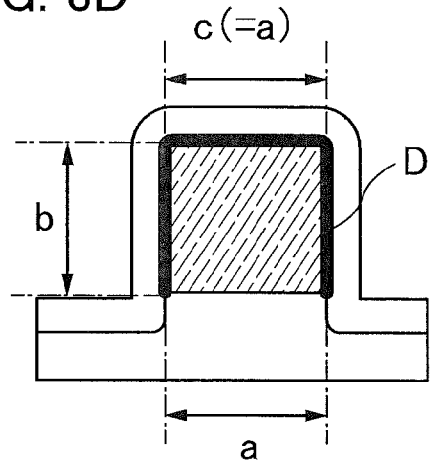

FIGS. 3A to 3D each illustrate part of a cross-sectional structure of a transistor in the channel width direction. FIGS. 3A to 3C each illustrate part of a transistor of one embodiment of the present invention, which includes the oxide semiconductor layer 130 having a substantially triangular or substantially trapezoidal cross section. FIG. 3D illustrates part of one mode of a transistor, which is a comparative example, including the oxide semiconductor layer 130 having a rectangular cross section.

FIG. 3A illustrates the case where the cross section of the oxide semiconductor layer 130 in the channel width direction is substantially triangular. When the length of a side of the oxide semiconductor layer 130, which is in contact with the insulating layer 120, is a and the height of the oxide semiconductor layer 130 is b, the length D of a region (indicated by a bold line in FIG. 3A) of the oxide semiconductor layer 130, which is in contact with the gate insulating film 160, is expressed by the following formula (4).

[Formula 4]

$$D \approx 2\sqrt{(a/2)^2 + b^2} \qquad (4)$$

FIG. 3B illustrates the case where the cross section of the oxide semiconductor layer 130 in the channel width direction is substantially trapezoidal with a short upper base. When the length of a side (lower base) of the oxide semiconductor layer 130, which is in contact with the insulating layer 120, is a, the height of the oxide semiconductor layer 130 is b, and the length of the upper base of the oxide semiconductor layer 130 is c, the length D of a region of the oxide semiconductor layer 130, which is in contact with the gate insulating film 160, is expressed by the following formula (5).

[Formula 5]

$$D \approx c + 2\sqrt{((a-c)/2)^2 + b^2} \quad (5)$$

For example, when the length c of the upper base is a/3, the length D of the region of the oxide semiconductor layer 130, which is in contact with the gate insulating film 160, is expressed by the following formula (6).

[Formula 6]

$$D \approx a/3 + 2\sqrt{(a/3)^2 + b^2} \quad (6)$$

In the case where the cross section of the oxide semiconductor layer 130 in the channel width direction is substantially trapezoidal as illustrated in FIG. 3C and the length c of the upper base is a/2, for example, the length D of the region of the oxide semiconductor layer 130, which is in contact with the gate insulating film 160, is expressed by the following formula (7).

[Formula 7]

$$D \approx a/2 + 2\sqrt{(a/4)^2 + b^2} \quad (7)$$

FIG. 3D illustrates the case where the cross section of the oxide semiconductor layer 130 in the channel width direction is rectangular. When the length of a side of the oxide semiconductor layer 130, which is in contact with the insulating layer 120, is a and the height of the oxide semiconductor layer 130 is b, the length D of a region of the oxide semiconductor layer 130, which is in contact with the gate insulating film 160, is expressed by the following formula (8).

[Formula 8]

$$D \approx a + 2b \quad (8)$$

Since the cross section of the oxide semiconductor layer 130 in the channel width direction is preferably substantially triangular rather than rectangular as described above, it is preferable from the formulae (4) and (8) that the length D of the region of the oxide semiconductor layer 130, which is in contact with the gate insulating film 160, be in a range expressed by the following formula (1).

[Formula 9]

$$2\sqrt{(a/2)^2 + b^2} \leq D < a + 2b \quad (1)$$

Furthermore, since the cross section of the oxide semiconductor layer 130 in the channel width direction is preferably substantially triangular rather than substantially trapezoidal, it is more preferable from the formulae (4) and (7) that the length D of the region of the oxide semiconductor layer 130, which is in contact with the gate insulating film 160, be in a range expressed by the following formula (9).

[Formula 10]

$$2\sqrt{(a/2)^2 + b^2} \leq D \leq a/2 + 2\sqrt{(a/4)^2 + b^2} \quad (9)$$

Furthermore, since the cross section of the oxide semiconductor layer 130 in the channel width direction is preferably substantially triangular rather than trapezoidal with a short upper base, it is still more preferable from the formulae (4) and (6) that the length D of the region of the oxide semiconductor layer 130, which is in contact with the gate insulating film 160, be in a range expressed by the following formula (10).

[Formula 11]

$$2\sqrt{(a/2)^2 + b^2} \leq D \leq a/3 + 2\sqrt{(a/3)^2 + b^2} \quad (10)$$

As described above, in the cross section of the oxide semiconductor layer 130 of the transistor 101 of one embodiment of the present invention in the channel width direction, when the length of the side of the oxide semiconductor layer 130, which is in contact with the insulating layer 120, is a and the height of the oxide semiconductor layer 130 is b, the length D of the region of the oxide semiconductor layer 130, which is in contact with the gate insulating film 160, is in the range expressed by the formula (1), preferably in the range expressed by the formula (9), more preferably in the range expressed by the formula (10).

Although the length D of the region of the oxide semiconductor layer 130, which is in contact with the gate insulating film 160, can be calculated by approximating the cross-sectional shape to an ideal triangular, trapezoidal, or rectangular shape, some errors might be observed in the case where a vertex or a side in the actual shape has a curvature. Therefore, it is preferable to employ image processing for measuring the circumference of the oxide semiconductor layer 130 in calculation of the length D of the region of the oxide semiconductor layer 130, which is in contact with the gate insulating film 160. Note that the image processing can also be employed to calculate the circumference of layers in transistors having different structures in this specification.

The length a of the side of the oxide semiconductor layer 130, which is in contact with the insulating layer 120, is preferably greater than or equal to 10 nm and less than or equal to 100 nm. When the length a of the side is in the above range, the cross section of the oxide semiconductor layer 130 in the channel width direction easily becomes substantially triangular or substantially trapezoidal with a short upper base. When the length a of the side is greater than 100 nm, the electrical characteristics of the transistor might be equivalent to those of a transistor including an oxide semiconductor layer having a rectangular cross section in the channel width direction.

The height b of the oxide semiconductor layer 130 is preferably greater than or equal to 10 nm and less than or equal to 200 nm. When the height b is out of the above range, it is extremely difficult for the oxide semiconductor layer 130 to have a substantially triangular cross section or a substantially trapezoidal cross section with a short upper base in the channel width direction.

Figure 4A:
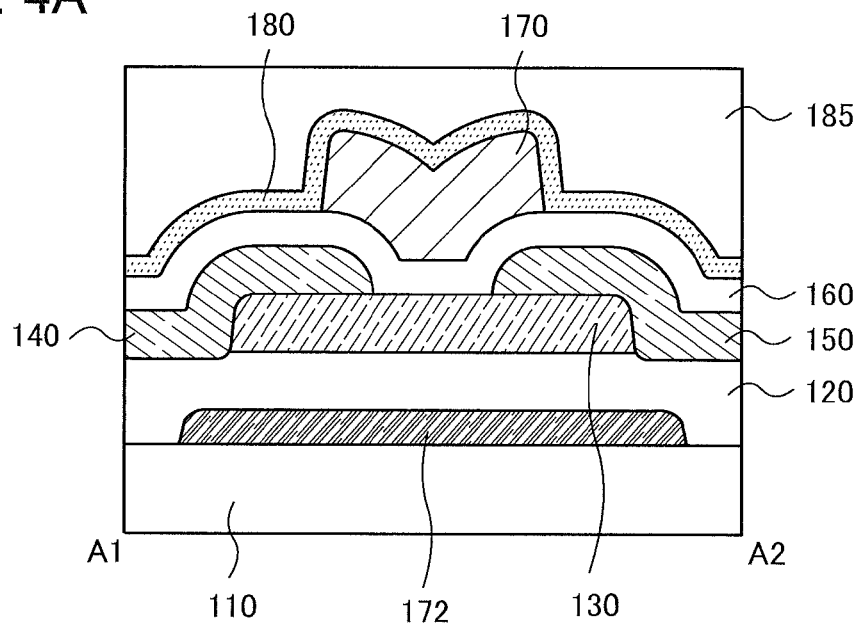
FIGS. 4A and 4B are cross-sectional views illustrating a transistor.
Figure 4B:
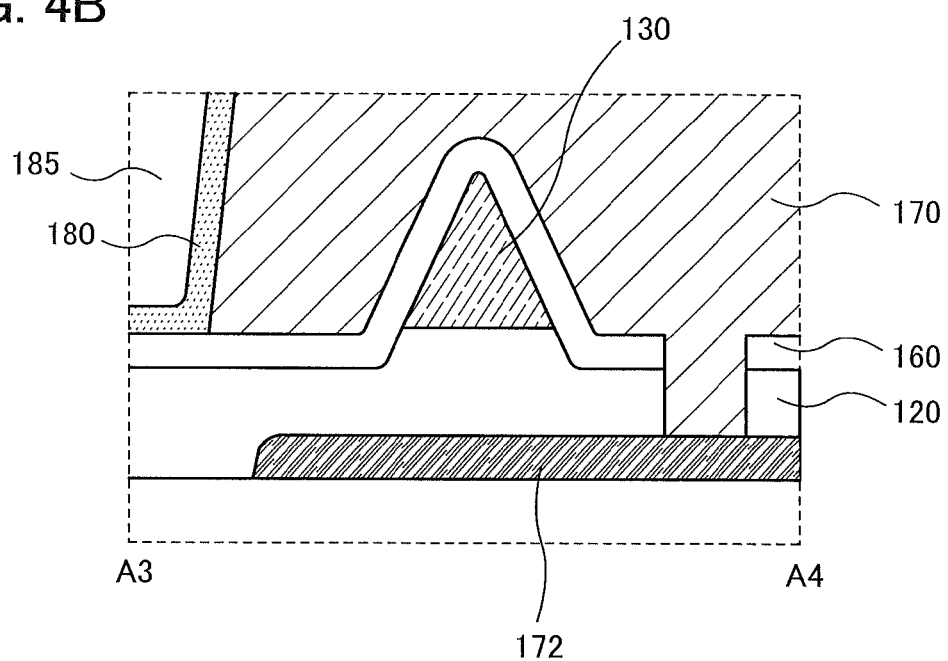

The transistor 101 of one embodiment of the present invention may include a conductive film 172 between the oxide semiconductor layer 130 and the substrate 110 as illustrated in FIG. 4A. When the conductive film is used as a second gate electrode layer (back gate), the on-state current can be further increased and the threshold voltage can be controlled. In order to increase the on-state current, for example, the gate electrode layer 170 and the conductive film 172 are set to have the same potential, and the transistor is driven as a dual-gate transistor. In this case, as shown in FIG. 4B, the gate electrode layer 170 and the conductive film 172 may be connected to each other through a contact hole. Further, to control the threshold voltage, a fixed potential, which is different from a potential of the gate electrode layer 170, is supplied to the conductive film 172.

Figure 5A:
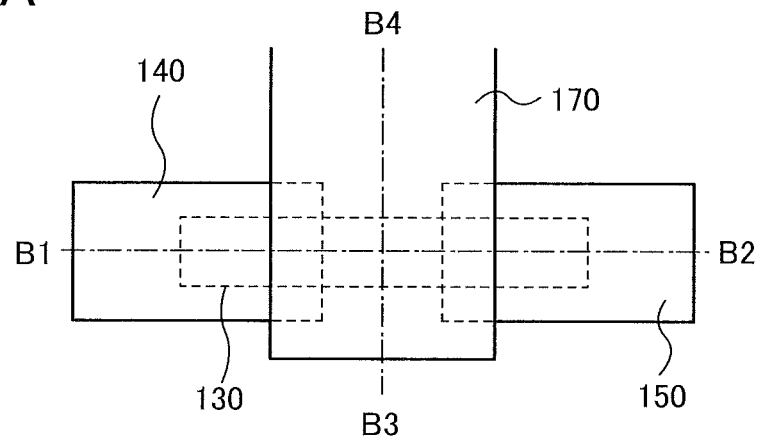
FIGS. 5A and 5B are a top view and a cross-sectional view illustrating a transistor, the cross-sectional view being taken in a channel length direction of the transistor.
Figure 5B:
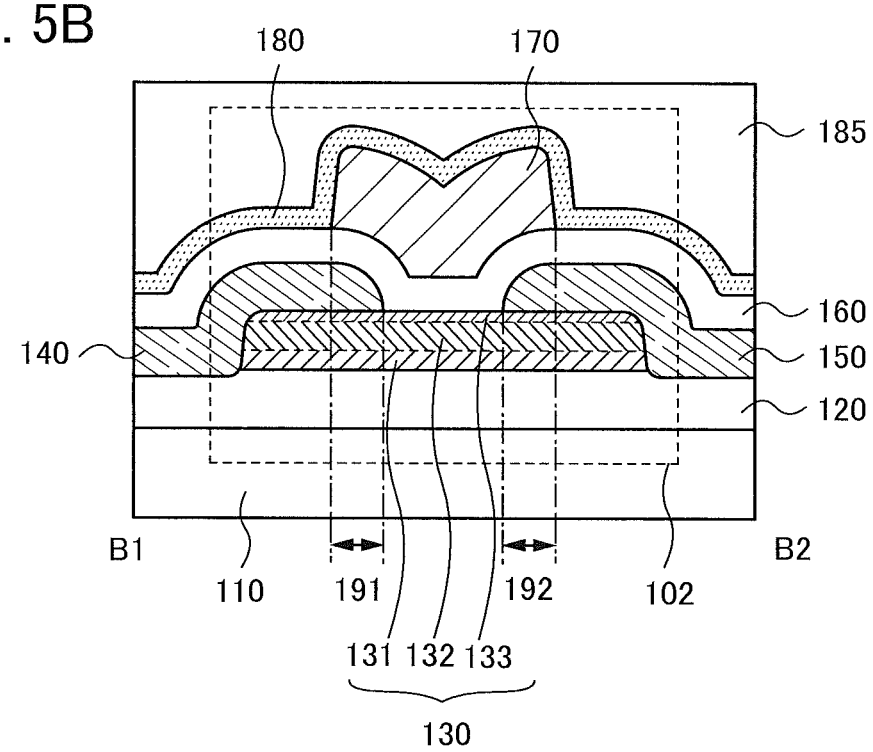
Figure 6A:
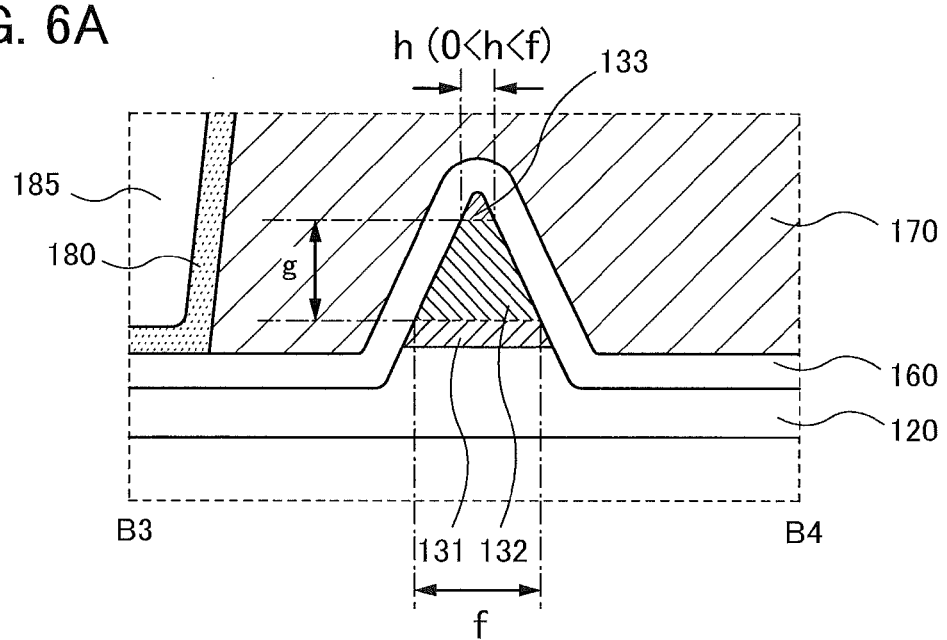
FIGS. 6A and 6B each illustrate a cross section of a transistor in a channel width direction.
Figure 6B:
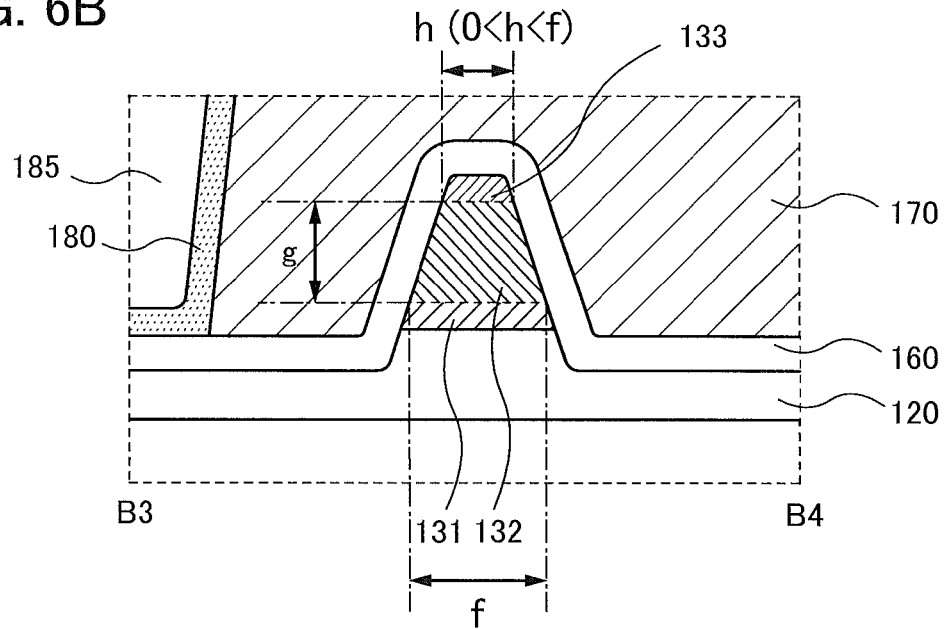

The transistor of one embodiment of the present invention may have a structure illustrated in FIGS. 5A and 5B and FIGS. 6A and 6B. FIG. 5A is a top view. FIG. 5B illustrates a cross section in the direction of a dashed-dotted line B1-B2 in FIG. 5A. FIGS. 6A and 6B each illustrate a cross section in the direction of a dashed-dotted line B3-B4 in FIG. 5A. In FIGS. 5A and 5B and FIGS. 6A and 6B, some components are enlarged, reduced in size, or omitted for easy understanding. In some cases, the direction of the dashed-dotted line B1-B2 is referred to as a channel length direction, and the direction of the dashed-dotted line B3-B4 is referred to as a channel width direction.

A transistor 102 shown in FIGS. 5A and 5B and FIGS. 6A and 6B differs from the transistor 101 in that a first oxide semiconductor layer 131, a second oxide semiconductor layer 132, and a third oxide semiconductor layer 133 are formed, as the oxide semiconductor layer 130, in this order from the insulating layer 120 side.

Oxide semiconductor layers with different compositions, for example, can be used as the first oxide semiconductor layer 131, the second oxide semiconductor layer 132, and the third oxide semiconductor layer 133.

It is also possible to apply the structure shown in FIGS. 4A and 4B to the transistor 102.

FIG. 6A illustrates one mode of a cross section in the direction of the dashed-dotted line B3-B4 (in the channel width direction) in FIG. 5A. In the cross section in the channel width direction, the oxide semiconductor layer 130 is substantially triangular. In addition, the second oxide semiconductor layer 132 where a channel is formed is substantially trapezoidal with a short upper base.

The cross section of the oxide semiconductor layer 130 in the channel width direction may be substantially trapezoidal as illustrated in FIG. 6B. In this case, the cross section of the second oxide semiconductor layer 132 where a channel is formed is also substantially trapezoidal.

As illustrated in FIG. 6A or 6B, in the transistor of one embodiment of the present invention, the cross section of the oxide semiconductor layer 130 in the channel width direction is substantially triangular or substantially trapezoidal and the cross section of the second oxide semiconductor layer 132 in the channel width direction is substantially trapezoidal. The length of a region of the second oxide semiconductor layer 132, which is in contact with the gate insulating film 160 and the third oxide semiconductor layer 133, is shorter than that in the case where the cross section of the second oxide semiconductor layer 132 in the channel width direction is rectangular.

Figure 7A:
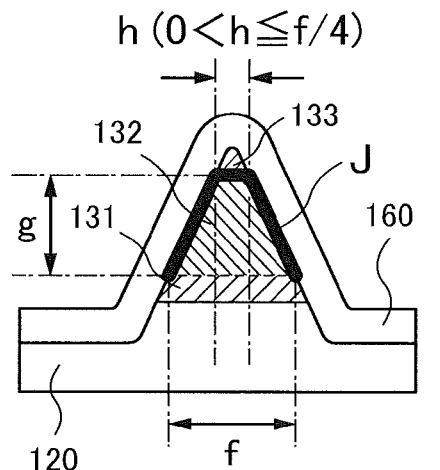
FIGS. 7A to 7D each illustrate a cross section of a transistor in a channel width direction.
Figure 7B:
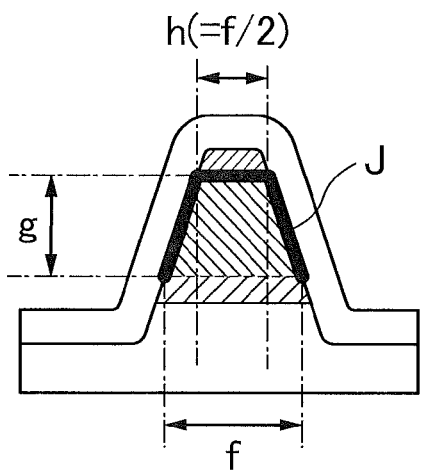
Figure 7C:
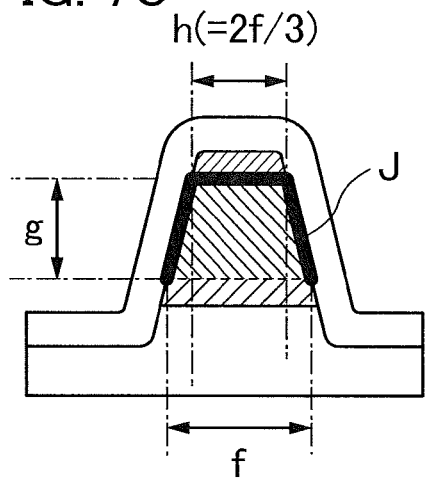
Figure 7D:
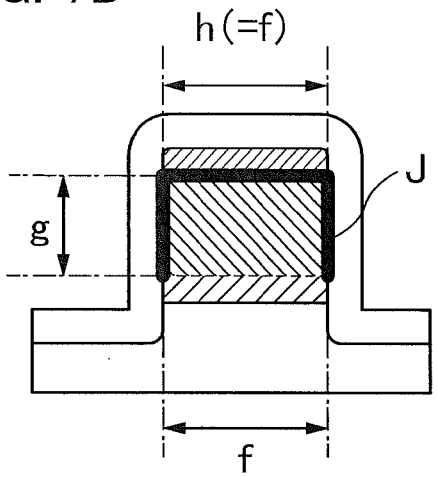

FIGS. 7A to 7D each illustrate part of a cross-sectional structure of a transistor in the channel width direction. FIGS. 7A to 7C each illustrate part of a transistor of one embodiment of the present invention, which includes the oxide semiconductor layer 130 having a substantially triangular or substantially trapezoidal cross section. FIG. 7D illustrates part of one mode of a transistor, which is a comparative example, including the oxide semiconductor layer 130 having a rectangular cross section.

FIG. 7A illustrates the case where the cross section of the oxide semiconductor layer 130 in the channel width direction is substantially triangular and the cross section of the second oxide semiconductor layer 132 is substantially trapezoidal with an extremely short upper base whose length is h. When the length of a side of the second oxide semiconductor layer 132, which is in contact with the first oxide semiconductor layer 131, is f and the height of the second oxide semiconductor layer 132 is g, the length J of a region (indicated by a bold line in FIG. 7A) of the second oxide semiconductor layer 132, which is in contact with the gate insulating film 160 and the third oxide semiconductor layer 133, is expressed by the following formula (11). For example, the length h of the upper base can be in a range $0 < h \leq f/4$, i.e., h is greater than 0 and less than or equal to f/4.

[Formula 12]

$$J \approx h + 2\sqrt{((f-h)/2)^2 + g^2} \quad (11)$$

Since the length h of the upper base is greater than 0, the length J of the region of the second oxide semiconductor layer 132, which is in contact with the gate insulating film 160 and the third oxide semiconductor layer 133, also satisfies the following formula (12).

[Formula 13]

$$J > 2\sqrt{(f/2)^2 + g^2} \quad (12)$$

FIG. 7B illustrates the case where the cross section of the oxide semiconductor layer 130 in the channel width direction is substantially trapezoidal and the cross section of the second oxide semiconductor layer 132 in the channel width direction is substantially trapezoidal with a short upper base whose length is h. When the length of a side (lower base) of the second oxide semiconductor layer 132, which is in contact with the first oxide semiconductor layer 131, is f, the height of the second oxide semiconductor layer 132 is g, and the length of the side (upper base) of the second oxide semiconductor layer 132, which is in contact with the third oxide semiconductor layer 133, is h, the length J of a region of the second oxide semiconductor layer 132, which is in contact with the gate insulating film 160 and the third oxide semiconductor layer 133, is expressed by the following formula (11) as in the case of FIG. 7A.

For example, when the length h of the upper base is f/2, the length J of the region of the second oxide semiconductor layer 132, which is in contact with the gate insulating film 160 and the third oxide semiconductor layer 133, is expressed by the following formula (13).

[Formula 14]

$$J \approx f/2 + 2\sqrt{(f/4)^2 + g^2} \quad (13)$$

In the case where, as illustrated in FIG. 7C, the cross section of the oxide semiconductor layer 130 in the channel width direction is substantially trapezoidal, the cross section of the second oxide semiconductor layer 132 in the channel width direction is substantially trapezoidal, and the length h of the upper base is 2f/3, for example, the length J of a region of the second oxide semiconductor layer 132, which is in contact with the gate insulating film 160 and the third oxide semiconductor layer 133, is expressed by the following formula (14).

[Formula 15]

$$J \approx 2f/3 + 2\sqrt{(f/6)^2 + g^2} \quad (14)$$

FIG. 7D illustrates the case where the cross section of the oxide semiconductor layer 130 in the channel width direction is rectangular. When the length of a side of the second oxide semiconductor layer 132, which is in contact with the first oxide semiconductor layer 131, is f and the height of the second oxide semiconductor layer 132 is g, the length J of a region of the second oxide semiconductor layer 132, which is in contact with the gate insulating film 160 and the third oxide semiconductor layer 133, is expressed by the following formula (15).

[Formula 16]

$$J \approx f + 2g \quad (15)$$

Since the cross section of the oxide semiconductor layer 130 in the channel width direction is preferably substantially triangular rather than rectangular for the same reason as the transistor 101, it is preferable from the formulae (12) and (15) that the length J of the region of the second oxide semiconductor layer 132, which is in contact with the gate insulating film 160 and the third oxide semiconductor layer 133, be in a range expressed by the following formula (2).

[Formula 17]

$$2\sqrt{(f/2)^2 + g^2} < J < f + 2g \quad (2)$$

Furthermore, since the cross section of the oxide semiconductor layer 130 in the channel width direction is preferably substantially triangular rather than substantially trapezoidal, it is more preferable from the formulae (12) and (14) that the length J of the region of the second oxide semiconductor layer 132, which is in contact with the gate insulating film 160 and the third oxide semiconductor layer 133, be in a range expressed by the following formula (16).

[Formula 18]

$$2\sqrt{(f/2)^2 + g^2} < J \leq 2f/3 + 2\sqrt{(f/6)^2 + g^2} \quad (16)$$

Furthermore, since the cross section of the oxide semiconductor layer 130 in the channel width direction is preferably substantially triangular rather than substantially trapezoidal with a short upper base, it is still more preferable from the formulae (12) and (13) that the length J of the region of the second oxide semiconductor layer 132, which is in contact with the gate insulating film 160 and the third oxide semiconductor layer 133, be in a range expressed by the following formula (17).

[Formula 19]

$$2\sqrt{(f/2)^2 + g^2} < J \leq f/2 + 2\sqrt{(f/4)^2 + g^2} \quad (17)$$

As described above, in the cross section of the oxide semiconductor layer 130 of the transistor 102 of one embodiment of the present invention in the channel width direction, when the length of the side of the second oxide semiconductor layer 132, which is in contact with the first oxide semiconductor layer 131, is f and the height of the second oxide semiconductor layer 132 is g, the length J of the region of the second oxide semiconductor layer 132, which is in contact with the gate insulating film 160 and the third oxide semiconductor layer 133, is in the range expressed by the formula (2), preferably in the range expressed by the formula (16), more preferably in the range expressed by the formula (17).

The length f of the side of the second oxide semiconductor layer 132, which is in contact with the first oxide semiconductor layer 131, is preferably greater than or equal to 10 nm and less than or equal to 100 nm. When the length f of the side is in the above range, the cross section of the second oxide semiconductor layer 132 in the channel width direction easily becomes substantially trapezoidal with a short upper base. When the length f of the side is greater than 100 nm, the electrical characteristics of the transistor might be equivalent to those of a transistor including an oxide semiconductor layer having a rectangular cross section in the channel width direction.

The height g of the second oxide semiconductor layer 132 is preferably greater than or equal to 10 nm and less than or equal to 200 nm. When the height g is out of the above range, it is extremely difficult for the second oxide semiconductor layer 132 to have a substantially trapezoidal cross section with a short upper base in the channel width direction.

Figure 8A:
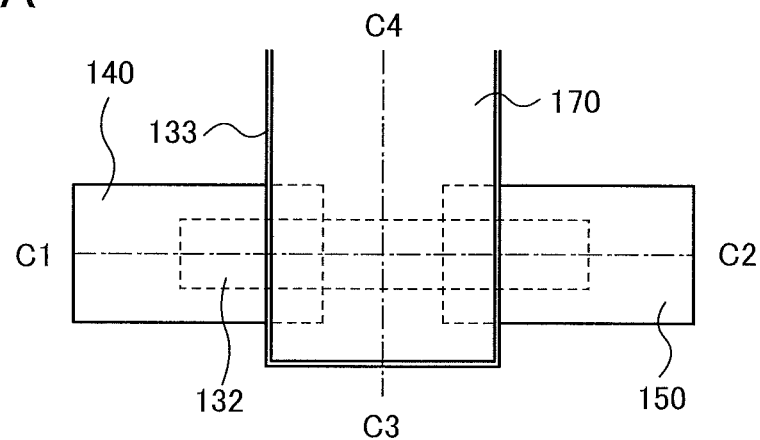
FIGS. 8A and 8B are a top view and a cross-sectional view illustrating a transistor, the cross-sectional view being taken in a channel length direction of the transistor.
Figure 8B:
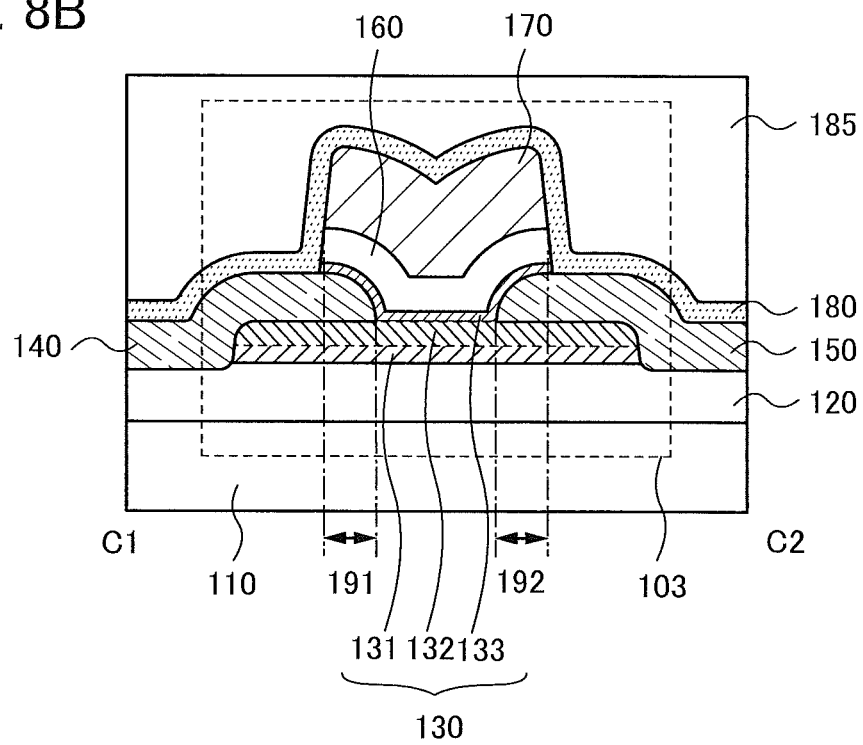
Figure 9A:
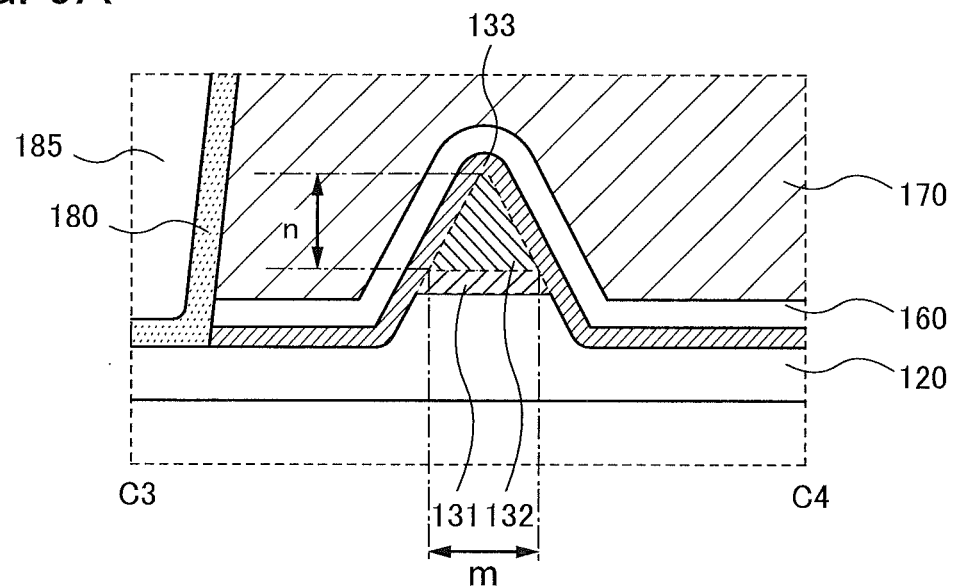
FIGS. 9A and 9B each illustrate a cross section of a transistor in a channel width direction.
Figure 9B:
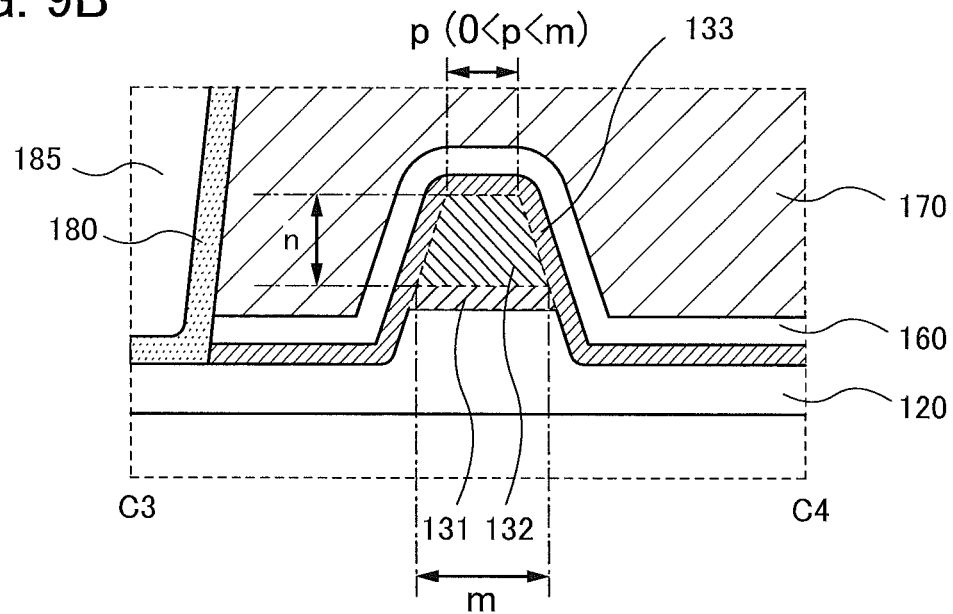

The transistor of one embodiment of the present invention may have a structure illustrated in FIGS. 8A and 8B and FIGS. 9A and 9B. FIG. 8A is a top view. FIG. 8B illustrates a cross section in the direction of a dashed-dotted line C1-C2 in FIG. 8A. FIGS. 9A and 9B each illustrate a cross section in the direction of a dashed-dotted line C3-C4 in FIG. 8A. In FIGS. 8A and 8B and FIGS. 9A and 9B, some components are enlarged, reduced in size, or omitted for easy understanding. In some cases, the direction of the dashed-dotted line C1-C2 is referred to as a channel length direction, and the direction of the dashed-dotted line C3-C4 is referred to as a channel width direction.

A transistor 103 shown in FIGS. 8A and 8B and FIGS. 9A and 9B differs from the transistor 101 and the transistor 102 in that the oxide semiconductor layer 130 includes a stack in which the first oxide semiconductor layer 131 and the second oxide semiconductor layer 132 are formed in this order from the insulating layer 120 side and the third oxide semiconductor layer 133 covering part of the stack.

Oxide semiconductor layers with different compositions, for example, can be used as the first oxide semiconductor layer 131, the second oxide semiconductor layer 132, and the third oxide semiconductor layer 133.

Figure 45A:
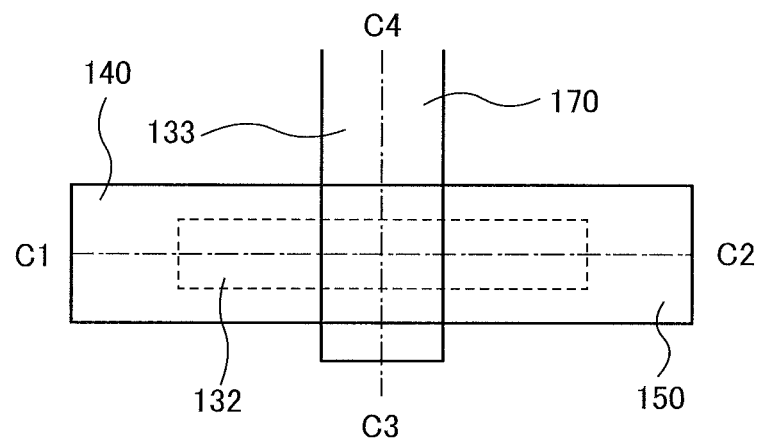
FIGS. 45A and 45B are a top view and a cross-sectional view illustrating a transistor, the cross-sectional view being taken in a channel length direction of the transistor.
Figure 45B:
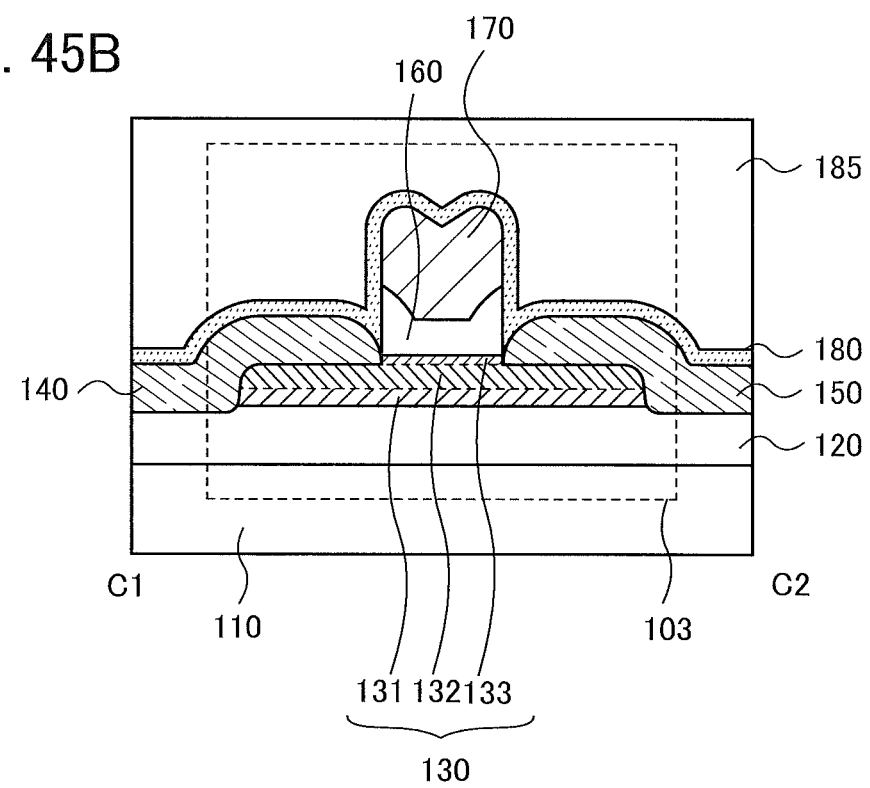

Note that a structure in which the regions 191 and 192 in FIGS. 8A and 8B are not provided may be employed, which is illustrated in FIGS. 45A and 45B.

Figure 38A:
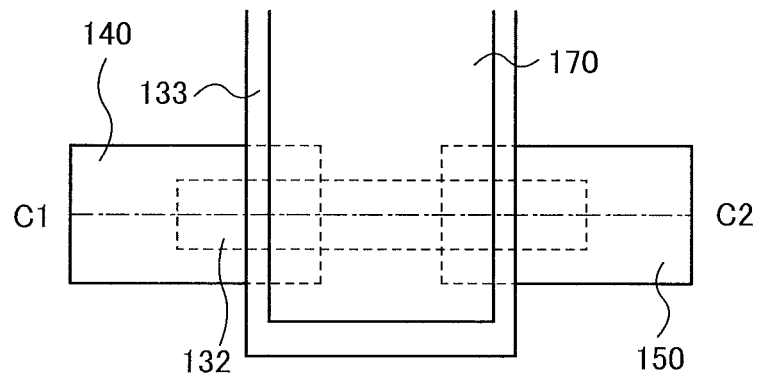
FIGS. 38A and 38B are a top view and a cross-sectional view illustrating a transistor, the cross-sectional view being taken in a channel length direction of the transistor.
Figure 38B:
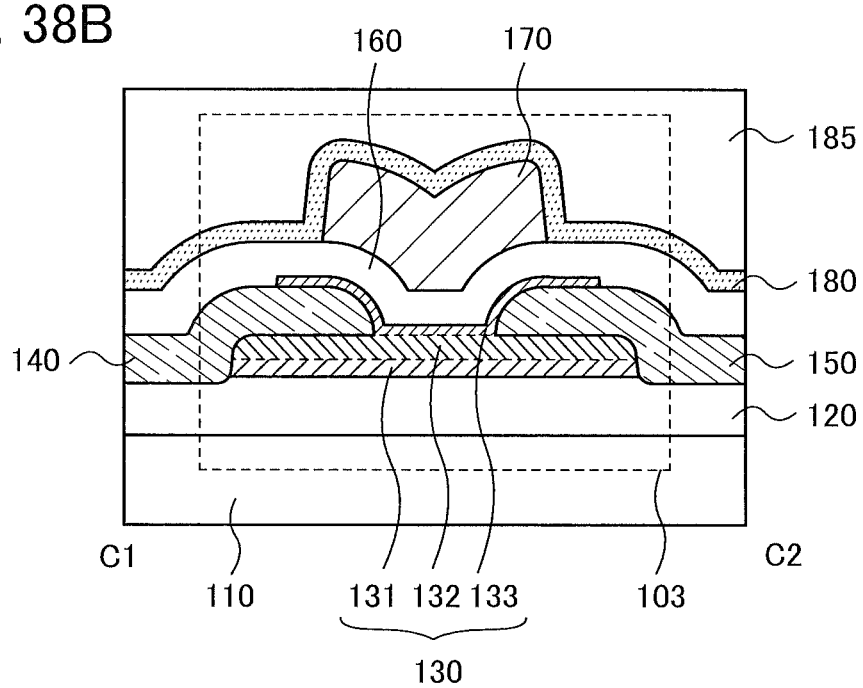
Figure 46A:
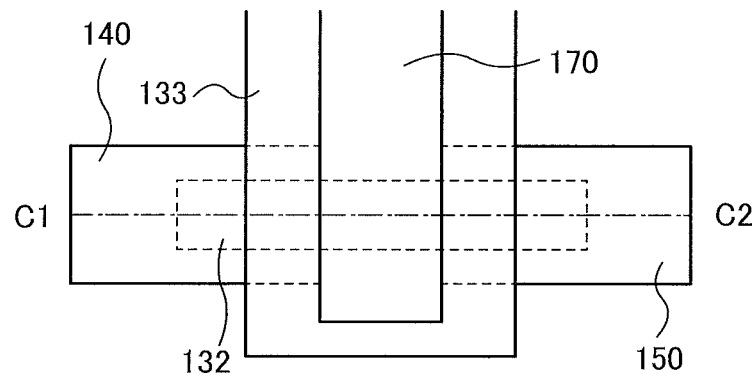
FIGS. 46A and 46B are a top view and a cross-sectional view illustrating a transistor, the cross-sectional view being taken in a channel length direction of the transistor.
Figure 46B:
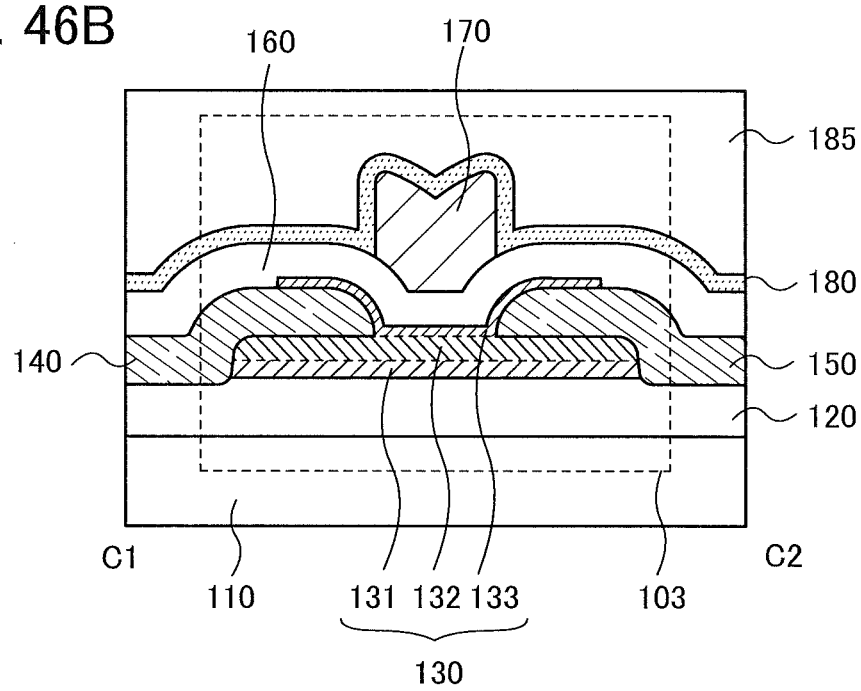
Figure 47A:
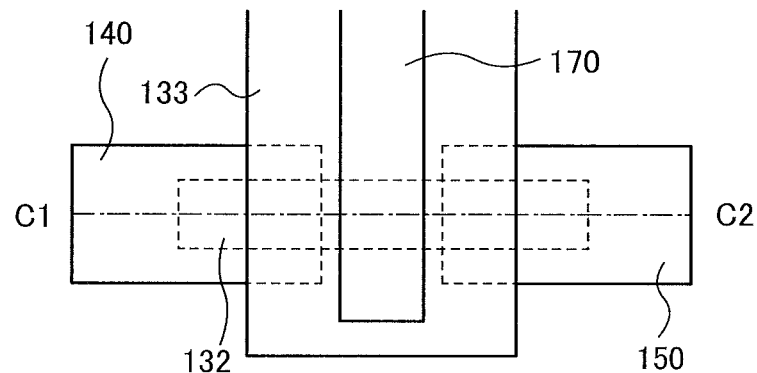
FIGS. 47A and 47B are a top view and a cross-sectional view illustrating a transistor, the cross-sectional view being taken in a channel length direction of the transistor.
Figure 47B:
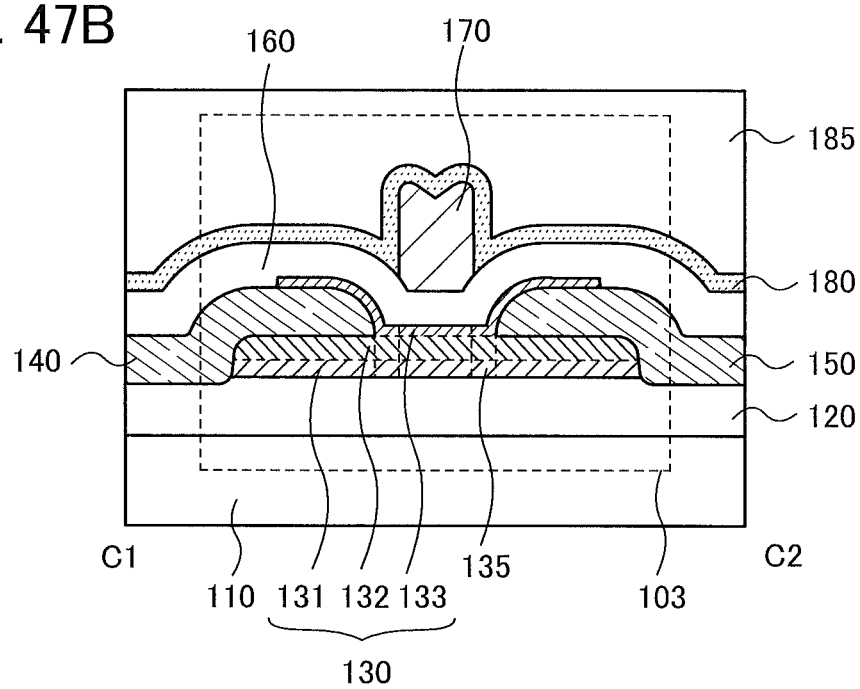

As illustrated in FIGS. 38A and 38B, the third oxide semiconductor layer 133 may have an island shape and the gate insulating film 160 may be formed so as to cover the third oxide semiconductor layer 133. Also in this case, a structure in which the regions 191 and 192 are not provided may be employed, which is illustrated in FIGS. 46A and 46B. Alternatively, offset regions 135 may be provided between the gate electrode layer 170 and the source electrode layer 140 and between the gate electrode layer 170 and the drain electrode layer 150, respectively, which is illustrated in FIGS. 47A and 47B.

Figure 39A:
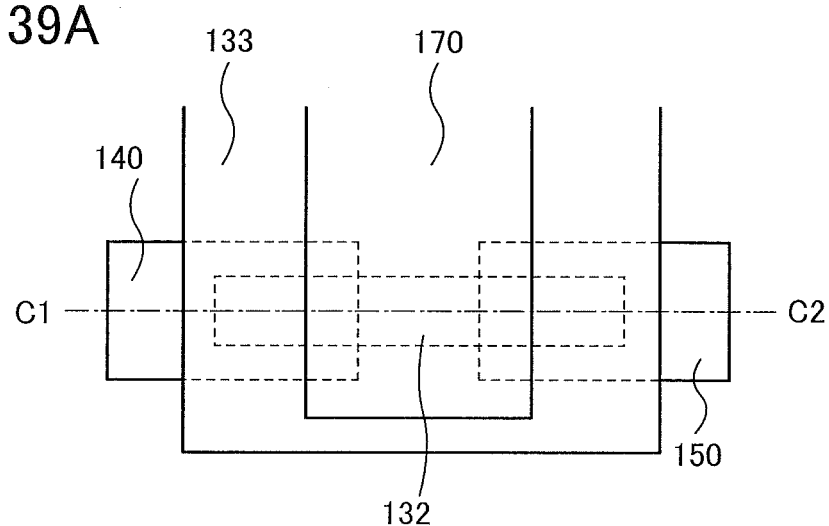
FIGS. 39A and 39B are a top view and a cross-sectional view illustrating a transistor, the cross-sectional view being taken in a channel length direction of the transistor.
Figure 39B:
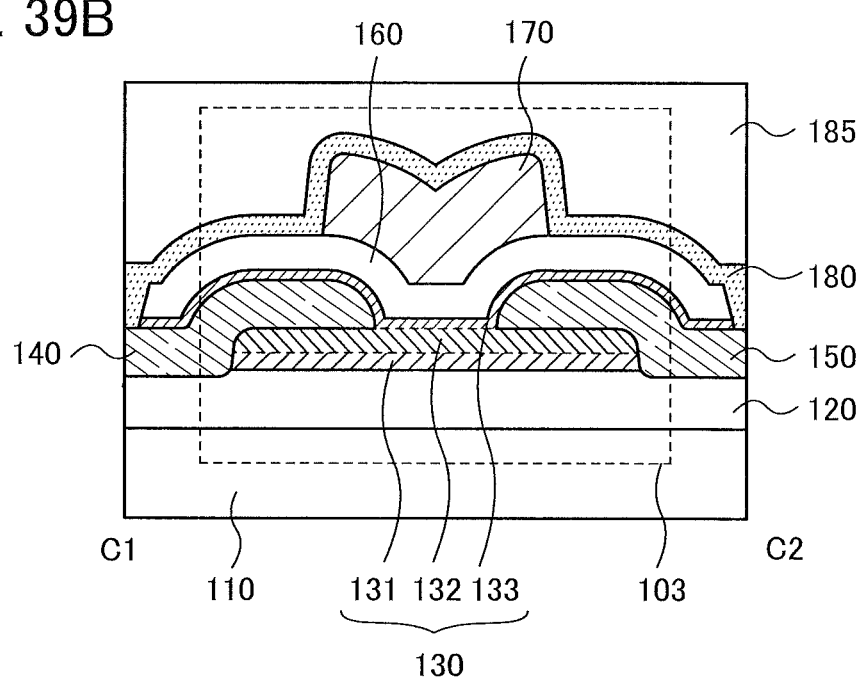
Figure 48A:
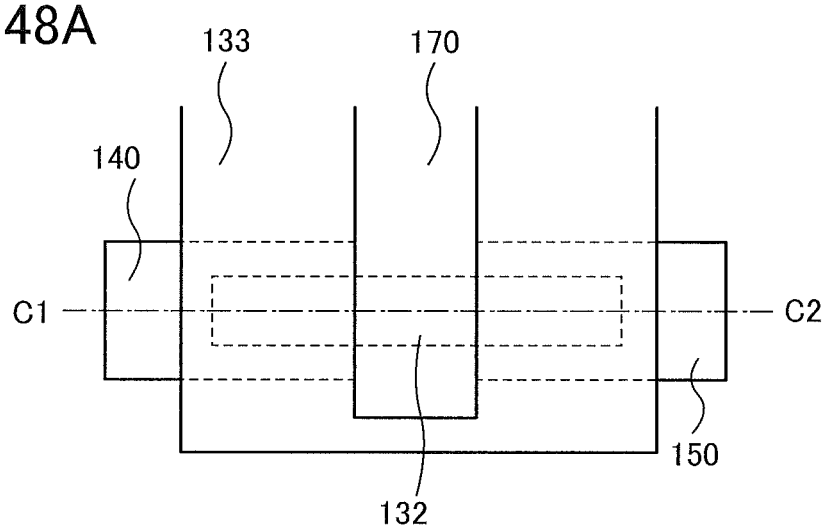
FIGS. 48A and 48B are a top view and a cross-sectional view illustrating a transistor, the cross-sectional view being taken in a channel length direction of the transistor.
Figure 48B:
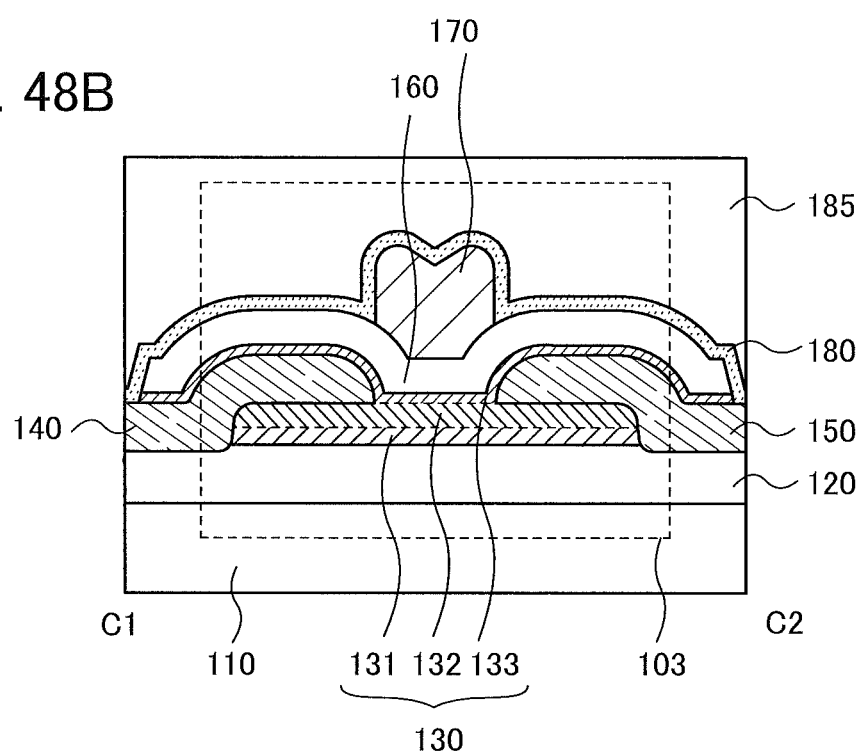
Figure 49A:
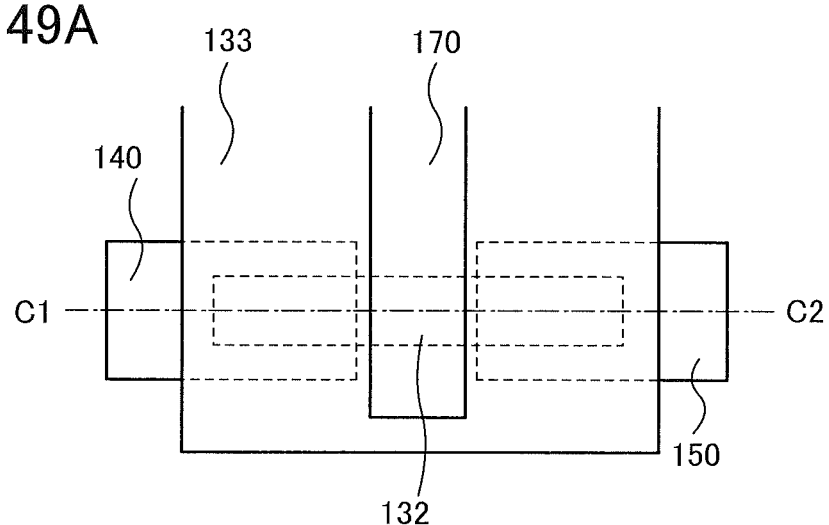
FIGS. 49A and 49B are a top view and a cross-sectional view illustrating a transistor, the cross-sectional view being taken in a channel length direction of the transistor.
Figure 49B:
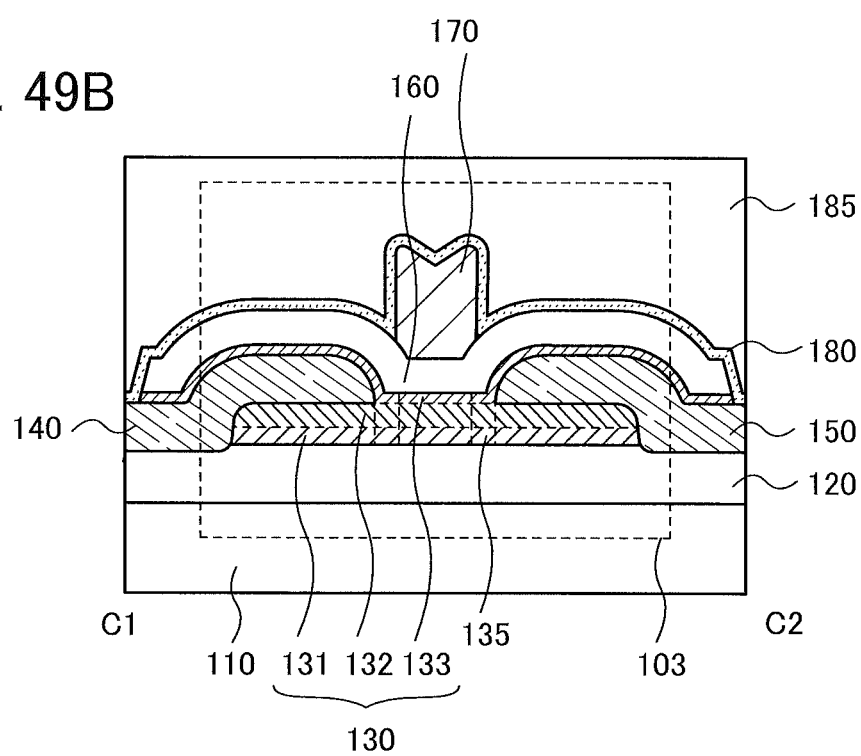

Alternatively, as illustrated in FIGS. 39A and 39B, the third oxide semiconductor layer 133 and the gate insulating film 160 may each have an island shape. Also in this case, a structure in which the regions 191 and 192 are not provided may be employed, which is illustrated in FIGS. 48A and 48B. Alternatively, offset regions may be provided between the gate electrode layer 170 and the source electrode layer 140 and between the gate electrode layer 170 and the drain electrode layer 150, respectively, which is illustrated in FIGS. 49A and 49B.

Figure 40A:
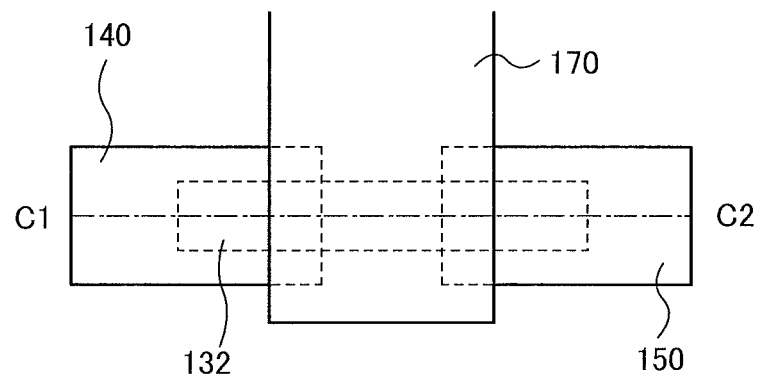
FIGS. 40A and 40B are a top view and a cross-sectional view illustrating a transistor, the cross-sectional view being taken in a channel length direction of the transistor.
Figure 40B:
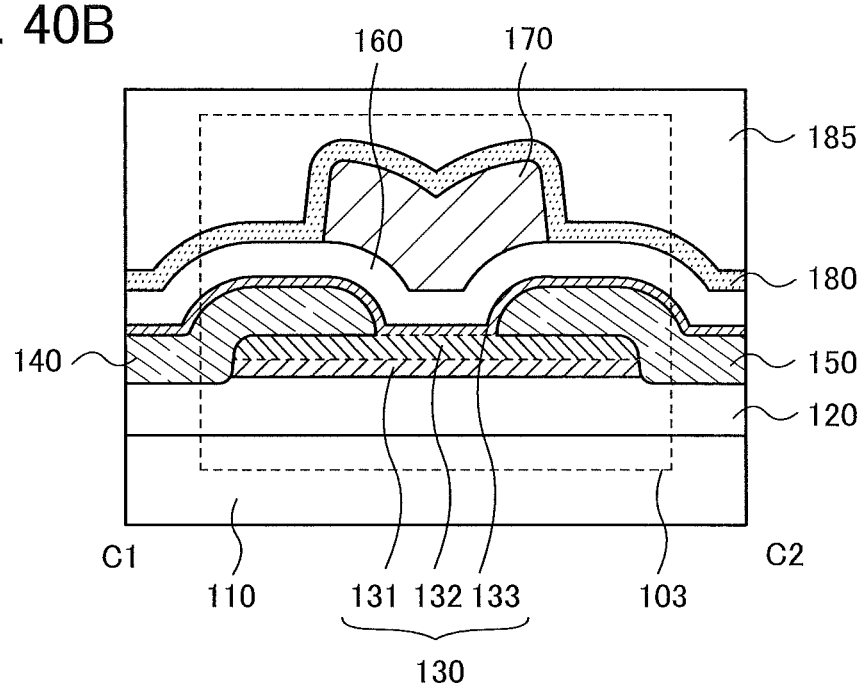

Further alternatively, as illustrated in FIGS. 40A and 40B, the third oxide semiconductor layer 133 and the gate insulating film 160 may be formed so as to cover the first oxide semiconductor layer 131 and the second oxide semiconductor layer 132. Also in this case, a structure in which the regions 191 and 192 are not provided may be employed. Alternatively, offset regions 135 may be provided between the gate electrode layer 170 and the source electrode layer 140 and between the gate electrode layer 170 and the drain electrode layer 150, respectively.

It is also possible to apply the structure shown in FIGS. 4A and 4B to the transistor 103.

Specifically, the transistor 103 includes the insulating layer 120 over the substrate 110; the stack in which the first oxide semiconductor layer 131 and the second oxide semiconductor layer 132 are formed in this order over the insulating layer 120; the source electrode layer 140 and the drain electrode layer 150 electrically connected to part of the stack; the third oxide semiconductor layer 133 covering part of the stack, part of the source electrode layer 140, and part of the drain electrode layer 150; and the gate insulating film 160 and the gate electrode layer 170 overlapping with part of the stack, part of the source electrode layer 140, part of the drain electrode layer 150, and the third oxide semiconductor layer 133. The insulating layer 180 may be provided over the source electrode layer 140, the drain electrode layer 150, and the gate electrode layer 170. Further, the insulating layer 185 formed using an oxide may be formed over the insulating layer 180. Note that the insulating layers 180 and 185 may be provided as needed and another insulating layer may be further provided thereover.

FIG. 9A illustrates one mode of a cross section in the direction of the dashed-dotted line C3-C4 (in the channel width direction) in FIG. 8A. In the cross section in the channel width direction, the single layer of the second oxide semiconductor layer 132 or the stack including the first oxide semiconductor layer 131 and the second oxide semiconductor layer 132 is substantially triangular.

The cross section of the oxide semiconductor layer 130 in the channel width direction may be substantially trapezoidal as illustrated in FIG. 9B. In this case, the cross section of the second oxide semiconductor layer 132 where a channel is formed is also substantially trapezoidal.

As illustrated in FIG. 9A or 9B, in the transistor of one embodiment of the present invention, the cross section of the second oxide semiconductor layer 132 in the channel width direction is substantially triangular or substantially trapezoidal. In this case, the length of a region of the second oxide semiconductor layer 132, which is in contact with the third oxide semiconductor layer 133, is shorter than that in the case where the cross section of the second oxide semiconductor layer 132 in the channel width direction is rectangular.

Figure 10A:
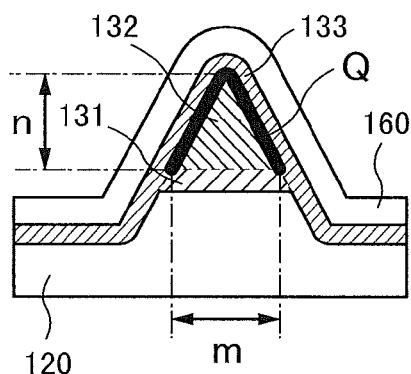
FIGS. 10A to 10D each illustrate a cross section of a transistor in a channel width direction.
Figure 10B:
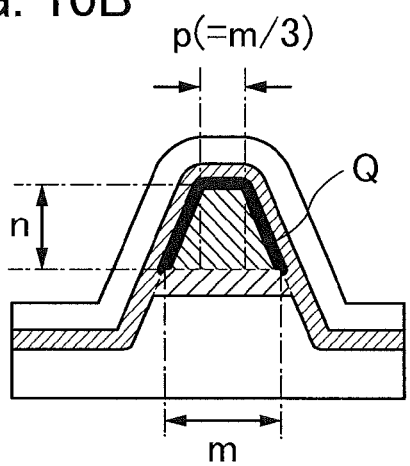
Figure 10C:
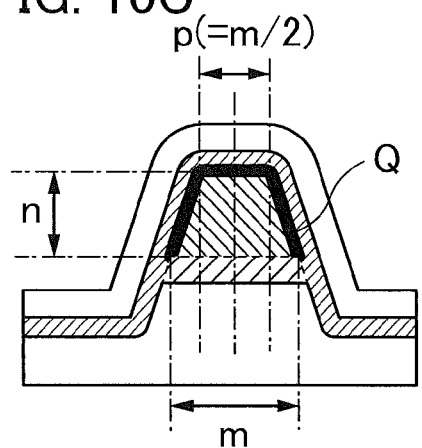
Figure 10D:
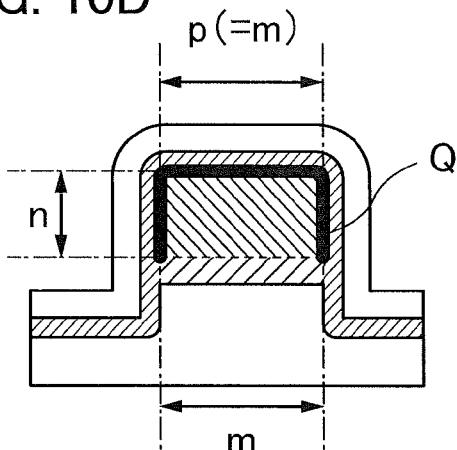

FIGS. 10A to 10D each illustrate part of a cross-sectional structure of a transistor in the channel width direction. FIGS. 10A to 10C each illustrate part of a transistor of one embodiment of the present invention, which includes the stack including the first oxide semiconductor layer 131 and the second oxide semiconductor layer 132 and having a substantially triangular or substantially trapezoidal cross section. FIG. 10D illustrates part of one mode of a transistor, which is a comparative example, including the stack including the first oxide semiconductor layer 131 and the second oxide semiconductor layer 132 and having a rectangular cross section.

FIG. 10A illustrates the case where the cross section of the stack including the first oxide semiconductor layer 131 and the second oxide semiconductor layer 132 in the channel width direction is substantially triangular. When the length of a side of the second oxide semiconductor layer 132, which is in contact with the first oxide semiconductor layer 131, is m and the height of the second oxide semiconductor layer 132 is n, the length Q of a region (indicated by a bold line in FIG. 10A) of the second oxide semiconductor layer 132, which is in contact with the third oxide semiconductor layer 133, is expressed by the following formula (18).

[Formula 20]

$$Q \approx 2\sqrt{(m/2)^2 + n^2} \tag{18}$$

FIG. 10B illustrates the case where the cross section of the stack including the first oxide semiconductor layer 131 and the second oxide semiconductor layer 132 in the channel width direction is substantially trapezoidal with a short upper base. When the length of a side of the second oxide semiconductor layer 132, which is in contact with the first oxide semiconductor layer 131, is m, the height of the second oxide semiconductor layer 132 is n, and the length of the upper base of the second oxide semiconductor layer 132 is p, the length Q of a region of the second oxide semiconductor layer 132, which is in contact with the third oxide semiconductor layer 133, is expressed by the following formula (19).

[Formula 21]

$$Q \approx p + 2\sqrt{((m-p)/2)^2 + n^2} \tag{19}$$

For example, when the length p of the upper base is m/3, the length Q of the region of the second oxide semiconductor layer 132, which is in contact with the third oxide semiconductor layer 133, is expressed by the following formula (20).

[Formula 22]

$$Q \approx m/3 + 2\sqrt{(m/3)^2 + n^2} \tag{20}$$

In the case where the cross section of the stack including the first oxide semiconductor layer 131 and the second oxide semiconductor layer 132 in the channel width direction is substantially trapezoidal as illustrated in FIG. 10C and the length p of the upper base is m/2, for example, the length Q of the region of the second oxide semiconductor layer 132, which is in contact with the third oxide semiconductor layer 133, is expressed by the following formula (21).

[Formula 23]

$$Q \approx m/2 + 2\sqrt{(m/4)^2 + n^2} \tag{21}$$

FIG. 10D illustrates the case where the cross section of the stack including the first oxide semiconductor layer 131 and the second oxide semiconductor layer 132 in the channel width direction is rectangular. When the length of a side of the second oxide semiconductor layer 132, which is in contact with the first oxide semiconductor layer 131, is m and the height of the second oxide semiconductor layer 132 is n, the length Q of a region of the second oxide semiconductor layer 132, which is in contact with the third oxide semiconductor layer 133, is expressed by the following formula (22).

[Formula 24]

$$Q \approx m + 2n \tag{22}$$

Since the cross section of the stack including the first oxide semiconductor layer 131 and the second oxide semiconductor layer 132 in the channel width direction is preferably substantially triangular rather than rectangular for the same reason as the transistor 101, it is preferable from the formulae (18) and (22) that the length Q of the region of the second oxide semiconductor layer 132, which is in contact with the third oxide semiconductor layer 133, be in a range expressed by the following formula (3).

[Formula 25]

$$2\sqrt{(m/2)^2 + n^2} \leq Q < m + 2n \tag{3}$$

Furthermore, since the cross section of the stack including the first oxide semiconductor layer 131 and the second oxide semiconductor layer 132 in the channel width direction is preferably substantially triangular rather than substantially trapezoidal, it is more preferable from the formulae (18) and

(21) that the length Q of the region of the second oxide semiconductor layer 132, which is in contact with the third oxide semiconductor layer 133, be in a range expressed by the following formula (23).

[Formula 26]

$$2\sqrt{(m/2)^2+n^2} \leq Q \leq m/2 + 2\sqrt{(m/4)^2+n^2} \quad (23)$$

Furthermore, since the cross section of the stack including the first oxide semiconductor layer 131 and the second oxide semiconductor layer 132 in the channel width direction is preferably substantially triangular rather than substantially trapezoidal with a short upper base, it is still more preferable from the formulae (18) and (20) that the length Q of the region of the second oxide semiconductor layer 132, which is in contact with the third oxide semiconductor layer 133, be in a range expressed by the following formula (24).

[Formula 27]

$$2\sqrt{(m/2)^2+n^2} \leq Q \leq m/3 + 2\sqrt{(m/3)^2+n^2} \quad (24)$$

As described above, in the cross section of the oxide semiconductor layer 130 of the transistor 103 of one embodiment of the present invention in the channel width direction, when the length of the side of the second oxide semiconductor layer 132, which is in contact with the first oxide semiconductor layer 131 is m and the height of the second oxide semiconductor layer 132 is n, the length Q of the region of the second oxide semiconductor layer 132, which is in contact with the third oxide semiconductor layer 133, is in the range expressed by the formula (3), preferably in the range expressed by the formula (23), more preferably in the range expressed by the formula (24).

The length m of the side of the second oxide semiconductor layer 132, which is in contact with the first oxide semiconductor layer 131, is preferably greater than or equal to 10 nm and less than or equal to 100 nm. When the length m of the side is in the above range, the cross section of the second oxide semiconductor layer 132 in the channel width direction easily becomes substantially trapezoidal with a short upper base. When the length in of the side is greater than 100 nm, the electrical characteristics of the transistor might be equivalent to those of a transistor including an oxide semiconductor layer having a rectangular cross section in the channel width direction.

The height n of the second oxide semiconductor layer 132 is preferably greater than or equal to 10 nm and less than or equal to 200 nm. When the height n is out of the above range, it is extremely difficult for the second oxide semiconductor layer 132 to have a substantially trapezoidal cross section with a short upper base in the channel width direction.

Figure 41A:
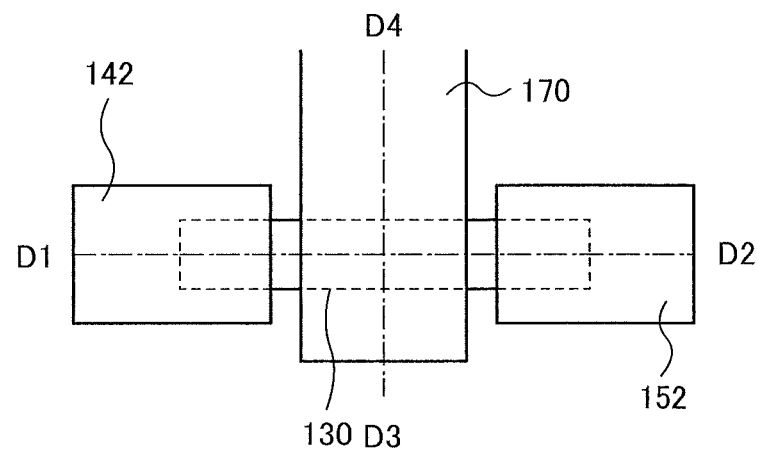
FIGS. 41A and 41B are a top view and a cross-sectional view illustrating a transistor, the cross-sectional view being taken in a channel length direction of the transistor.
Figure 41B:
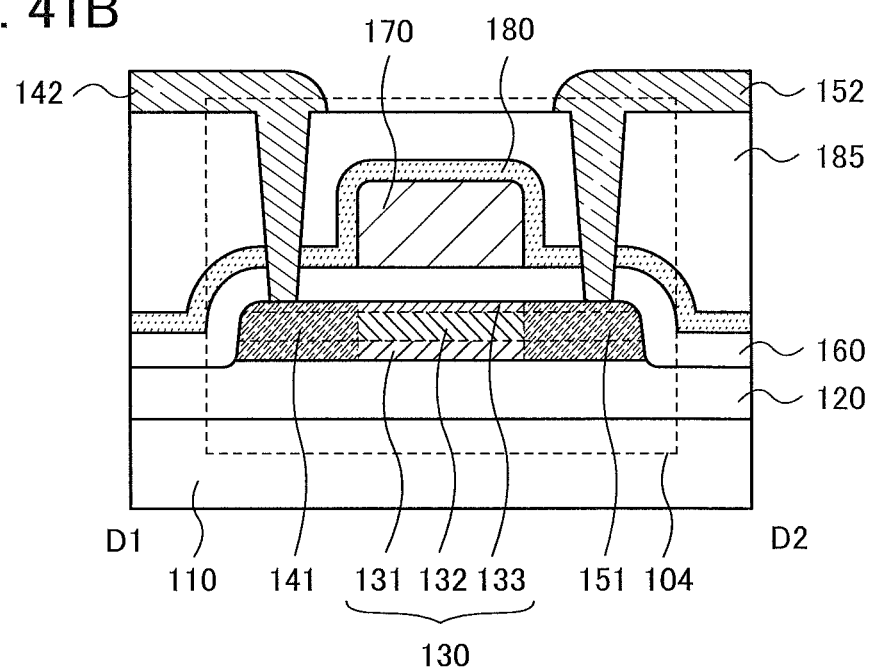

The transistor of one embodiment of the present invention may have a structure illustrated in FIGS. 41A and 41B. FIG. 41A is a top view. FIG. 41B illustrates a cross section in the direction of a dashed-dotted line D1-D2 in FIG. 41A. In FIGS. 41A and 41B, some components are enlarged, reduced in size, or omitted for easy understanding. In some cases, the direction of the dashed-dotted line D1-D2 is referred to as a channel length direction, and the direction of a dashed-dotted line D3-D4 is referred to as a channel width direction.

A transistor 104 illustrated in FIGS. 41A and 41B has a self-aligned structure and includes the oxide semiconductor layer 130 having a three-layer structure as an example. Note that the oxide semiconductor layer 130 may have a single-layer structure. The description of the transistor 101 or the transistor 102 can be referred to for a cross section of the transistor 104 in the channel width direction.

A source region 141 and a drain region 151, which are n-type low-resistance regions, are formed in part of the oxide semiconductor layer 130. The low-resistance regions can be formed by addition of an impurity with the use of the gate electrode layer 170 as a mask. Examples of the method for adding the impurity include an ion implantation method, an ion doping method, and a plasma immersion ion implantation method.

As the impurity for improving the conductivity of the oxide semiconductor layer 130, for example, one or more selected from the following can be used: phosphorus (P), arsenic (As), antimony (Sb), boron (B), aluminum (Al), nitrogen (N), argon (Ar), helium (He), neon (Ne), indium (In), fluorine (F), chlorine (Cl), titanium (Ti), zinc (Zn), and carbon (C).

A wiring 142 and a wiring 152 are in contact with the source region 141 and the drain region 151, respectively.

Figure 42A:
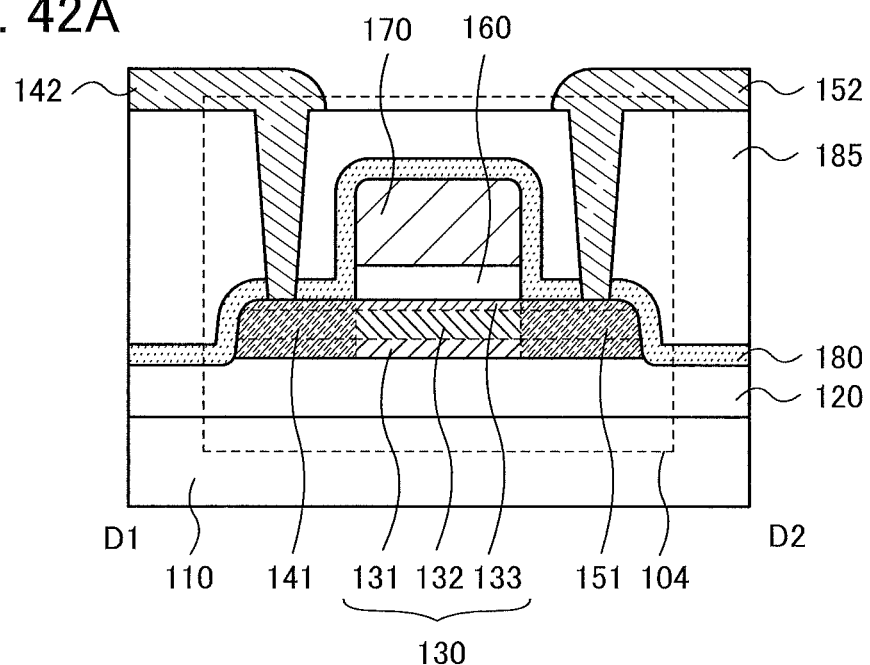
FIGS. 42A and 42B are cross-sectional views illustrating transistors.
Figure 42B:
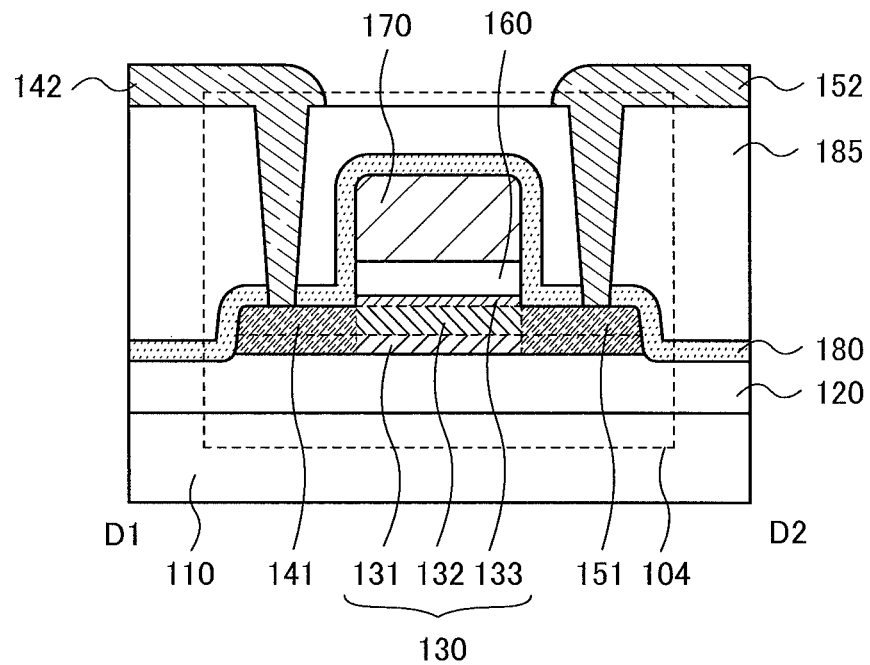

As illustrated in FIG. 42A, the transistor 104 may have a structure in which regions of the gate insulating film 160, which are over the source region 141 and the drain region 151, are removed. As illustrated in FIG. 42B, the transistor 104 may have a structure in which the source region 141 and the drain region 151 are partly removed.

It is also possible to apply the structure shown in FIGS. 4A and 4B to the transistor 104.

In the transistor 101 in FIGS. 1A and 1B and FIGS. 2A and 2B, the oxide semiconductor layer 130 in the channel formation region is a single layer. In the transistor 102 in FIGS. 5A and 5B and FIGS. 6A and 6B, the oxide semiconductor layer 130 in the channel formation region has a three-layer structure in which the first oxide semiconductor layer 131, the second oxide semiconductor layer 132, and the third oxide semiconductor layer 133 are stacked in this order from the substrate 110 side. In the transistor 103 in FIGS. 8A and 8B and FIGS. 9A and 9B, although the oxide semiconductor layer 130 has a three-layer structure as in the transistor 102, the second oxide semiconductor layer 132 is surrounded by the first oxide semiconductor layer 131 and the third oxide semiconductor layer 133 in the channel formation region. The channel formation region of the transistor 104 in FIGS. 41A and 41B has a structure similar to that of the transistor 102.

In each of the above structures, the gate electrode layer 170 electrically surrounds the oxide semiconductor layer 130 in the channel width direction. This structure increases the on-state current. This transistor structure is referred to as a surrounded channel (s-channel) structure. In each of the structures of the transistor 102 and the transistor 103, selecting appropriate materials for the three layers forming the oxide semiconductor layer 130 allows current to flow in the whole of the second oxide semiconductor layer 132. Since current flows in the second oxide semiconductor layer 132 in an inner part of the oxide semiconductor layer 130, the current is hardly influenced by interface scattering, leading to a large on-state current. Note that increasing the thickness of the second oxide semiconductor layer 132 can increase the on-state current.

A semiconductor device using a transistor with any of the above structures can have favorable electrical characteristics.

This embodiment can be combined as appropriate with any of the other embodiments and an example in this specification.

Embodiment 2

In this embodiment, components of the transistors described in Embodiment 1 are described in detail.

The substrate 110 is not limited to a simple supporting substrate, and may be a substrate where another device such as a transistor is fixated. In that case, at least one of the gate electrode layer 170, the source electrode layer 140, and the drain electrode layer 150 of the transistor may be electrically connected to the above device.

The insulating layer 120 can have a function of supplying oxygen to the oxide semiconductor layer 130 as well as a function of preventing diffusion of impurities from the substrate 110. For this reason, the insulating layer 120 is preferably an insulating film containing oxygen and further preferably, the insulating layer 120 is an insulating film containing oxygen in which the oxygen content is higher than that in the stoichiometric composition. For example, the insulating layer 120 is a film of which the amount of released oxygen when converted into oxygen atoms is $1.0 \times 10^{19}$ atoms/cm$^3$ or more in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 500° C. In the case where the substrate 110 is provided with another device as described above, the insulating layer 120 also has a function as an interlayer insulating film. In that case, the insulating layer 120 is preferably subjected to planarization treatment such as chemical mechanical polishing (CMP) treatment so as to have a flat surface.

In this embodiment, detailed description is given mainly on the case where the oxide semiconductor layer 130 has a three-layer structure; however, there is no limitation on the number of stacked layers. In the case where the oxide semiconductor layer 130 is a single layer as in the transistor 101, a layer corresponding to the second oxide semiconductor layer 132 described in this embodiment is used. In the case where the oxide semiconductor layer 130 has a two-layer structure, for example, a structure of the oxide semiconductor layer 130 in the transistor 102 or the transistor 103 without the third oxide semiconductor layer 133 is employed. In such a case, the second oxide semiconductor layer 132 and the first oxide semiconductor layer 131 can be replaced with each other. In the case where the oxide semiconductor layer 130 has a stacked-layer structure of four or more layers, for example, a structure in which another oxide semiconductor layer is stacked over the three-layer stack described in this embodiment or a structure in which another oxide semiconductor layer is inserted in any one of the interfaces in the three-layer stack can be employed.

For the second oxide semiconductor layer 132, for example, an oxide semiconductor whose electron affinity (an energy difference between a vacuum level and the conduction band minimum) is higher than those of the first oxide semiconductor layer 131 and the third oxide semiconductor layer 133 is used. The electron affinity can be obtained by subtracting an energy difference between the conduction band minimum and the valence band maximum (what is called an energy gap) from an energy difference between the vacuum level and the valence band maximum (what is called an ionization potential).

The first oxide semiconductor layer 131 and the third oxide semiconductor layer 133 each contain one or more kinds of metal elements contained in the second oxide semiconductor layer 132. For example, the first oxide semiconductor layer 131 and the third oxide semiconductor layer 133 are preferably formed using an oxide semiconductor whose conduction band minimum is closer to a vacuum level than that of the second oxide semiconductor layer 132 by 0.05 eV or more, 0.07 eV or more, 0.1 eV or more, or 0.15 eV or more and 2 eV or less, 1 eV or less, 0.5 eV or less, or 0.4 eV or less.

In such a structure, when an electric field is applied to the gate electrode layer 170, a channel is formed in the second oxide semiconductor layer 132 whose conduction band minimum is the lowest in the oxide semiconductor layer 130.

Further, since the first oxide semiconductor layer 131 contains one or more kinds of metal elements contained in the second oxide semiconductor layer 132, an interface state is unlikely to be formed at the interface between the second oxide semiconductor layer 132 and the first oxide semiconductor layer 131, compared with the interface between the second oxide semiconductor layer 132 and the insulating layer 120 on the assumption that the second oxide semiconductor layer 132 is in contact with the insulating layer 120. The interface state sometimes forms a channel; therefore, the threshold voltage of the transistor is changed in some cases. Thus, with the first oxide semiconductor layer 131, fluctuations in electrical characteristics of the transistor, such as a threshold voltage, can be reduced. Further, the reliability of the transistor can be improved.

Furthermore, since the third oxide semiconductor layer 133 contains one or more kinds of metal elements contained in the second oxide semiconductor layer 132, scattering of carriers is unlikely to occur at the interface between the second oxide semiconductor layer 132 and the third oxide semiconductor layer 133, compared with the interface between the second oxide semiconductor layer 132 and the gate insulating film 160 on the assumption that the second oxide semiconductor layer 132 is in contact with the gate insulating film 160. Thus, with the third oxide semiconductor layer 133, the field-effect mobility of the transistor can be increased.

For the first oxide semiconductor layer 131 and the third oxide semiconductor layer 133, for example, a material containing Al, Ti, Ga, Ge, Y, Zr, Sn, La, Ce, or Hf with a higher atomic ratio than that used for the second oxide semiconductor layer 132 can be used. Specifically, an atomic ratio of any of the above metal elements in the first oxide semiconductor layer 131 and the third oxide semiconductor layer 133 is 1.5 times or more, preferably 2 times or more, further preferably 3 times or more as much as that in the second oxide semiconductor layer 132. Any of the above metal elements is strongly bonded to oxygen and thus has a function of suppressing generation of an oxygen vacancy in an oxide semiconductor layer. That is, an oxygen vacancy is less likely to be generated in the first oxide semiconductor layer 131 and the third oxide semiconductor layer 133 than in the second oxide semiconductor layer 132.

Note that when each of the first oxide semiconductor layer 131, the second oxide semiconductor layer 132, and the third oxide semiconductor layer 133 is an In-M-Zn oxide containing at least indium, zinc, and M (M is a metal such as Al, Ti, Ga, Ge, Y, Zr, Sn, La, Ce, or Hf), and the first oxide semiconductor layer 131 has an atomic ratio of In to M and Zn which is $x_1:y_1:z_1$, the second oxide semiconductor layer 132 has an atomic ratio of In to M and Zn which is $x_2:y_2:z_2$, and the third oxide semiconductor layer 133 has an atomic ratio of In to M and Zn which is $x_3:y_3:z_3$, each of $y_1/x_1$ and $y_3/x_3$ is preferably larger than $y_2/x_2$. Each of $y_1/x_1$ and $y_3/x_3$ is 1.5 times or more, preferably 2 times or more, further preferably 3 times or more as large as $y_2/x_2$. At this time, when $y_2$ is greater than or equal to $x_2$ in the second oxide semiconductor layer 132, the transistor can have stable electrical characteristics. However, when $y_2$ is 3 times or more as large as $x_2$, the field-effect mobility of the transistor is reduced; accordingly, $y_2$ is preferably smaller than 3 times $x_2$.

In the case where Zn and O are not taken into consideration, the proportion of In and the proportion of M in each of the first oxide semiconductor layer 131 and the third oxide semiconductor layer 133 are preferably less than 50 atomic % and greater than or equal to 50 atomic %, respectively, further preferably less than 25 atomic % and greater than or equal to 75 atomic %, respectively. Further, in the case where Zn and O are not taken into consideration, the proportion of In and the proportion of M in the second oxide semiconductor layer 132 are preferably greater than or equal to 25 atomic % and less than 75 atomic %, respectively, further preferably greater than or equal to 34 atomic % and less than 66 atomic %, respectively.

The thicknesses of the first oxide semiconductor layer 131 and the third oxide semiconductor layer 133 are each greater than or equal to 3 nm and less than or equal to 100 nm, preferably greater than or equal to 3 nm and less than or equal to 50 nm. The thickness of the second oxide semiconductor layer 132 is greater than or equal to 3 nm and less than or equal to 200 nm, preferably greater than or equal to 10 nm and less than or equal to 150 nm, further preferably greater than or equal to 20 nm and less than or equal to 100 nm. In addition, the second oxide semiconductor layer 132 is preferably thicker than the first oxide semiconductor layer 131 and the third oxide semiconductor layer 133.

Note that in order that a transistor in which an oxide semiconductor layer serves as a channel have stable electrical characteristics, it is effective to reduce the concentration of impurities in the oxide semiconductor layer to make the oxide semiconductor layer intrinsic (i-type) or substantially intrinsic. The term "substantially intrinsic" refers to the state where an oxide semiconductor layer has a carrier density lower than $1\times10^{17}/cm^3$, preferably lower than $1\times10^{15}/cm^3$, further preferably lower than $1\times10^{13}/cm^3$.

In the oxide semiconductor layer, hydrogen, nitrogen, carbon, silicon, and a metal element other than main components of the oxide semiconductor layer are impurities. For example, hydrogen and nitrogen form donor levels to increase the carrier density. In addition, silicon in the oxide semiconductor layer forms an impurity level. The impurity level serves as a trap and might cause deterioration of electrical characteristics of the transistor. Accordingly, in the first oxide semiconductor layer 131, the second oxide semiconductor layer 132, and the third oxide semiconductor layer 133 and at interfaces between these layers, the impurity concentration is preferably reduced.

In order to make the oxide semiconductor layer intrinsic or substantially intrinsic, in secondary ion mass spectrometry (SIMS), for example, the concentration of silicon at a certain depth of the oxide semiconductor layer or in a region of the oxide semiconductor layer is lower than $1\times10^{19}$ atoms/cm$^3$, preferably lower than $5\times10^{18}$ atoms/cm$^3$, further preferably lower than $1\times10^{18}$ atoms/cm$^3$. Further, the concentration of hydrogen at a certain depth of the oxide semiconductor layer or in a region of the oxide semiconductor layer is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. Further, the concentration of nitrogen at a certain depth of the oxide semiconductor layer or in a region of the oxide semiconductor layer is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

In the case where the oxide semiconductor layer includes crystals, high concentration of silicon or carbon might reduce the crystallinity of the oxide semiconductor layer. In order not to lower the crystallinity of the oxide semiconductor layer, for example, the concentration of silicon at a certain depth of the oxide semiconductor layer or in a region of the oxide semiconductor layer may be lower than $1\times10^{19}$ atoms/cm$^3$, preferably lower than $5\times10^{18}$ atoms/cm$^3$, further preferably lower than $1\times10^{18}$ atoms/cm$^3$. Further, the concentration of carbon at a certain depth of the oxide semiconductor layer or in a region of the oxide semiconductor layer may be lower than $1\times10^{19}$ atoms/cm$^3$, preferably lower than $5\times10^{18}$ atoms/cm$^3$, further preferably lower than $1\times10^{18}$ atoms/cm$^3$, for example.

A transistor in which a highly purified oxide semiconductor film is used for a channel formation region as described above has an extremely small off-state current. For example, in the case where the voltage between the source and the drain is set to approximately 0.1 V, 5 V, or 10 V, the off-state current standardized on the channel width of the transistor can be as small as several yoctoamperes per micrometer to several zeptoamperes per micrometer.

Note that as the gate insulating film of the transistor, an insulating film containing silicon is used in many cases; thus, it is preferable that, as in the transistor of one embodiment of the present invention, a region of the oxide semiconductor layer, which serves as a channel, not be in contact with the gate insulating film for the above-described reason. In the case where a channel is formed at the interface between the gate insulating film and the oxide semiconductor layer, scattering of carriers occurs at the interface, whereby the field-effect mobility of the transistor is reduced in some cases. Also from the view of the above, it is preferable that the region of the oxide semiconductor layer, which serves as a channel, be separated from the gate insulating film.

Accordingly, with the oxide semiconductor layer 130 having a stacked-layer structure including the first oxide semiconductor layer 131, the second oxide semiconductor layer 132, and the third oxide semiconductor layer 133, a channel can be formed in the second oxide semiconductor layer 132; thus, the transistor can have a high field-effect mobility and stable electrical characteristics.

In a band diagram, the conduction band minimums of the first oxide semiconductor layer 131, the second oxide semiconductor layer 132, and the third oxide semiconductor layer 133 are continuous. This can be understood also from the fact that the compositions of the first oxide semiconductor layer 131, the second oxide semiconductor layer 132, and the third oxide semiconductor layer 133 are close to one another and oxygen is easily diffused among the first oxide semiconductor layer 131, the second oxide semiconductor layer 132, and the third oxide semiconductor layer 133. Thus, the first oxide semiconductor layer 131, the second oxide semiconductor layer 132, and the third oxide semiconductor layer 133 have a continuous physical property although they have different compositions and form a stack. In the drawings in this specification, interfaces between the oxide semiconductor layers of the stack are indicated by dotted lines.

The oxide semiconductor layer 130 in which layers containing the same main components are stacked is formed to have not only a simple stacked-layer structure of the layers but also a continuous energy band (here, in particular, a well structure having a U shape in which the conduction band minimums are continuous (U-shaped well)). In other words, the stacked-layer structure is formed such that there exists no impurity that forms a defect level such as a trap center or a recombination center at each interface. If impurities exist between the stacked oxide semiconductor layers, the continuity of the energy band is lost and carriers disappear by a trap or recombination at the interface.

For example, an In—Ga—Zn oxide whose atomic ratio of In to Ga and Zn is 1:3:2, 1:3:3, 1:3:4, 1:3:6, 1:6:4, or 1:9:6 can be used for the first oxide semiconductor layer 131 and the third oxide semiconductor layer 133 and an In—Ga—Zn oxide whose atomic ratio of In to Ga and Zn is 1:1:1, 5:5:6, or 3:1:2 can be used for the second oxide semiconductor layer 132. Alternatively, it is possible to use an In—Ga—Zn oxide whose atomic ratio of In to Ga and Zn is 1:6:4 or 1:9:6 for the first oxide semiconductor layer 131 and an In—Ga—Zn oxide whose atomic ratio of In to Ga and Zn is 1:3:2, 1:3:3, or 1:3:4 for the third oxide semiconductor layer 133. Note that the atomic ratio of each of the first oxide semiconductor layer 131, the second oxide semiconductor layer 132, and the third oxide semiconductor layer 133 varies within a range of ±20% of the above atomic ratio as an error.

The second oxide semiconductor layer 132 of the oxide semiconductor layer 130 serves as a well, so that a channel is formed in the second oxide semiconductor layer 132 in a transistor including the oxide semiconductor layer 130. Note that since the conduction band minimums are continuous, the oxide semiconductor layer 130 can also be referred to as a U-shaped well. Further, a channel formed to have such a structure can also be referred to as a buried channel.

Note that trap levels due to impurities or defects might be formed in the vicinity of the interface between an insulating film such as a silicon oxide film and each of the first oxide semiconductor layer 131 and the third oxide semiconductor layer 133. The second oxide semiconductor layer 132 can be distanced away from the trap levels owing to existence of the first oxide semiconductor layer 131 and the third oxide semiconductor layer 133.

However, when the energy differences between the conduction band minimum of the second oxide semiconductor layer 132 and the conduction band minimum of each of the first oxide semiconductor layer 131 and the third oxide semiconductor layer 133 are small, an electron in the second oxide semiconductor layer 132 might reach the trap level by passing over the energy differences. When electrons to be negative charge are captured by the trap level, a negative fixed charge is generated at the interface with the insulating film, whereby the threshold voltage of the transistor is shifted in the positive direction.

Thus, to reduce fluctuations in the threshold voltage of the transistor, energy differences of at least certain values between the conduction band minimum of the second oxide semiconductor layer 132 and the conduction band minimum of each of the first oxide semiconductor layer 131 and the third oxide semiconductor layer 133 are necessary. Each of the energy differences is preferably greater than or equal to 0.1 eV, further preferably greater than or equal to 0.15 eV.

The first oxide semiconductor layer 131, the second oxide semiconductor layer 132, and the third oxide semiconductor layer 133 preferably include crystal parts. In particular, when crystals with c-axis alignment are used, the transistor can have stable electrical characteristics. Moreover, crystals with c-axis alignment are resistant to bending; therefore, using such crystals can improve the reliability of a semiconductor device using a flexible substrate.

As the source electrode layer 140 and the drain electrode layer 150, a conductive film capable of extracting oxygen from an oxide semiconductor film is preferably used. For example, Al, Cr, Cu, Ta, Ti, Mo, W, Ni, Mn, Nd, or Sc can be used. It is also possible to use an alloy or a conductive nitride of any of these materials. It is also possible to use a stack of a plurality of materials selected from these materials, alloys of these materials, and conductive nitrides of these materials. Typically, it is preferable to use Ti, which is particularly easily bonded to oxygen, or W, which has a high melting point and thus allows subsequent process temperatures to be relatively high. It is also possible to use Cu or an alloy such as Cu—Mn, which has low resistance, or a stack of any of the above materials and Cu or an alloy such as Cu—Mn.

By the conductive film capable of extracting oxygen from the oxide semiconductor film, oxygen in the oxide semiconductor film is released to form oxygen vacancies in the oxide semiconductor film. Hydrogen slightly contained in the film and the oxygen vacancy are bonded to each other, whereby the region is markedly changed to an n-type region. Accordingly, the n-type region can serve as a source or a drain of the transistor.

The gate insulating film 160 can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The gate insulating film 160 may be a stack of any of the above materials. The gate insulating film 160 may contain lanthanum (La), nitrogen, zirconium (Zr), or the like as an impurity.

An example of a stacked-layer structure of the gate insulating film 160 will be described. The gate insulating film 160 includes, for example, oxygen, nitrogen, silicon, or hafnium. Specifically, the gate insulating film 160 preferably includes hafnium oxide and silicon oxide, or hafnium oxide and silicon oxynitride.

Hafnium oxide has higher dielectric constant than silicon oxide and silicon oxynitride. Therefore, by using hafnium oxide, a physical thickness can be made larger than an equivalent oxide thickness; thus, even in the case where the equivalent oxide thickness is less than or equal to 10 nm or less than or equal to 5 nm, leakage current due to tunnel current can be small. That is, it is possible to provide a transistor with a small off-state current. Moreover, hafnium oxide with a crystalline structure has higher dielectric constant than hafnium oxide with an amorphous structure. Therefore, it is preferable to use hafnium oxide with a crystalline structure in order to provide a transistor with a small off-state current. Examples of the crystalline structure include a monoclinic crystal structure and a cubic crystal structure. Note that one embodiment of the present invention is not limited to the above examples.

In some cases, an interface state due to a defect exists in hafnium oxide having a crystalline structure. The interface states might function as trap centers. Therefore, in the case where the hafnium oxide is provided close to the channel region of the transistor, the electrical characteristics of the transistor might deteriorate owing to the interface states. In order to reduce the adverse effect of the interface state, in some cases, it is preferable to separate the channel region of the transistor and the hafnium oxide from each other by providing another film therebetween. The film has a buffer function. The film having a buffer function may be included in the gate insulating film 160 or included in the oxide semiconductor film. That is, the film having a buffer function can be formed using silicon oxide, silicon oxynitride, an oxide semiconductor, or the like. Note that the film having a buffer function is formed using, for example, a semiconductor or an insulator having a larger energy gap than a semiconductor to be the channel region. Alternatively, the film having a buffer function is formed using, for example, a semiconductor or an insulator having lower electron affinity than a semiconductor to be the channel region. Further alternatively, the film having a buffer function is formed using, for example, a semiconductor or an insulator having higher ionization energy than a semiconductor to be the channel region.

Meanwhile, charge is trapped by the interface states (trap centers) of the hafnium oxide having the crystalline structure, whereby the threshold voltage of the transistor may be controlled. In order to make the electric charge exist stably, for example, an insulator having a larger energy gap than hafnium oxide may be provided between the channel region and the hafnium oxide. Alternatively, a semiconductor or an insulator having smaller electron affinity than hafnium oxide may be provided. The film having a buffer function may be formed using a semiconductor or an insulator having higher ionization energy than hafnium oxide. Use of such a semiconductor or an insulator inhibits discharge of the charge trapped by the interface states, so that the charge can be retained for a long time.

Examples of such an insulator include silicon oxide and silicon oxynitride. In order to make the interface state in the gate insulating film 160 trap an electric charge, an electron may be transferred from the oxide semiconductor layer 130 toward the gate electrode layer 170. As a specific example, the potential of the gate electrode layer 170 is kept higher than the potential of the source electrode or the drain electrode under high temperature conditions (e.g., a temperature higher than or equal to 125° C. and lower than or equal to 450° C., typically higher than or equal to 150° C. and lower than or equal to 300° C.) for one second or longer, typically for one minute or longer.

The threshold voltage of a transistor in which a predetermined amount of electrons is trapped in interface states in the gate insulating film 160 or the like shifts in the positive direction. The amount of electrons to be trapped (the amount of change in threshold voltage) can be controlled by adjusting a voltage of the gate electrode layer 170 or time in which the voltage is applied. Note that a location in which an electric charge is trapped is not necessarily limited to the inside of the gate insulating film 160 as long as an electric charge can be trapped therein. A stacked film having a similar structure may be used as another insulating layer.

For the gate electrode layer 170, for example, a conductive film formed using Al, Ti, Cr, Co, Ni, Cu, Y, Zr, Mo, Ru, Ag, Mn, Nd, Sc, Ta, W, or the like can be used. It is also possible to use an alloy or a conductive nitride of any of these materials. It is also possible to use a stack of a plurality of materials selected from these materials, alloys of these materials, and conductive nitrides of these materials. Typically, tungsten, a stack of tungsten and titanium nitride, a stack of tungsten and tantalum nitride, or the like can be used. It is also possible to use Cu or an alloy such as Cu—Mn, which has low resistance, or a stack of any of the above materials and Cu or an alloy such as Cu—Mn.

An aluminum oxide film is preferably included in the insulating layer 180 over the gate insulating film 160 and the gate electrode layer 170. The aluminum oxide film has a high blocking effect of preventing penetration of both oxygen and impurities such as hydrogen and moisture. Accordingly, during and after the manufacturing process of the transistor, the aluminum oxide film can suitably function as a protective film that has effects of preventing entry of impurities such as hydrogen and moisture, which cause variations in the electrical characteristics of the transistor, into the oxide semiconductor layer 130, preventing release of oxygen, which is a main component of the oxide semiconductor layer 130, from the oxide semiconductor layer, and preventing unnecessary release of oxygen from the insulating layer 120. Further, oxygen contained in the aluminum oxide film can be diffused in the oxide semiconductor layer.

Further, the insulating layer 185 is preferably formed over the insulating layer 180. The insulating layer 185 can be formed using an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 185 may be a stack of any of the above materials.

Here, like the insulating layer 120, the insulating layer 185 preferably contains oxygen more than that in the stoichiometric composition. Oxygen released from the insulating layer 185 can be diffused into the channel formation region in the oxide semiconductor layer 130 through the gate insulating film 160, so that oxygen vacancies formed in the channel formation region can be filled with the oxygen. In this manner, stable electrical characteristics of the transistor can be achieved.

High integration of a semiconductor device requires miniaturization of a transistor. However, it is known that miniaturization of a transistor causes deterioration of electrical characteristics of the transistor. A decrease in channel width causes a reduction in on-state current.

In the transistor of one embodiment of the present invention shown in FIGS. 8A and 8B and FIGS. 9A and 9B, for example, as described above, the third oxide semiconductor layer 133 is formed so as to cover the second oxide semiconductor layer 132 where a channel is funned and the channel formation layer and the gate insulating film are not in contact with each other. Accordingly, scattering of carriers at the interface between the channel formation layer and the gate insulating film can be reduced and the on-state current of the transistor can be increased.

In the transistor of one embodiment of the present invention, as described above, the gate electrode layer 170 is formed to electrically surround the oxide semiconductor layer 130 in the channel width direction; accordingly, a gate electric field is applied to the oxide semiconductor layer 130 in the side surface direction in addition to the perpendicular direction. In other words, a gate electric field is applied to the oxide semiconductor layer 130 entirely, so that current flows in the whole of the second oxide semiconductor layer 132 serving as a channel, leading to a further increase in on-state current.

In the transistor of one embodiment of the present invention, the second oxide semiconductor layer 132 is formed over the first oxide semiconductor layer 131, so that an interface state is less likely to be formed. In addition, impurities do not enter the second oxide semiconductor layer 132 from above and below because the second oxide semiconductor layer 132 is positioned at the middle of the three-layer structure. Therefore, the transistor can achieve not only the increase in the on-state current of the transistor but also stabilization of the threshold voltage and a reduction in the S value (subthreshold value). Thus, Icut (current when gate voltage VG is 0 V) can be reduced and power consumption can be reduced. Further, since the threshold voltage of the transistor becomes stable, long-term reliability of the semiconductor device can be improved.

This embodiment can be combined as appropriate with any of the other embodiments and an example in this specification.

Embodiment 3

In this embodiment, methods for manufacturing the transistors 101, 102, and 103 described in Embodiment 1 are described.

First, the method for manufacturing the transistor 102 is described with reference to FIGS. 11A to 11C and FIGS. 12A to 12C. In addition, the method for manufacturing the transistor 101, which differs from the transistor 102 only in the structure of the oxide semiconductor layer 130, is described. In each of FIGS. 11A to 11C and FIGS. 12A to 12C, a cross section of the transistor in the channel length direction is shown on the left side, and a cross section of the transistor in the channel width direction is shown on the right side. The cross-sectional views in the channel width direction are enlarged views; therefore, components on the left side and those on the right side differ in apparent thickness.

For the substrate 110, a glass substrate, a ceramic substrate, a quartz substrate, a sapphire substrate, or the like can be used. Alternatively, a single crystal semiconductor substrate or a polycrystalline semiconductor substrate of silicon, silicon carbide, or the like, a compound semiconductor substrate of silicon germanium or the like, a semiconductor-on-insulator (SOI) substrate, or the like may be used. Still alternatively, any of these substrates provided with a semiconductor element may be used.

The insulating layer 120 can be formed by a plasma CVD method, a sputtering method, or the like using an oxide insulating film including aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating film including silicon nitride, silicon nitride oxide, aluminum nitride, aluminum nitride oxide, or the like; or a film in which any of the above materials are mixed. Alternatively, a stack including any of the above materials may be used, and at least an upper layer of the insulating layer 120 which is in contact with the oxide semiconductor layer 130 is preferably formed using a material containing excess oxygen that can serve as a supply source of oxygen to the oxide semiconductor layer 130.

Oxygen may be added to the insulating layer 120 by an ion implantation method, an ion doping method, a plasma immersion ion implantation method, or the like. Adding oxygen enables the insulating layer 120 to supply oxygen much easily to the oxide semiconductor layer 130.

In the case where a surface of the substrate 110 is made of an insulator and there is no influence of impurity diffusion to the oxide semiconductor layer 130 to be formed later, the insulating layer 120 is not necessarily provided.

Figure 11A:
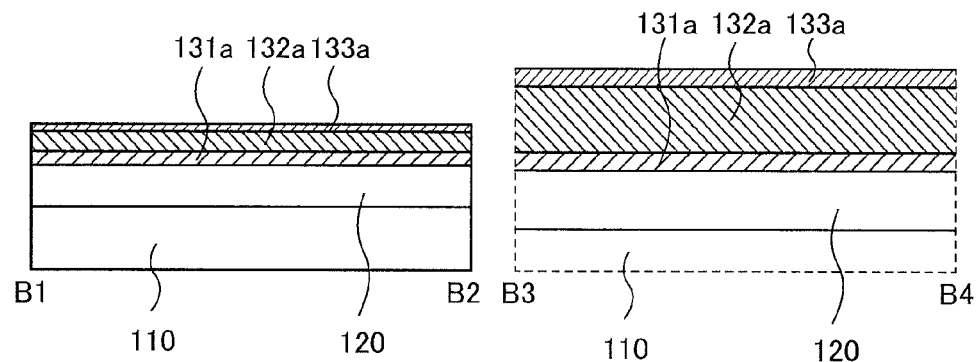
FIGS. 11A to 11C illustrate a method for manufacturing a transistor.

Next, a first oxide semiconductor film 131a to be the first oxide semiconductor layer 131, a second oxide semiconductor film 132a to be the second oxide semiconductor layer 132, and a third oxide semiconductor film 133a to be the third oxide semiconductor layer 133 are formed over the insulating layer 120 by a sputtering method, a CVD method, an MBE method, or the like (see FIG. 11A).

Note that in the case where the transistor 101 in FIGS. 1A and 1B is formed, a single film of the second oxide semiconductor film 132a is provided.

In the case where the oxide semiconductor layer 130 has a stacked-layer structure, oxide semiconductor films are preferably formed successively without exposure to the air with the use of a multi-chamber deposition apparatus (e.g., a sputtering apparatus) including a load lock chamber. It is preferable that each chamber of the sputtering apparatus be able to be evacuated to a high vacuum (approximately $5 \times 10^{-7}$ Pa to $1 \times 10^{-4}$ Pa) by an adsorption vacuum evacuation pump such as a cryopump and that the chamber be able to heat a substrate over which a film is to be deposited to 100° C. or higher, preferably 500° C. or higher, so that water and the like acting as impurities of an oxide semiconductor are removed as much as possible. Alternatively, a combination of a turbo molecular pump and a cold trap is preferably used to prevent back-flow of a gas containing a carbon component, moisture, or the like from an exhaust system into the chamber. Alternatively, a combination of a turbo molecular pump and a cryopump may be used as an exhaust system.

Not only high vacuum evacuation of the chamber but also high purity of a sputtering gas is necessary to obtain a highly purified intrinsic oxide semiconductor. As an oxygen gas or an argon gas used for a sputtering gas, a gas which is highly purified to have a dew point of −40° C. or lower, preferably −80° C. or lower, further preferably −100° C. or lower is used, whereby entry of moisture or the like into the oxide semiconductor film can be prevented as much as possible.

For the first oxide semiconductor film 131a, the second oxide semiconductor film 132a, and the third oxide semiconductor film 133a, any of the materials described in Embodiment 2 can be used. For example, an In—Ga—Zn oxide whose atomic ratio of In to Ga and Zn is 1:3:6, 1:3:4, 1:3:3, or 1:3:2 can be used for the first oxide semiconductor film 131a, an In—Ga—Zn oxide whose atomic ratio of In to Ga and Zn is 1:1:1, 3:1:2, or 5:5:6 can be used for the second oxide semiconductor film 132a, and an In—Ga—Zn oxide whose atomic ratio of In to Ga and Zn is 1:3:6, 1:3:4, 1:3:3, or 1:3:2 can be used for the third oxide semiconductor film 133a. Note that the atomic ratio of each of the first oxide semiconductor film 131a, the second oxide semiconductor film 132a, and the third oxide semiconductor film 133a may vary within a range of ±20% of the above atomic ratio as an error. In the case where a sputtering method is used for deposition, the above material can be used as a target.

An oxide semiconductor that can be used for each of the first oxide semiconductor film 131a, the second oxide semiconductor film 132a, and the third oxide semiconductor film 133a preferably contains at least indium (In) or zinc (Zn). Both In and Zn are preferably contained. In order to reduce fluctuations in electrical characteristics of the transistor including the oxide semiconductor, the oxide semiconductor preferably contains a stabilizer in addition to In and Zn.

As a stabilizer, gallium (Ga), tin (Sn), hafnium (Hf), aluminum (Al), zirconium (Zr), and the like can be given. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be given.

As the oxide semiconductor, for example, any of the following can be used: indium oxide, tin oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

For example, "In—Ga—Zn oxide" means an oxide containing In, Ga, and Zn as its main components. The In—Ga—Zn oxide may contain another metal element in addition to In, Ga, and Zn. Note that in this specification, a film containing the In—Ga—Zn oxide is also referred to as an IGZO film.

A material represented by $InMO_3(ZnO)_m$ (m>0 is satisfied, and in is not an integer) may be used. Note that M represents one or more metal elements selected from Ga, Y, Zr, La, Ce, and Nd. Alternatively, a material represented by $In_2SnO_5(ZnO)_n$ (n>0 is satisfied, and n is an integer) may be used.

Note that as described in Embodiment 2 in detail, materials are selected so that the first oxide semiconductor film 131a and the third oxide semiconductor film 133a each have an electron affinity lower than that of the second oxide semiconductor film 132a.

Note that the oxide semiconductor films are preferably formed by a sputtering method. As a sputtering method, an RF sputtering method, a DC sputtering method, an AC sputtering method, or the like can be used.

In the case of using an In—Ga—Zn oxide target for forming each of the first oxide semiconductor film 131a, the second oxide semiconductor film 132a, and the third oxide semiconductor film 133a by a sputtering method, the target whose atomic ratio of In to Ga and Zn is 1:1:1, 2:2:1, 3:1:2, 5:5:6, 1:3:2, 1:3:3, 1:3:4, 1:3:6, 1:4:3, 1:5:4, 1:6:6, 2:1:3, 1:6:4, 1:9:6, 1:1:4, or 1:1:2 can be used.

The indium content in the second oxide semiconductor film 132a is preferably higher than those in the first and third oxide semiconductor films 131a and 133a. In an oxide semiconductor, the s orbital of heavy metal mainly contributes to carrier transfer, and when the proportion of In in the oxide semiconductor is increased, overlap of the s orbitals is likely to be increased. Therefore, an oxide having a composition in which the proportion of In is higher than that of Ga has higher mobility than an oxide having a composition in which the proportion of In is equal to or lower than that of Ga. Thus, with the use of an oxide having a high indium content for the second oxide semiconductor layer 132, a transistor having high mobility can be achieved.

First heat treatment may be performed after the third oxide semiconductor film 133a is formed. The first heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the first heat treatment may be performed in such a manner that heat treatment is performed in an inert gas atmosphere, and then another heat treatment is performed in an atmosphere containing an oxidizing gas at 10 ppm or more, in order to compensate released oxygen. The first heat treatment can increase the crystallinity of the first to third oxide semiconductor films 131a to 133a and remove impurities such as water and hydrogen from the insulating layer 120 and the first to third oxide semiconductor films 131a to 133a. Note that the first heat treatment may be performed after etching for formation of the first to third oxide semiconductor layers 131 to 133, which is described later.

Next, a first resist mask is formed over the third oxide semiconductor film 133a. It is preferable that the first resist mask be formed by a lithography method using electron beam exposure, liquid immersion exposure, or EUV exposure, for example. At this time, using a negative photoresist material for forming the first resist mask can shorten the time needed for the light exposure step. Alternatively, the first resist mask may be formed by a nanoimprint lithography method. The third oxide semiconductor film 133a, the second oxide semiconductor film 132a, and the first oxide semiconductor film 131a are selectively etched with the use of the first resist mask, whereby the oxide semiconductor layer 130 formed using the stack including the third oxide semiconductor layer 133, the second oxide semiconductor layer 132, and the first oxide semiconductor layer 131 is formed (see FIG. 11B). It is also possible to use a hard mask to form the oxide semiconductor layer 130. The hard mask is obtained by forming a metal film, an insulating film, or the like over the third oxide semiconductor film 133a and selectively etching the film with the use of the first resist mask. In this case, with the use of a metal film or an insulating film having an appropriate thickness as a hard mask, the cross section of the oxide semiconductor layer 130 in the channel width direction can be substantially triangular or substantially trapezoidal with an extremely short upper base. Note that in the case where the transistor 101 in FIGS. 1A and 1B is formed, a single layer of an oxide semiconductor film is etched by any of the above methods, whereby the oxide semiconductor layer 130 is formed.

Figure 11B:
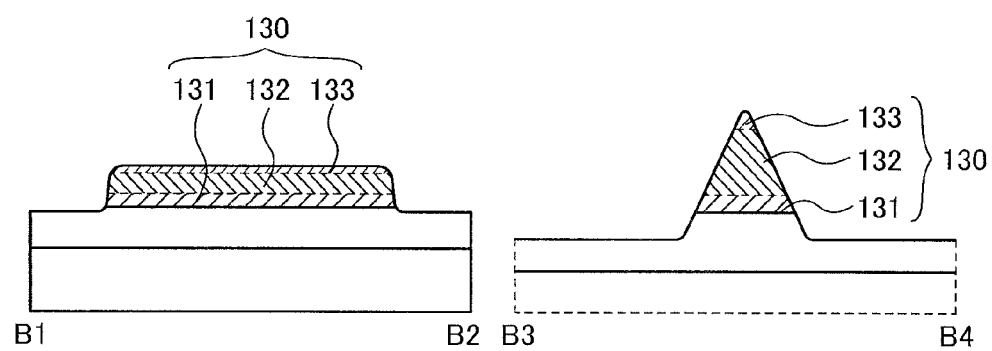
Figure 11C:
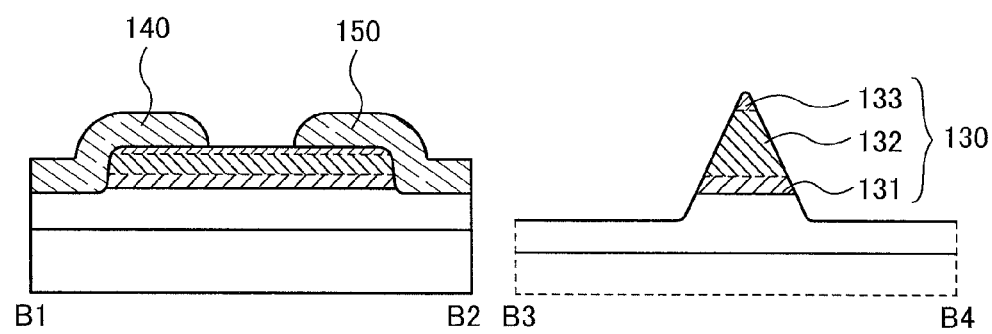

In this step, the insulating layer 120 may be partly etched as shown in FIG. 11B. When the insulating layer 120 is partly etched, the gate electrode layer 170 to be formed later can easily cover the second oxide semiconductor layer 132 where a channel is formed, with the gate insulating film 160 therebetween.

Next, a first conductive film is formed over the oxide semiconductor layer 130. For the first conductive film, Al, Cr, Cu, Ta, Ti, Mo, W, Ni, Mn, Nd, Sc, or the like can be used. It is also possible to use an alloy or a conductive nitride of any of these materials. It is also possible to use a stack of a plurality of materials selected from these materials, alloys of these materials, and conductive nitrides of these materials. For example, a tungsten film with a thickness of 100 nm is formed by a sputtering method, a CVD method, or the like.

Next, a second resist mask is formed over the first conductive film. Then, the first conductive film is selectively etched using the second resist mask as a mask, so that the source electrode layer 140 and the drain electrode layer 150 are formed (see FIG. 11C).

Figure 15:
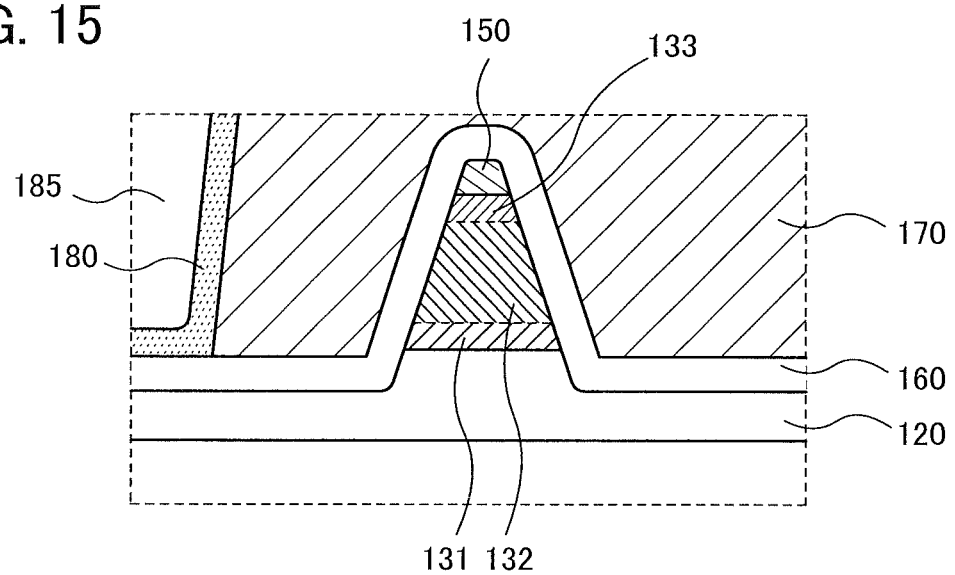
FIG. 15 is a cross-sectional view illustrating a transistor, the cross-sectional view being taken in a channel width direction of the transistor.

Note that in the case where the oxide semiconductor layer 130 has a substantially trapezoidal cross section in the channel width direction, the source electrode layer 140 and the drain electrode layer 150 may be formed using the metal film used as the hard mask. In this case, the region 191 or the region 192 has a cross section in the channel width direction as illustrated in FIG. 15. Since the source electrode layer 140 and the drain electrode layer 150 are not formed on side surfaces of the oxide semiconductor layer 130 in this structure, a gate electric field can be easily applied to the oxide semiconductor layer 130 and the S value can be reduced.

Figure 12A:
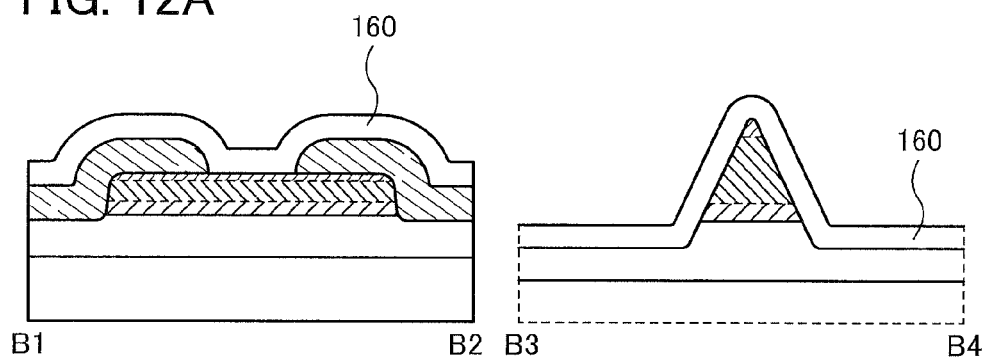
FIGS. 12A to 12C illustrate a method for manufacturing a transistor.

Next, the gate insulating film 160 is formed over the oxide semiconductor layer 130, the source electrode layer 140, and the drain electrode layer 150 (see FIG. 12A). The gate insulating film 160 can be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, or the like. The gate insulating film 160 may be a stack including any of the above materials. The gate insulating film 160 can be formed by a sputtering method, a CVD method, an MBE method, or the like.

Then, a second conductive film to be the gate electrode layer 170 is formed over the gate insulating film 160. As the second conductive film, a conductive film formed using Al, Ti, Cr, Co, Ni, Cu, Y, Zr, Mo, Ru, Ag, Mn, Nd, Sc, Ta, W, or the like can be used. It is also possible to use an alloy or a conductive nitride of any of these materials. It is also possible to use a stack of a plurality of materials selected from these materials, alloys of these materials, and conductive nitrides of these materials. For example, a stacked film of a tungsten film and a titanium nitride film is formed by a sputtering method, a CVD method, or the like.

Figure 12B:
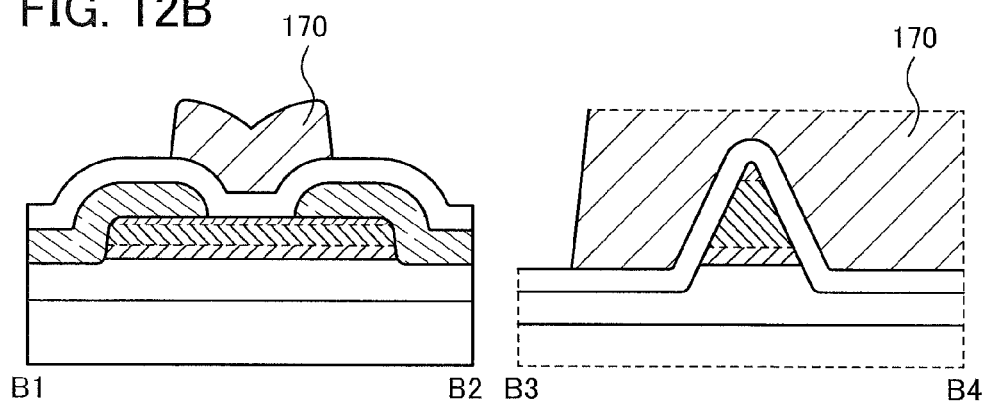

After that, a third resist mask is formed over the second conductive film, and the second conductive film is selectively etched using the third resist mask to form the gate electrode layer 170 (see FIG. 12B).

Figure 12C:
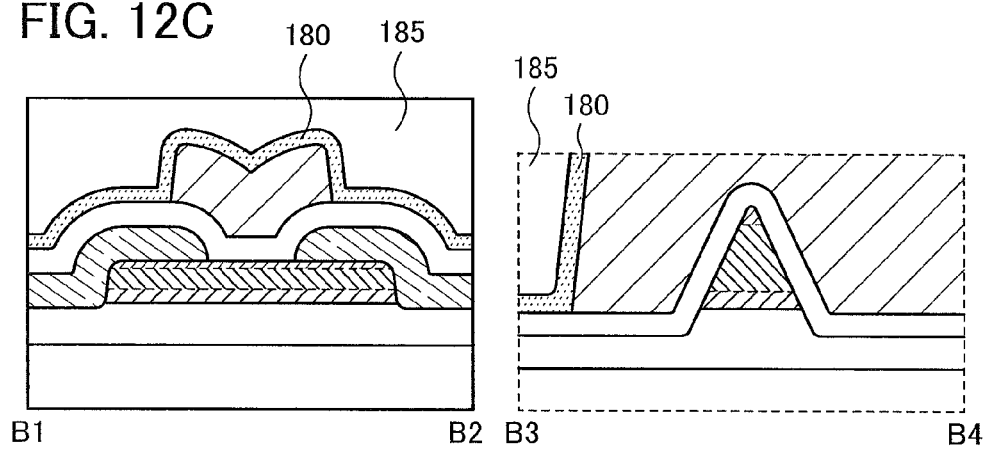

Then, the insulating layer 180 and the insulating layer 185 are formed over the gate insulating film 160 and the gate electrode layer 170 (see FIG. 12C). The insulating layer 180 and the insulating layer 185 can each be formed using a material and a method which are similar to those of the insulating layer 120. Note that it is particularly preferable to use aluminum oxide for the insulating layer 180.

Oxygen may be added to the insulating layer 180 and/or the insulating layer 185 by an ion implantation method, an ion doping method, a plasma immersion ion implantation method, or the like. Adding oxygen enables the insulating layer 180 and/or the insulating layer 185 to supply oxygen much easily to the oxide semiconductor layer 130.

After that, second heat treatment may be performed. The second heat treatment can be performed in a condition similar to that of the first heat treatment. By the second heat treatment, excess oxygen is easily released from the insulating layer 120, the insulating layer 180, and the insulating layer 185, so that oxygen vacancies in the oxide semiconductor layer 130 can be reduced.

Through the above steps, the transistor 102 in FIGS. 5A and 5B and FIGS. 6A and 6B can be formed. In addition, as described above, when a single layer is used for the oxide semiconductor layer 130, the transistor 101 shown in FIGS. 1A and 1B and FIGS. 2A and 2B can be formed.

Next, the method for manufacturing the transistor 103 shown in FIGS. 8A and 8B and FIGS. 9A and 9B is described. Note that description of steps similar to those for manufacturing the transistor 101 and the transistor 102 is omitted.

Figure 13A:
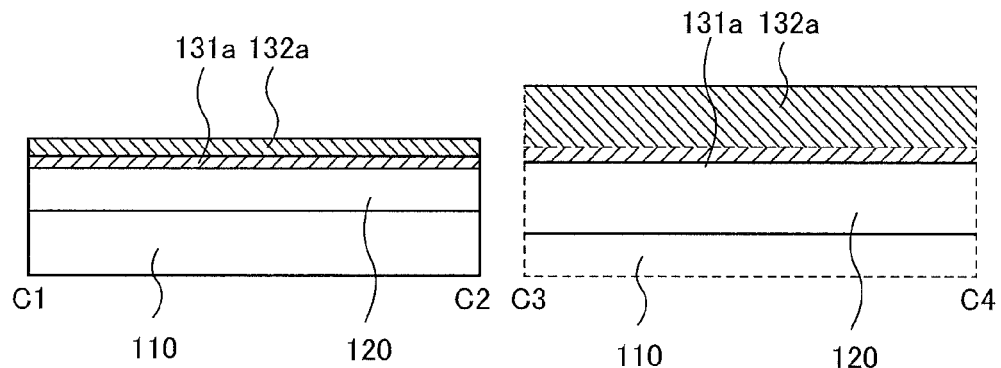
FIGS. 13A to 13C illustrate a method for manufacturing a transistor.

The insulating layer 120 is formed over the substrate 110, and the first oxide semiconductor film 131a to be the first oxide semiconductor layer 131 and the second oxide semiconductor film 132a to be the second oxide semiconductor layer 132 are formed over the insulating layer 120 by a sputtering method, a CVD method, an MBE method, or the like (see FIG. 13A).

Figure 13B:
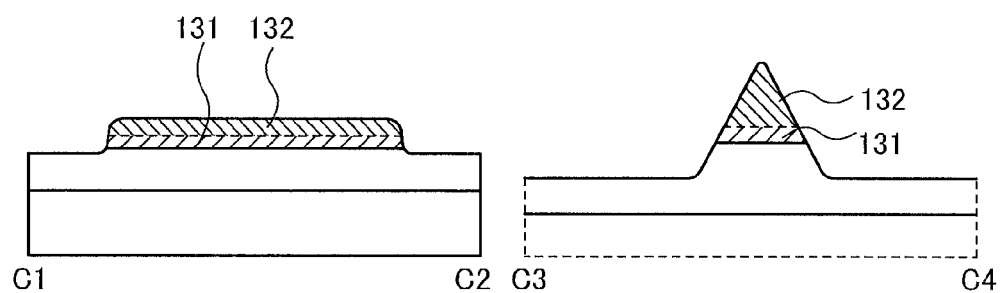

Next, a first resist mask is formed over the second oxide semiconductor film 132a. The second oxide semiconductor film 132a and the first oxide semiconductor film 131a are selectively etched with the use of the first resist mask, whereby a stack including the second oxide semiconductor layer 132 and the first oxide semiconductor layer 131 is formed (see FIG. 13B). At this time, as in the cases of the transistors 101 and 102, with the use of a metal film or an insulating film having an appropriate thickness as a hard mask, the cross section of the oxide semiconductor layer 130 in the channel width direction can be substantially triangular or substantially trapezoidal with an extremely short upper base. As illustrated in FIG. 13B, it is preferable to overetch the insulating layer 120 during the etch process of the second oxide semiconductor film 132a and the first oxide semiconductor film 131a. Further, as illustrated in the right image of FIG. 13B, a preferable configuration is one in which no step is formed between the sides of the second oxide semiconductor layer 132 and the first oxide semiconductor layer 131 and between the sides of the first oxide semiconductor layer 131 and the overetched region of the insulating layer 120. Due to such a configuration, coverage of the stack formed by the second oxide semiconductor film 132a and the first oxide semiconductor film 131 with a gate insulating layer and a gate electrode can be enhanced.

Next, a first conductive film is formed over the stack including the second oxide semiconductor layer 132 and the first oxide semiconductor layer 131. For this step, the description on the first conductive film used for forming the transistor 101 or the transistor 102 can be referred to.

Figure 13C:
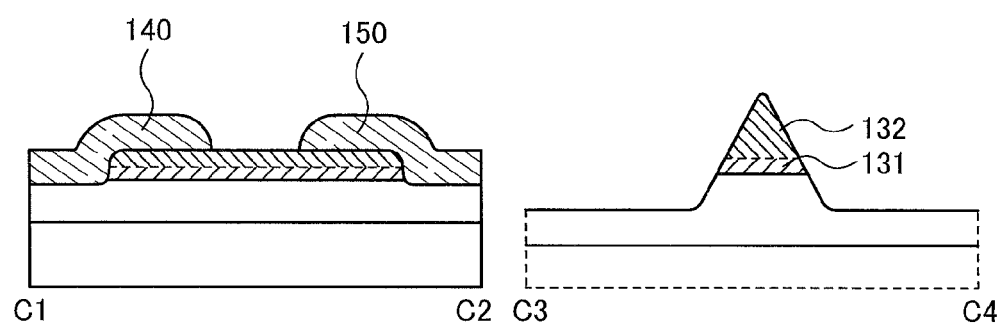

Next, a second resist mask is formed over the first conductive film. Then, the first conductive film is selectively etched using the second resist mask as a mask, so that the source electrode layer 140 and the drain electrode layer 150 are formed (see FIG. 13C).

Next, the third oxide semiconductor film 133a to be the third oxide semiconductor layer 133 is formed over the stack including the second oxide semiconductor layer 132 and the first oxide semiconductor layer 131, the source electrode layer 140, and the drain electrode layer 150 by a sputtering method, a CVD method, an MBE method, or the like.

Next, the gate insulating film 160 is formed over the third oxide semiconductor film 133a. For this step, the description on the gate insulating film 160 of the transistor 101 or the transistor 102 can be referred to.

Then, a second conductive film 170a to be the gate electrode layer 170 is formed over the gate insulating film 160. For this step, the description on the second conductive film used for forming the transistor 101 or the transistor 102 can be referred to.

Figure 14A:
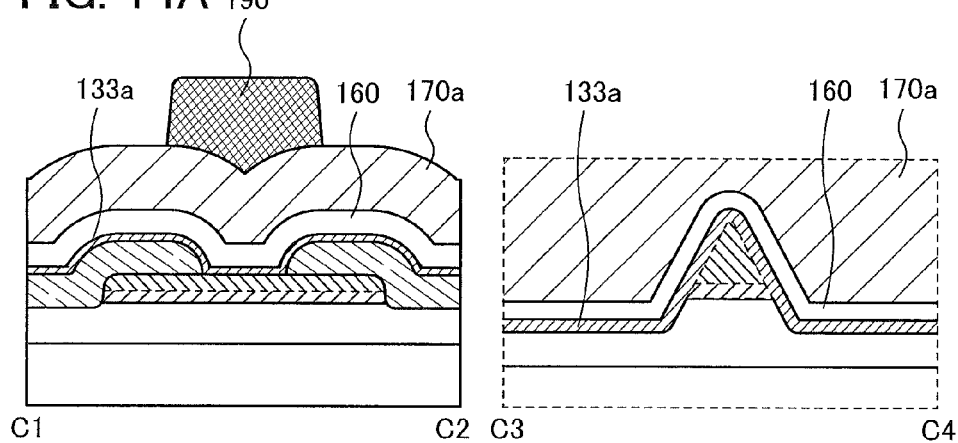
FIGS. 14A to 14C illustrate a method for manufacturing a transistor.

Next, a fourth resist mask 190 is formed over the second conductive film 170a (see FIG. 14A). Then, the second conductive film 170a is selectively etched using the fourth resist mask 190 to form the gate electrode layer 170.

Then, the gate insulating film 160 is selectively etched using the gate electrode layer 170 as a mask.

Figure 14B:
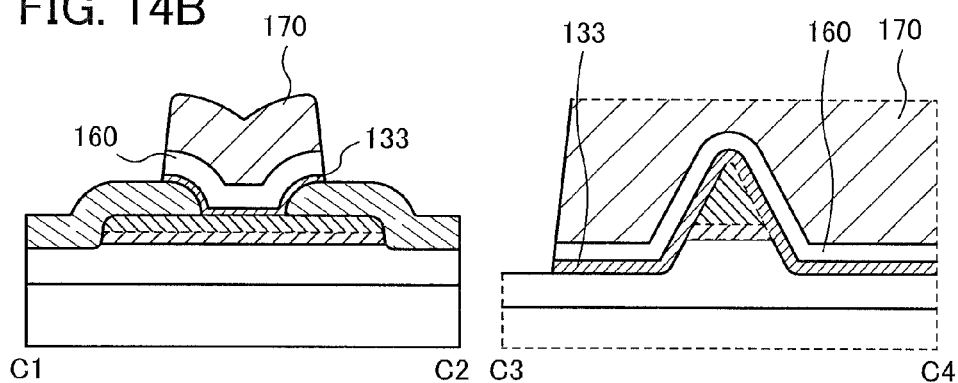

After that, the third oxide semiconductor film 133a is etched using the gate electrode layer 170 or the gate insulating film 160 as a mask to form the third oxide semiconductor layer 133 (see FIG. 14B).

The second conductive film 170a, the gate insulating film 160, and the third oxide semiconductor film 133a may be etched individually or successively. Either dry etching or wet etching may be used as the etching method, and an appropriate etching method may be selected individually.

Figure 14C:
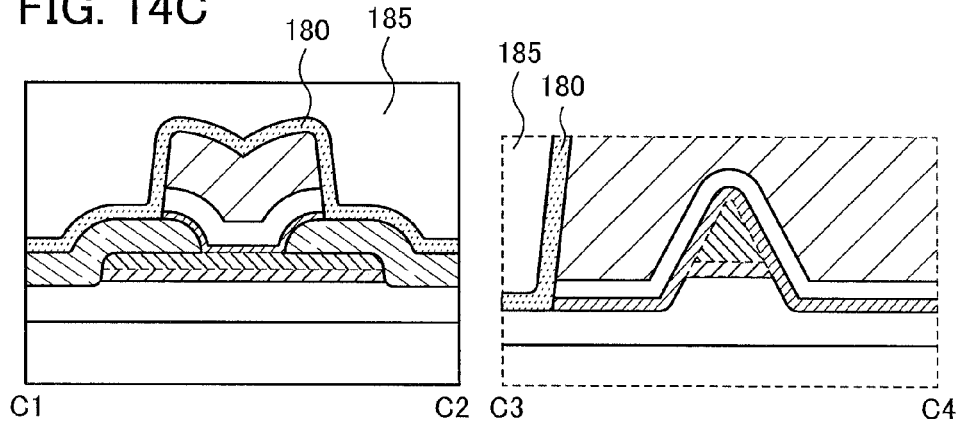

Next, the insulating layer 180 and the insulating layer 185 are formed over the source electrode layer 140, the drain electrode layer 150, and the gate electrode layer 170 (see FIG. 14C). For this step, the description on the insulating layer 180 and the insulating layer 185 of the transistor 101 or the transistor 102 can be referred to.

Through the above steps, the transistor 103 shown in FIGS. 8A and 8B and FIGS. 9A and 9B can be manufactured.

Although the variety of films such as the metal films, the semiconductor films, and the inorganic insulating films which are described in this embodiment typically can be formed by a sputtering method or a plasma CVD method, such films may be formed by another method, e.g., a thermal CVD method. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma for forming a film.

Deposition by a thermal CVD method may be performed in such a manner that a source gas and an oxidizer are supplied to the chamber at a time, the pressure in the chamber is set to an atmospheric pressure or a reduced pressure, and reaction is caused in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first source gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The variety of films such as the metal films, the semiconductor films, and the inorganic insulating films which have been disclosed in the embodiments can be formed by a thermal CVD method such as a MOCVD method or an ALD method. For example, in the case where an In—Ga—Zn—O film is formed, trimethylindium, trimethylgallium, and dimethylzinc can be used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where a hafnium oxide film is formed with a deposition apparatus employing ALD, two kinds of gases, i.e., ozone ($O_3$) as an oxidizer and a source gas which is obtained by vaporizing liquid containing a solvent and a hafnium precursor compound (a hafnium alkoxide solution, typically tetrakis(dimethylamide)hafnium (TDMAH)) are used. Note that the chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed using a deposition apparatus employing ALD, two kinds of gases, e.g., $H_2O$ as an oxidizer and a source gas which is obtained by vaporizing liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed using a deposition apparatus employing ALD, hexachlorodisilane is adsorbed on a surface where a film is to be formed, chlorine contained in the adsorbate is removed, and radicals of an oxidizing gas (e.g., $O_2$ or dinitrogen monoxide) are supplied to react with the adsorbate.

For example, in the case where a tungsten film is formed using a deposition apparatus employing ALD, a $WF_6$ gas and a $B_2H_6$ gas are sequentially introduced plural times to form an initial tungsten film, and then a $WF_6$ gas and an $H_2$ gas are introduced at a time, so that a tungsten film is formed. Note that an $SiH_4$ gas may be used instead of a $B_2H_6$ gas.

For example, in the case where an oxide semiconductor film, e.g., an In—Ga—Zn—O film is formed using a deposition apparatus employing ALD, an $In(CH_3)_3$ gas and an $O_3$ gas are sequentially introduced plural times to form an In—O layer, a $Ga(CH_3)_3$ gas and an $O_3$ gas are introduced at a time to form a GaO layer, and then a $Zn(CH_3)_2$ gas and an $O_3$ gas are introduced at a time to form a ZnO layer. Note that the order of these layers is not limited to this example. A mixed compound layer such as an In—Ga—O layer, an In—Zn—O layer, or a Ga—Zn—O layer may be formed by mixing of these gases. Note that although an $H_2O$ gas which is obtained by bubbling with an inert gas such as Ar may be used instead of an $O_3$ gas, it is preferable to use an $O_3$ gas, which does not contain H. Instead of an $In(CH_3)_3$ gas, an $In(C_2H_5)_3$ gas may be used. Instead of a $Ga(CH_3)_3$ gas, a $Ga(C_2H_5)_3$ gas may be used. Furthermore, a $Zn(CH_3)_2$ gas may be used.

This embodiment can be combined as appropriate with any of the other embodiments and an example in this specification.

Embodiment 4

In this embodiment, an oxide semiconductor film that can be used for a transistor of one embodiment of the present invention is described.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "perpendicular" indicates that an angle formed between two straight lines is greater than or equal to 80° and less than or equal to 100°, and accordingly also includes the case where the angle is greater than or equal to 85° and less than or equal to 95°.

In this specification, trigonal and rhombohedral crystal systems are included in a hexagonal crystal system.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films having a plurality of c-axis aligned crystal parts.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each layer of metal atoms has a morphology reflecting a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

On the other hand, according to the TEM image of the CAAC-OS film observed in a direction substantially perpendicular to the sample surface (plan-view TEM image), metal atoms are arranged in a triangular or hexagonal configuration in the crystal parts. However, there is no regularity of arrangement of metal atoms between different crystal parts.

FIG. 16A is a cross-sectional TEM image of a CAAC-OS film. FIG. 16B is a cross-sectional TEM image obtained by enlarging the image of FIG. 16A. In FIG. 16B, atomic arrangement is highlighted for easy understanding.

FIG. 16C is local Fourier transform images of regions each surrounded by a circle (the diameter is about 4 nm) between A and O and between O and A' in FIG. 16A. C-axis alignment can be observed in each region in FIG. 16C. The c-axis direction between A and O is different from that between O and A', which indicates that a grain in the region between A and O is different from that between O and A'. In addition, the angle of the c-axis between A and O continuously and gradually changes, for example, 14.3°, 16.6°, and 26.4°. Similarly, the angle of the c-axis between O and A' continuously changes, for example, −18.3°, −17.6°, and −15.9°.

Note that in an electron diffraction pattern of the CAAC-OS film, spots (bright spots) indicating alignment are shown. For example, when electron diffraction with an electron beam having a diameter of 1 nm or more and 30 nm or less (such electron diffraction is also referred to as nanobeam electron diffraction) is performed on the top surface of the CAAC-OS film, spots are observed (see FIG. 17A).

From the results of the cross-sectional TEM image and the plan-view TEM image, alignment is found in the crystal parts in the CAAC-OS film.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm. Note that when a plurality of crystal parts included in the CAAC-OS film is connected to each other, one large crystal region is formed in some cases. For example, a crystal region with an area of 2500 nm$^2$ or more, 5 μm$^2$ or more, or 1000 μm$^2$ or more is observed in some cases in the plan-view TEM image.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray is incident on a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where the shape of the CAAC-OS film is changed by etching or the like, the c-axis might not be necessarily parallel to a normal vector of a formation surface or a normal vector of a top surface of the CAAC-OS film.

Distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. Further, when an impurity is added to the CAAC-OS film, a region to which the impurity is added may be altered and the proportion of the c-axis aligned crystal parts in the CAAC-OS film might vary depending on regions.

Note that when the CAAC-OS film with an InGaZnO$_4$ crystal is analyzed by an out-of-plane method, a peak may also be observed when 2θ is around 36°, in addition to the peak at 2θ of around 31°. The peak at 2θ of around 36° indicates that a crystal having no c-axis alignment is included in part of the CAAC-OS film. It is preferable that in the CAAC-OS film, a peak appear when 2θ is around 31° and that a peak not appear when 2θ is around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Therefore, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released and might behave like fixed electric charge. Thus, the transistor including the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film will be described.

In an image obtained with the TEM, crystal parts cannot be found clearly in the microcrystalline oxide semiconductor film in some cases. In most cases, the size of a crystal part included in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm, is specifically referred to as nanocrystal (nc). An oxide semiconductor film including nanocrystal is referred to as an nc-OS (nanocrystalline oxide semiconductor) film. In an image of the nc-OS film which is obtained with the TEM, for example, a crystal grain boundary is not clearly detected in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than the diameter of a crystal part, a peak indicating a crystal plane does not appear. Further, a halo pattern is shown in a selected-area electron diffraction pattern of the nc-OS film obtained by using an electron beam having a probe diameter (e.g., 50 nm or larger) larger than the diameter of a crystal part. Meanwhile, spots are shown in a nanobeam electron diffraction pattern of the nc-OS film obtained by using an electron beam having a probe diameter close to or smaller than the size of a crystal part. Furthermore, in a nanobeam electron diffraction pattern of the nc-OS film, regions with high luminance in a circular (ring) pattern are shown in some cases. Moreover, in a nanobeam electron diffraction pattern of the nc-OS film, a plurality of spots is shown in a ring-like region in some cases (see FIG. 17B).

The nc-OS film is an oxide semiconductor film that has high regularity as compared with an amorphous oxide semiconductor film. Therefore, the nc-OS film has a lower density of defect states than an amorphous oxide semiconductor film. Note that there is no regularity of crystal orientation between different crystal parts in the nc-OS film. Therefore, the nc-OS film has a higher density of defect states than the CAAC-OS film.

Note that an oxide semiconductor film may be a stacked film including two or more films of an amorphous oxide semiconductor film, a microcrystalline oxide semiconductor film, and a CAAC-OS film, for example.

In the case where an oxide semiconductor film has a plurality of structures, the structures can be analyzed using nanobeam electron diffraction in some cases.

Figure 17A:
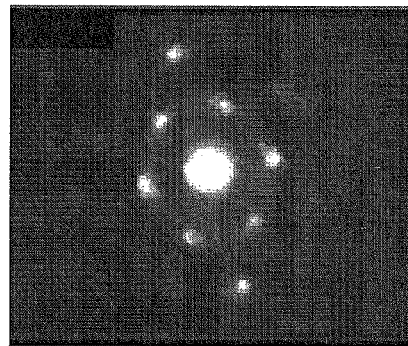
FIGS. 17A and 17B show nanobeam electron diffraction patterns of oxide semiconductor films and FIGS. 17C and 17D illustrate an example of a transmission electron diffraction measurement apparatus.
Figure 17B:
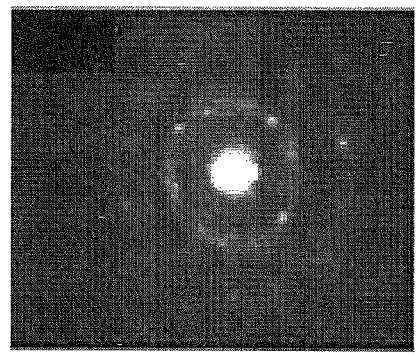
Figure 17C:
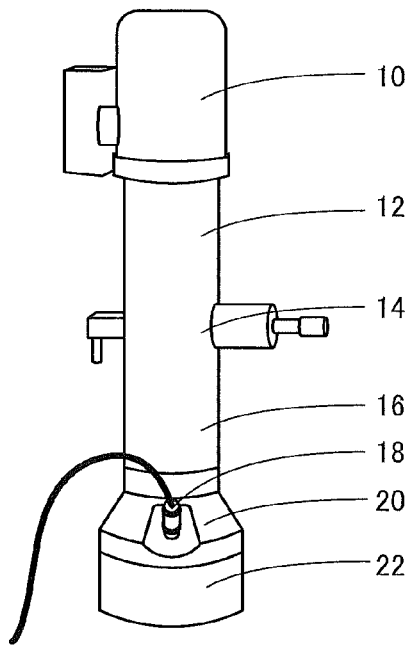

FIG. 17C illustrates a transmission electron diffraction measurement apparatus which includes an electron gun chamber 10, an optical system 12 below the electron gun chamber 10, a sample chamber 14 below the optical system 12, an optical system 16 below the sample chamber 14, an observation chamber 20 below the optical system 16, a camera 18 installed in the observation chamber 20, and a film chamber 22 below the observation chamber 20. The camera 18 is provided to face toward the inside of the observation chamber 20. Note that the film chamber 22 is not necessarily provided.

Figure 17D:
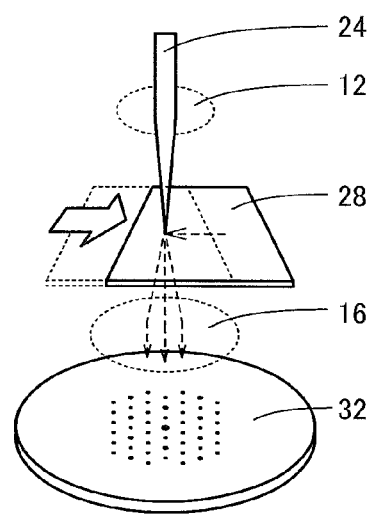

FIG. 17D illustrates an internal structure of the transmission electron diffraction measurement apparatus illustrated in FIG. 17C. In the transmission electron diffraction measurement apparatus, a substance 28 which is positioned in the sample chamber 14 is irradiated with electrons emitted from an electron gun installed in the electron gun chamber 10 through the optical system 12. Electrons passing through the substance 28 are incident on a fluorescent plate 32 provided in the observation chamber 20 through the optical system 16. On the fluorescent plate 32, a pattern corresponding to the intensity of the incident electrons appears, which allows measurement of a transmission electron diffraction pattern.

The camera 18 is installed so as to face the fluorescent plate 32 and can take an image of a pattern appearing on the fluorescent plate 32. An angle formed by a straight line which passes through the center of a lens of the camera 18 and the center of the fluorescent plate 32 and an upper surface of the fluorescent plate 32 is, for example, 15° or more and 80° or less, 30° or more and 75° or less, or 45° or more and 70° or less. As the angle is reduced, distortion of the transmission electron diffraction pattern taken by the camera 18 becomes larger. Note that if the angle is obtained in advance, the distortion of an obtained transmission electron diffraction pattern can be corrected. Note that the film chamber 22 may be provided with the camera 18. For example, the camera 18 may be set in the film chamber 22 so as to be opposite to the incident direction of electrons 24. In this case, a transmission electron diffraction pattern with less distortion can be taken from the rear surface of the fluorescent plate 32.

A holder for fixing the substance 28 that is a sample is provided in the sample chamber 14. The holder transmits electrons passing through the substance 28. The holder may have, for example, a function of moving the substance 28 in the direction of the X, Y, and Z axes. The movement function of the holder may have an accuracy of moving the substance in the range of, for example, 1 nm to 10 nm, 5 nm to 50 nm, 10 nm to 100 nm, 50 nm to 500 nm, and 100 nm to 1 μm. The range is preferably determined to be an optimal range for the structure of the substance 28.

Then, a method for measuring a transmission electron diffraction pattern of a substance by the transmission electron diffraction measurement apparatus described above will be described.

For example, changes in the structure of a substance can be observed by changing (scanning) the irradiation position of the electrons 24 that are a nanobeam on the substance, as illustrated in FIG. 17D. At this time, when the substance 28 is a CAAC-OS film, a diffraction pattern shown in FIG. 17A is observed. When the substance 28 is an nc-OS film, a diffraction pattern shown in FIG. 17B is observed.

Even when the substance 28 is a CAAC-OS film, a diffraction pattern similar to that of an nc-OS film or the like is partly observed in some cases. Therefore, whether a CAAC-OS film is favorable can be determined by the proportion of a region where a diffraction pattern of a CAAC-OS film is observed in a predetermined area (also referred to as proportion of CAAC). In the case of a high-quality CAAC-OS film, for example, the proportion of CAAC is higher than or equal to 50%, preferably higher than or equal to 80%, further preferably higher than or equal to 90%, still further preferably higher than or equal to 95%. Note that the proportion of a region where a diffraction pattern different from that of a CAAC-OS film is observed is referred to as the proportion of non-CAAC.

For example, transmission electron diffraction patterns were obtained by scanning a top surface of a sample including a CAAC-OS film obtained just after deposition (represented as "as-sputtered") and a top surface of a sample including a CAAC-OS film subjected to heat treatment at 450° C. in an atmosphere containing oxygen. Here, the proportion of CAAC was obtained in such a manner that diffraction patterns were observed by scanning for 60 seconds at a rate of 5 nm/second and the obtained diffraction patterns were converted into still images every 0.5 seconds. Note that as an electron beam, a nanobeam with a probe diameter of 1 nm was used. The above measurement was performed on six samples. The proportion of CAAC was calculated using the average value of the six samples.

Figure 18A:
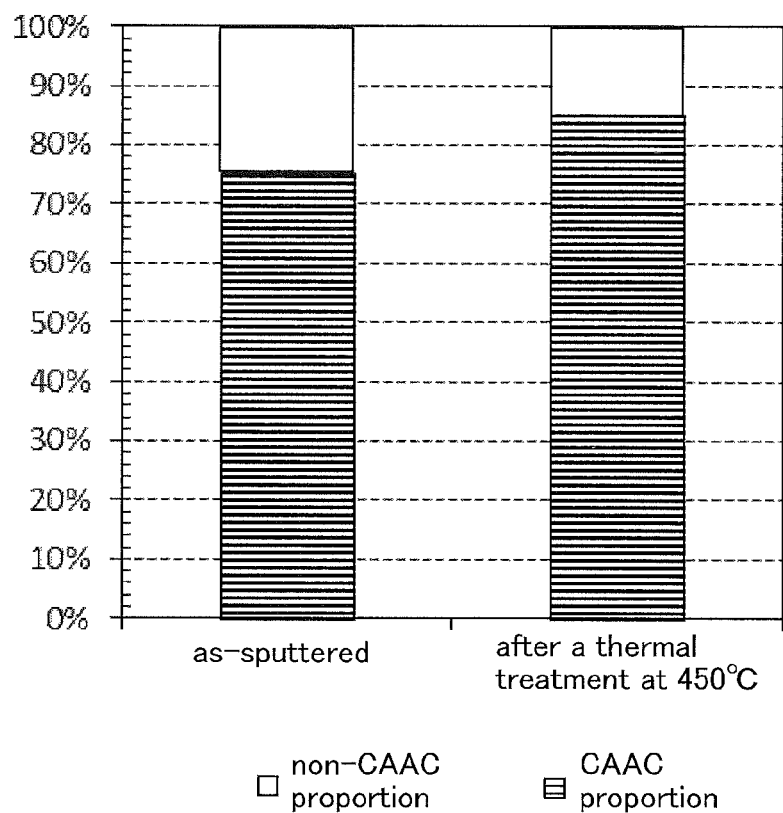
FIG. 18A shows an example of structural analysis by transmission electron diffraction measurement and FIGS. 18B and 18C show plan-view TEM images.

FIG. 18A shows the proportion of CAAC in each sample. The proportion of CAAC of the CAAC-OS film obtained just after the deposition was 75.7% (the proportion of non-CAAC was 24.3%). The proportion of CAAC of the CAAC-OS film subjected to the heat treatment at 450° C. was 85.3% (the proportion of non-CAAC was 14.7%). These results show that the proportion of CAAC obtained after the heat treatment at 450° C. is higher than that obtained just after the deposition. That is, heat treatment at a high temperature (e.g., higher than or equal to 400° C.) reduces the proportion of non-CAAC (increases the proportion of CAAC). Furthermore, the above results also indicate that even when the temperature of the heat treatment is lower than 500° C., the CAAC-OS film can have a high proportion of CAAC.

Here, most of diffraction patterns different from that of a CAAC-OS film are diffraction patterns similar to that of an nc-OS film. Furthermore, an amorphous oxide semiconductor film was not able to be observed in the measurement region. Therefore, the above results suggest that the region having a structure similar to that of an nc-OS film is rearranged by the heat treatment owing to the influence of the structure of the adjacent region, whereby the region becomes CAAC.

Figure 18B:
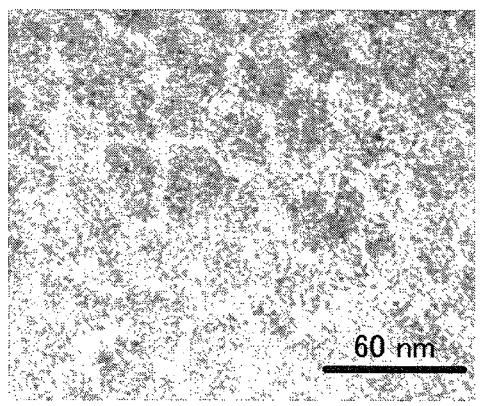
Figure 18C:
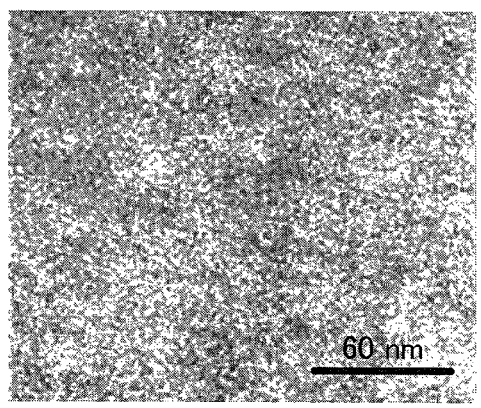

FIGS. 18B and 18C are plan-view TEM images of the CAAC-OS film obtained just after the deposition and the CAAC-OS film subjected to the heat treatment at 450° C., respectively. Comparison between FIGS. 18B and 18C shows that the CAAC-OS film subjected to the heat treatment at 450° C. has more uniform film quality. That is, the heat treatment at a high temperature improves the film quality of the CAAC-OS film.

With such a measurement method, the structure of an oxide semiconductor film having a plurality of structures can be analyzed in some cases.

This embodiment can be combined with any of the other embodiments and an example in this specification as appropriate.

Embodiment 5

In this embodiment, cross-sectional shapes of transistors of embodiments of the present invention in the channel width direction and calculation results of the electrical characteristics thereof are described.

Figure 19A:
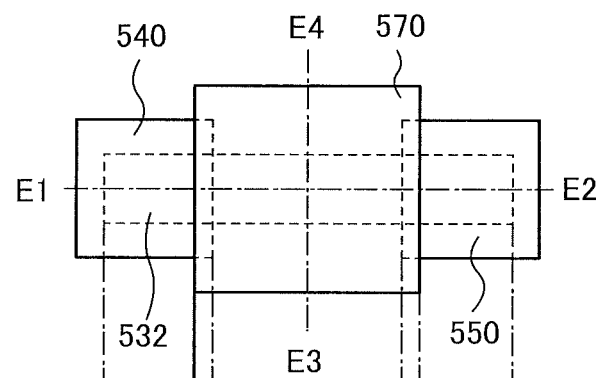
FIGS. 19A and 19B are a top view and a cross-sectional view illustrating a device model.
Figure 19B:
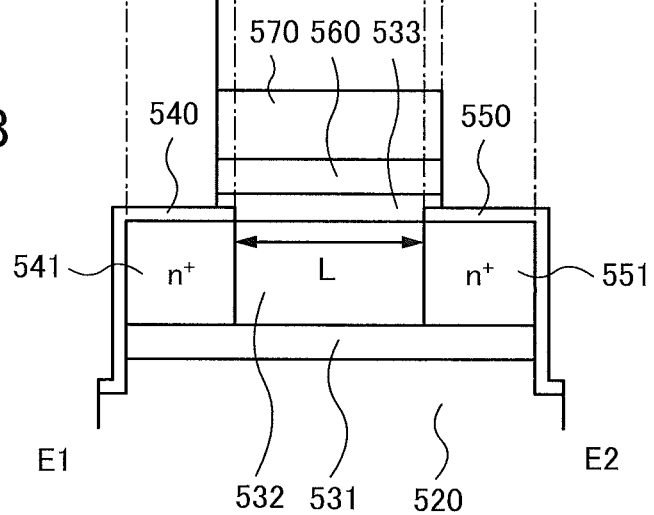

FIGS. 19A and 19B and FIGS. 20A to 20C illustrate device models used for the calculation. FIG. 19A is a top view, and a cross section taken along a dashed-dotted line E1-E2 in FIG. 19A corresponds to FIG. 19B. A cross section taken along a dashed-dotted line E3-E4 in FIG. 19A corresponds to one of FIGS. 20A to 20C. In some cases, the direction of the dashed-dotted line E1-E2 is referred to as a channel length direction, and the direction of the dashed-dotted line E3-E4 is referred to as a channel width direction.

Specifically, the device models illustrated in FIGS. 19A and 19B and FIGS. 20A to 20C each include a stack in which a first oxide semiconductor layer 531 and a second oxide semiconductor layer 532 are formed in this order over an insulating layer 520; a source electrode layer 540 and a drain electrode layer 550 electrically connected to part of the stack; a third oxide semiconductor layer 533 covering part of the stack, part of the source electrode layer 540, and part of the drain electrode layer 550; and a gate insulating film 560 and a gate electrode layer 570 overlapping with part of the stack, part of the source electrode layer 540, part of the drain electrode layer 550, and the third oxide semiconductor layer 533.

The device models are assumed to have the structure of the transistor 103 described in the above embodiments, and the materials used for the transistor 103 can be applied to materials of the counterparts of the device models correspondingly. Note that $n^+$ regions serving as a source region 541 and a drain region 551 are provided in the second oxide semiconductor layer 532.

FIG. 20A illustrates a device model (DM1) in which a cross section of the second oxide semiconductor layer 532 in the channel width direction is rectangular. FIG. 20B illustrates a device model (DM2) in which a cross section of the second oxide semiconductor layer 532 in the channel width direction is trapezoidal. FIG. 20C illustrates a device model (DM3) in which a cross section of the second oxide semiconductor layer 532 in the channel width direction is triangular. In each of the three device models, the height H of the second oxide semiconductor layer 532 is equal to the width of a region where the second oxide semiconductor layer 532 is in contact with the first oxide semiconductor layer 531 (channel width (W)).

The common values in Table 1 are used for the calculation of the three device models. For the calculation, Sentaurus Device manufactured by Synopsys, Inc. is used. The calculation is performed supposing that there is neither trap level nor gate leakage.

TABLE 1

| Structure | Channel length (L) | 60 | nm |
|---|---|---|---|
| | Length of second oxide semiconductor layer (L direction) | 160 | nm |
| | Channel width (W) | 40 | nm |
| | Cross-sectional shape in channel width direction | Rectangular, trapezoidal, or triangular | — |
| Gate insulating film (560) | Relative permittivity | 4.1 | — |
| | Film thickness | 10 | nm |
| Third oxide semiconductor layer (533) | Composition | IGZO (1:3:2) | — |
| | Electron affinity | 4.4 | eV |
| | Eg | 3.6 | eV |
| | Relative permittivity | 15 | — |
| | Donor density | 6.6E−09 | cm$^{-3}$ |
| | Electron mobility | 0.1 | cm$^2$/Vs |
| | Hole mobility | 0.01 | cm$^2$/Vs |
| | Effective density of state in conduction band (Nc) | 5.0E+18 | cm$^{-3}$ |
| | Effective density of state in valence band (Nv) | 5.0E+18 | cm$^{-3}$ |
| | Film thickness | 5 | nm |
| Second oxide semiconductor layer (532) | Composition | IGZO (1:1:1) | — |
| | Electron affinity | 4.6 | eV |
| | Eg | 3.2 | eV |
| | Relative permittivity | 15 | — |
| | Donor density | 6.6E−09 | cm$^{-3}$ |
| | Donor density (n$^+$ layer) | 5.0E+18 | cm$^{-3}$ |
| | Electron mobility | 15 | cm$^2$/Vs |
| | Hole mobility | 0.01 | cm$^2$/Vs |
| | Effective density of state in conduction band (Nc) | 5.0E+18 | cm$^{-3}$ |
| | Effective density of state in valence band (Nv) | 5.0E+18 | cm$^{-3}$ |
| | Film thickness | 60 | nm |
| First oxide semiconductor layer (531) | Composition | IGZO (1:3:2) | — |
| | Film thickness | 10 | nm |
| Insulating layer (520) | Relative permittivity | 4.1 | — |
| | Film thickness | 400 | nm |
| Gate electrode layer (570) | Work function | 5 | eV |
| Source electrode layer (540) and drain electrode layer (550) | Work function | 4.6 | eV |
| | Width | >W | — |
| | Depth of n$^+$ layers (541, 551) | Entire film thickness direction of second oxide semiconductor layer | nm |

In each of the device models, the gate electrode layer 570 covers the second oxide semiconductor layer 532 where a channel is formed like the transistor of one embodiment of the present invention. The difference X between the level of a plane where the second oxide semiconductor layer 532 is in contact with the first oxide semiconductor layer 531 and the level of a plane where the gate electrode layer 570 is in contact with the gate insulating film 560 in the vicinity of a side surface of the first oxide semiconductor layer 531 is 20 nm.

It is also assumed that each of the first oxide semiconductor layer 531 and the third oxide semiconductor layer 533 is an IGZO film having an atomic ratio of In to Ga and Zn of 1:3:2 and that the second oxide semiconductor layer 532 is an IGZO film having an atomic ratio of In to Ga and Zn of 1:1:1.

Figure 21:
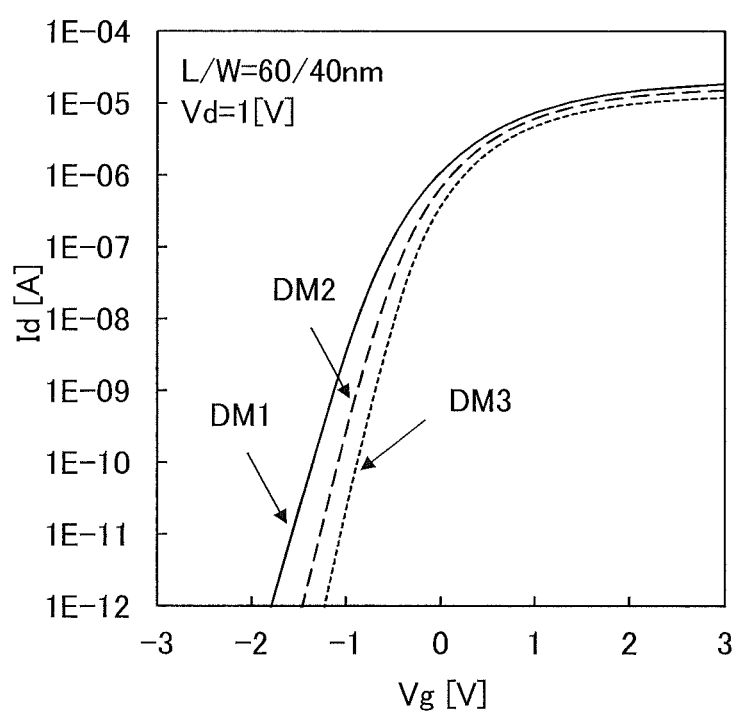
FIG. 21 shows Id-Vg characteristics of device models.

FIG. 21 shows Id-Vg characteristics of the device models obtained by the calculation using the above conditions. According to FIG. 21, DM1 has the largest on-state current (current value when Vg=Vth+1.5 V), DM2 has the second largest, and DM3 has the third largest (DM3<DM2<DM1). As for the S value and the threshold voltage (Vth), the tendencies opposite to the tendency of the on-state current are shown.

Table 2 shows the relative values of the area of a channel cross section, the effective channel width, and the on-state current of DM2 and DM3 with the values of DM1 taken as 1. Note that the area of the channel cross section corresponds to the area of a cross section of the second oxide semiconductor layer 532 and the effective channel width corresponds to the length of a region of the second oxide semiconductor layer 532, which is in contact with the third oxide semiconductor layer 533.

TABLE 2

| | area of channel cross section | effective channel width | on-state current (Vg = Vth + 1.5 V) |
|---|---|---|---|
| DM1 (rectangular) | 1 | 1 | 1 |
| DM2 (trapezoidal) | 0.75 | 0.89 | 0.94 |
| DM3 (triangular) | 0.5 | 0.79 | 0.84 |

Table 2 shows that the on-state current ratio is close to the effective channel width ratio. This is because the proportion of current flowing on a surface of the second oxide semiconductor layer 532 is increased with the gate voltage defining the on-state current.

For the detailed investigation, calculation is performed with device models having the same area of a channel cross section and with device models having the same effective channel width. Note that each of the device models has a rectangular, trapezoidal, or triangular cross section in the channel width direction.

Figure 22A:
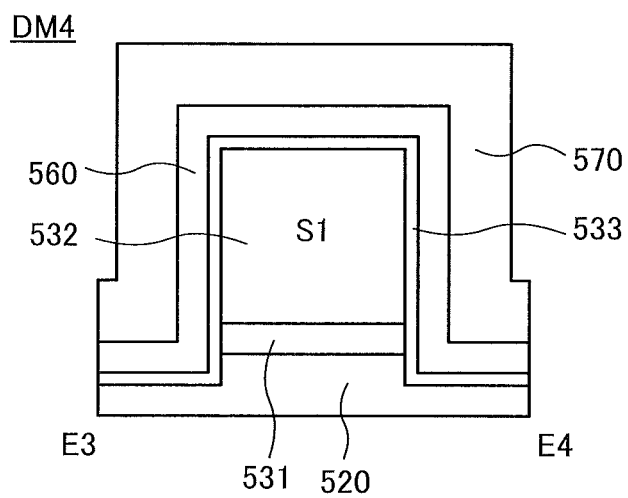
FIGS. 22A to 22C are cross-sectional views illustrating device models.
Figure 22B:
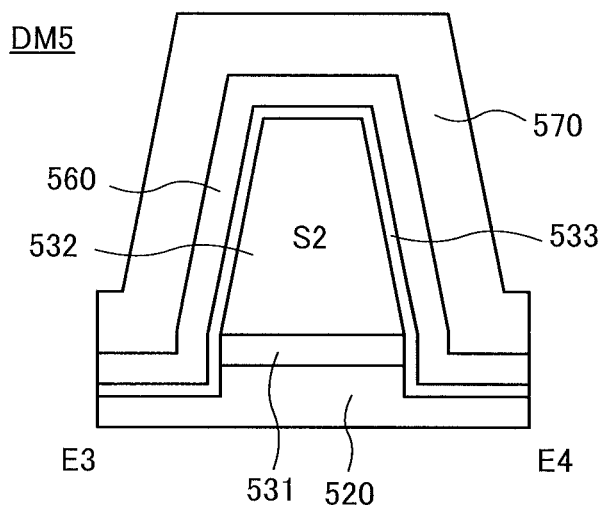
Figure 22C:
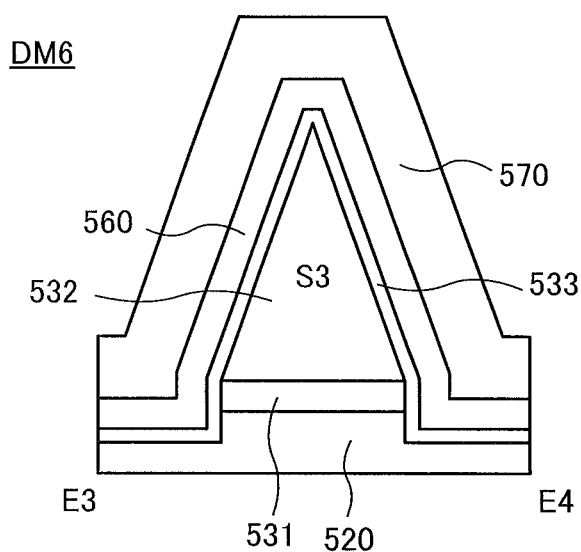

Device models in FIGS. 22A to 22C have the same area of a channel cross section. FIG. 22A illustrates a device model (DM4) in which a cross section of the second oxide semiconductor layer 532 in the channel width direction is rectangular. FIG. 22B illustrates a device model (DM5) in which a cross section of the second oxide semiconductor layer 532 in the channel width direction is trapezoidal. FIG. 22C illustrates a device model (DM6) in which a cross section of the second oxide semiconductor layer 532 in the channel width direction is triangular. When the areas of the channel cross sections of DM4, DM5, and DM6 are S1, S2, and S3, respectively, the equation S1=S2=S3 is satisfied. The three device models have the same width of a region where the second oxide semiconductor layer 532 is in contact with the first oxide semiconductor layer 531 (channel width (W)), but have different heights H of the second oxide semiconductor layer 532, that is, DM4<DM5<DM6. In this case, the relation among the effective channel widths of DM4, DM5, and DM6 is expressed by the inequality DM4<DM5<DM6.

Figure 23A:
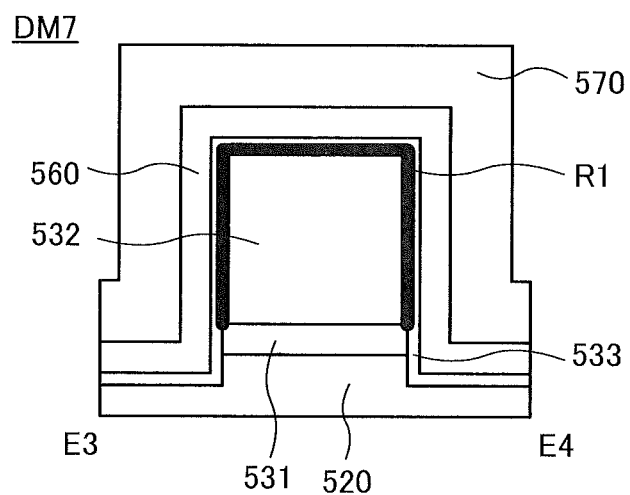
FIGS. 23A to 23C are cross-sectional views illustrating device models.
Figure 23B:
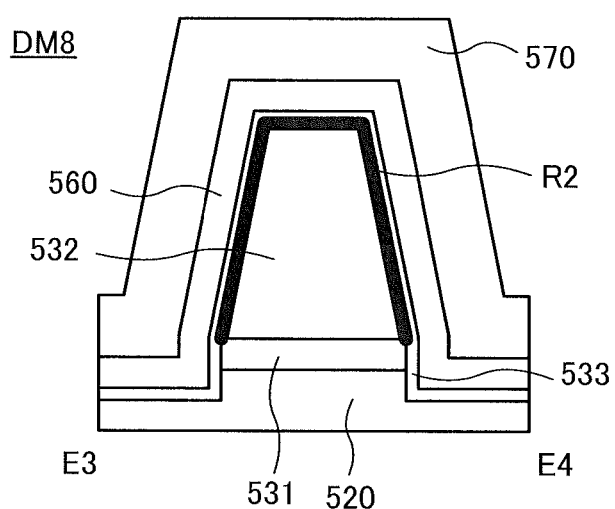
Figure 23C:
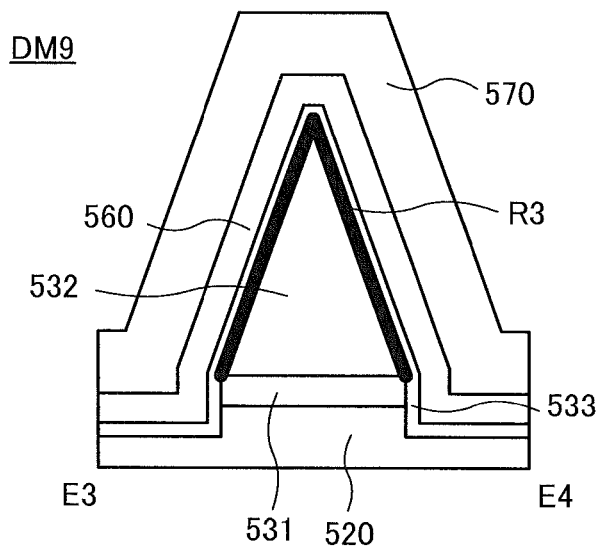

Device models in FIGS. 23A to 23C have the same effective channel width. FIG. 23A illustrates a device model (DM7) in which a cross section of the second oxide semiconductor layer 532 in the channel width direction is rectangular. FIG. 23B illustrates a device model (DM8) in which a cross section of the second oxide semiconductor layer 532 in the channel width direction is trapezoidal. FIG. 23C illustrates a device model (DM9) in which a cross section of the second oxide semiconductor layer 532 in the channel width direction is triangular. When the effective channel widths of DM7, DM8, and DM9 are R1, R2, and R3, respectively, the equation R1=R2=R3 is satisfied. The three device models have the same width of a region where the second oxide semiconductor layer 532 is in contact with the first oxide semiconductor layer 531 (channel width (W)), but have different heights H of the second oxide semiconductor layer 532, that is, DM7<DM8<DM9. In this case, the relation among the areas of the channel cross sections of DM7, DM8, and DM9 is expressed by the inequality DM9<DM8<DM7.

The calculations are performed under the same value conditions of DM1, DM2, and DM3 except for the condition for the film thickness of the second oxide semiconductor layer 532.

Figure 24:
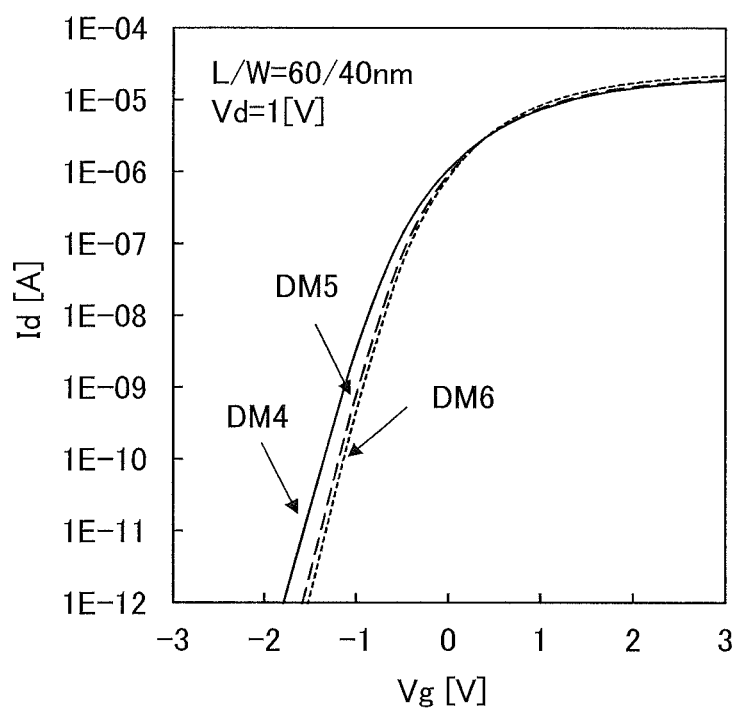
FIG. 24 shows Id-Vg characteristics of device models.

FIG. 24 shows Id-Vg characteristics of the device models having the same area of the channel cross section, which are obtained by the calculation. Table 3 shows the relative values of the effective channel width and the on-state current of DM5 and DM6 with the values of DM4 taken as 1.

TABLE 3

|  | area of channel cross section | effective channel width | on-state current (Vg = Vth + 1.5 V) |
| --- | --- | --- | --- |
| DM4 (rectangular) | 1 | 1 | 1 |
| DM5 (trapezoidal) | 1 | 1.13 | 1.19 |
| DM6 (triangular) | 1 | 1.52 | 1.40 |

According to FIG. 24 and Table 3, the S value and the Vth improve as the cross sectional shape is closer to a triangle. In addition, it is shown that the on-state current depends not on the area of the channel cross section but on the effective channel width.

Figure 25:
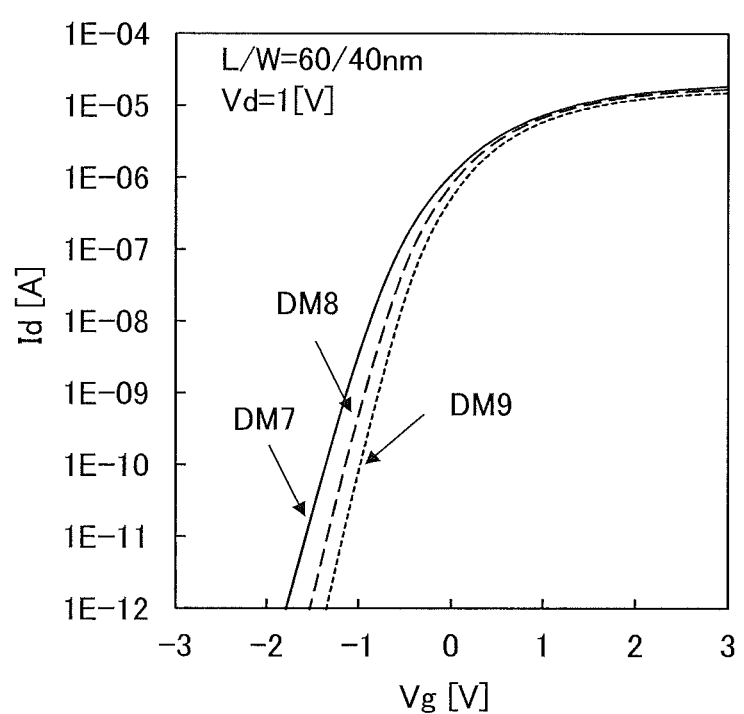
FIG. 25 shows Id-Vg characteristics of device models.

FIG. 25 shows Id-Vg characteristics of the device models having the same effective channel width, which are obtained by the calculation. Table 4 shows the relative values of an area of the channel cross section and the on-state current of DM8 and DM9 with the values of DM7 taken as 1.

TABLE 4

|  | area of channel cross section | effective channel width | on-state current (Vg = Vth + 1.5 V) |
| --- | --- | --- | --- |
| DM7 (rectangular) | 1 | 1 | 1 |
| DM8 (trapezoidal) | 0.87 | 1 | 1.05 |
| DM9 (triangular) | 0.65 | 1 | 1.04 |

According to FIG. 25 and Table 4, the S value and the Vth improve as the cross sectional shape is closer to a triangle. In addition, it is shown that the on-state current depends not on the area of the channel cross section but on the effective channel width.

It is found from the calculation results that the electrical characteristics (on-state current, S value, and Vth) of a transistor can be improved by extending the effective channel width and reducing the area of a channel cross section. In other words, a cross section in the channel width direction is preferably trapezoidal rather than rectangular, more preferably triangular.

This embodiment can be combined as appropriate with any of the other embodiments and an example in this specification.

Embodiment 6

In this embodiment, effects of the channel width of a transistor of one embodiment of the present invention on the electrical characteristics are calculated.

The calculations in this embodiment are performed with DM1 (rectangular) and DM3 (triangular) in Embodiment 5 having a channel width (W) of 10 nm to 100 nm instead of the channel width (W) in Table 1. The other calculation conditions are the same as those of DM1 and DM3 in Embodiment 5.

Figure 26A:
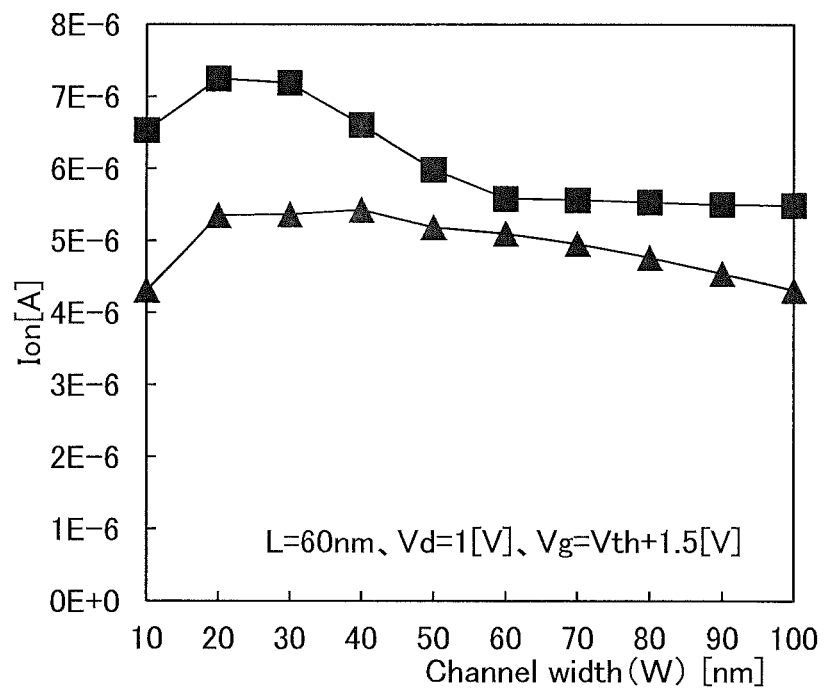
FIGS. 26A and 26B show calculation results of dependence of on-state current and S value on channel width.
Figure 26B:
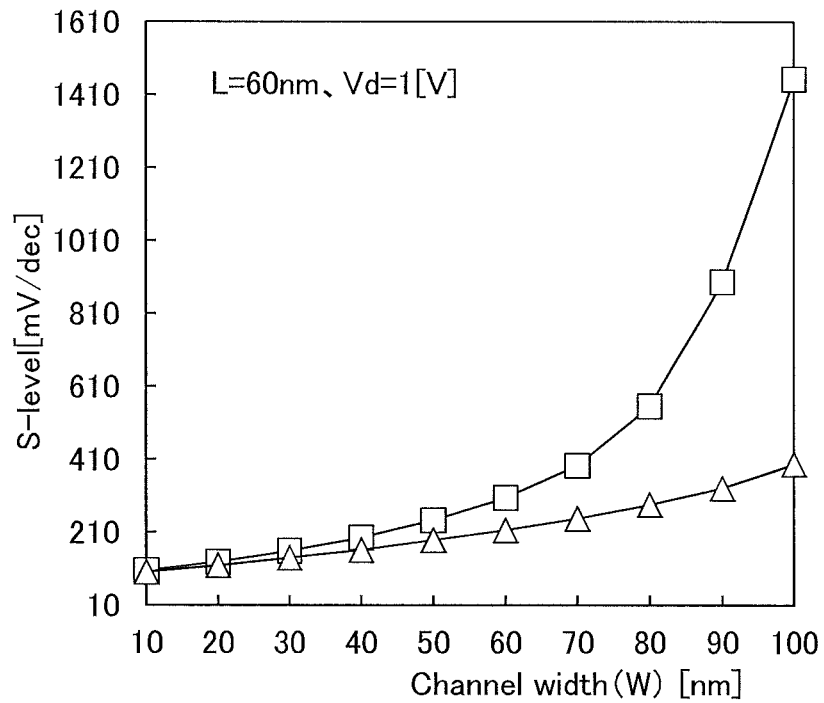

FIGS. 26A and 26B show dependence of the on-state current (Vg=Vth+1.5 V) and the S value on the channel width (W) according to the calculation results.

The transistor characteristics are improved as the channel width (W) reduces in both DM1 and DM3; however, the on-state current decreases when the channel width is 10 nm. Therefore, the channel width (W) of a transistor of one embodiment of the present invention is preferably greater than 10 nm and less than or equal to 100 nm.

In order to obtain a substantially triangular or substantially trapezoidal cross section of an oxide semiconductor layer in the channel width direction, a mask needs to be etched at the same time. In the case of a large channel width (W), it is difficult to obtain a substantially triangular or substantially trapezoidal cross section. Accordingly, the channel width (W) is more preferably greater than 10 nm and less than or equal to 60 nm, further preferably greater than 10 nm and less than or equal to 40 nm.

This embodiment can be combined as appropriate with any of the other embodiments and an example in this specification.

Embodiment 7

In this embodiment, an example of a circuit including the transistor of one embodiment of the present invention is described with reference to drawings.

[Cross-Sectional Structure]

FIG. 27A is a cross-sectional view of a semiconductor device of one embodiment of the present invention. The semiconductor device illustrated in FIG. 27A includes a transistor 2200 containing a first semiconductor material in a lower portion and a transistor 2100 containing a second semiconductor material in an upper portion. In FIG. 27A, an example is described in which the transistor 103 described in the above embodiment as an example is used as the transistor 2100 containing the second semiconductor material. A cross-sectional view of the transistors in a channel length direction is on the left side of a dashed-dotted line, and a cross-sectional view of the transistors in a channel width direction is on the right side of the dashed-dotted line.

Here, the first semiconductor material and the second semiconductor material are preferably materials having different band gaps. For example, the first semiconductor material can be a semiconductor material other than an oxide semiconductor (examples of such a semiconductor material include silicon (including strained silicon), germanium, silicon germanium, silicon carbide, gallium arsenide, aluminum gallium arsenide, indium phosphide, gallium nitride, and an organic semiconductor), and the second semiconductor material can be an oxide semiconductor. A transistor using a material other than an oxide semiconductor, such as single crystal silicon, can operate at high speed easily. In contrast, a transistor using an oxide semiconductor has small off-state current.

The transistor 2200 may be either an n-channel transistor or a p-channel transistor, and an appropriate transistor may be used in accordance with a circuit. Furthermore, the specific structure of the semiconductor device, such as the material or the structure used for the semiconductor device, is not necessarily limited to those described here except for the use of the transistor of one embodiment of the present invention which uses an oxide semiconductor.

FIG. 27A illustrates a structure in which the transistor 2100 is provided over the transistor 2200 with an insulating film 2201 and an insulating film 2207 provided therebetween. A plurality of wirings 2202 is provided between the transistor 2200 and the transistor 2100. Furthermore, wirings and electrodes provided over and under the insulating films are electrically connected to each other through a plurality of plugs 2203 embedded in the insulating films. An insulating film 2204 covering the transistor 2100, a wiring 2205 over the insulating film 2204, and a wiring 2206 formed by processing a conductive film that is also used for a pair of electrodes of the transistor 2100 are provided.

The stack of the two kinds of transistors reduces the area occupied by the circuit, allowing a plurality of circuits to be highly integrated.

Here, in the case where a silicon-based semiconductor material is used for the transistor 2200 provided in a lower portion, hydrogen in an insulating film provided in the vicinity of the semiconductor film of the transistor 2200 terminates dangling bonds of silicon; accordingly, the reliability of the transistor 2200 can be improved. Meanwhile, in the case where an oxide semiconductor is used for the transistor 2100 provided in an upper portion, hydrogen in an insulating film provided in the vicinity of the semiconductor film of the transistor 2100 becomes a factor of generating carriers in the oxide semiconductor; thus, the reliability of the transistor 2100 might be decreased. Therefore, in the case where the transistor 2100 using an oxide semiconductor is provided over the transistor 2200 using a silicon-based semiconductor material, it is particularly effective that the insulating film 2207 having a function of preventing diffusion of hydrogen is provided between the transistors 2100 and 2200. The insulating film 2207 makes hydrogen remain in the lower portion, thereby improving the reliability of the transistor 2200. In addition, since the insulating film 2207 suppresses diffusion of hydrogen from the lower portion to the upper portion, the reliability of the transistor 2100 also can be improved.

The insulating film 2207 can be, for example, formed using aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

Furthermore, a blocking film 2208 (corresponding to the insulating layer 180 in the transistors 101 to 103) having a function of preventing diffusion of hydrogen is preferably formed over the transistor 2100 to cover the transistor 2100 including an oxide semiconductor film. For the blocking film 2208, a material that is similar to that of the insulating film 2207 can be used, and in particular, an aluminum oxide film is preferably used. The aluminum oxide film has a high shielding (blocking) effect of preventing penetration of both oxygen and impurities such as hydrogen and moisture. Thus, by using the aluminum oxide film as the blocking film 2208 covering the transistor 2100, release of oxygen from the oxide semiconductor film included in the transistor 2100 can be prevented and entry of water and hydrogen into the oxide semiconductor film can be prevented.

Note that the transistor 2200 can be a transistor of various types without being limited to a planar type transistor. For example, the transistor 2200 can be a fin-type transistor, a tri-gate transistor, or the like. An example of a cross-sectional view in this case is shown in FIG. 27D. An insulating film 2212 is provided over a semiconductor substrate 2211. The semiconductor substrate 2211 includes a projecting portion with a thin tip (also referred to a fin). Note that an insulating film may be provided over the projecting portion. The insulating film functions as a mask for preventing the semiconductor substrate 2211 from being etched when the projecting portion is formed. The projecting portion does not necessarily have the thin tip; a projecting portion with a cuboid-like projecting portion and a projecting portion with a thick tip are permitted, for example. A gate insulating film 2214 is provided over the projecting portion of the semiconductor substrate 2211, and a gate electrode 2213 is provided over the gate insulating film 2214. Source and drain regions 2215 are formed in the semiconductor substrate 2211. Note that here is shown an example in which the semiconductor substrate 2211 includes the projecting portion; however, a semiconductor device of one embodiment of the present invention is not limited thereto. For example, a semiconductor region having a projecting portion may be formed by processing an SOI substrate.

[Circuit Configuration Example]

In the above structure, electrodes of the transistor 2100 and the transistor 2200 can be connected in a variety of ways; thus, a variety of circuits can be formed. Examples of circuit configurations which can be achieved by using a semiconductor device of one embodiment of the present invention are shown below.

[CMOS Circuit]

A circuit diagram in FIG. 27B shows a configuration of a so-called CMOS circuit in which the p-channel transistor 2200 and the n-channel transistor 2100 are connected to each other in series and in which gates of them are connected to each other.

[Analog Switch]

A circuit diagram in FIG. 27C shows a configuration in which sources of the transistors 2100 and 2200 are connected to each other and drains of the transistors 2100 and 2200 are connected to each other. With such a configuration, the transistors can function as a so-called analog switch.

[Memory Device Example]

Figure 28A:
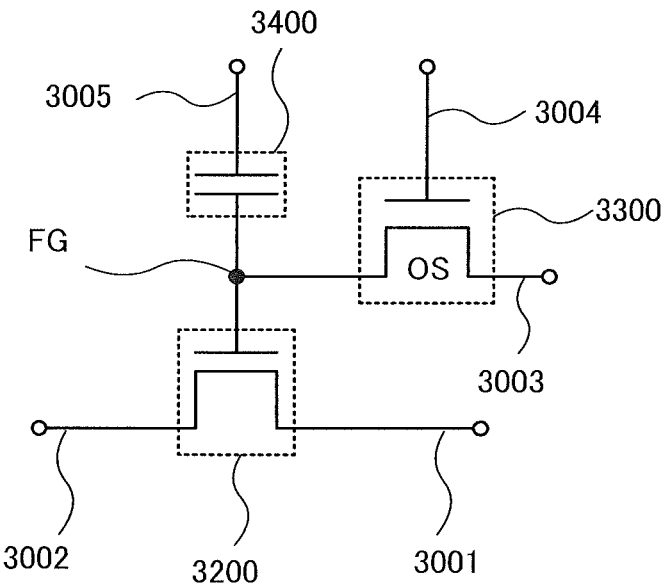
FIGS. 28A to 28C are circuit diagrams and a cross-sectional view of a memory device.
Figure 28B:
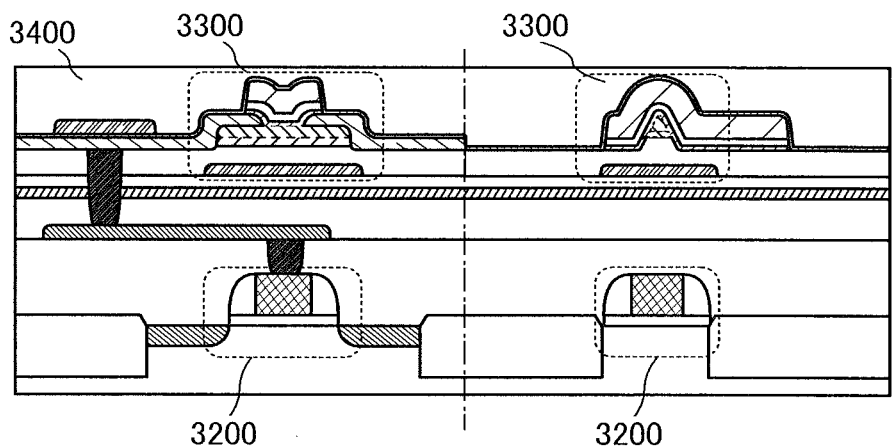
Figure 28C:
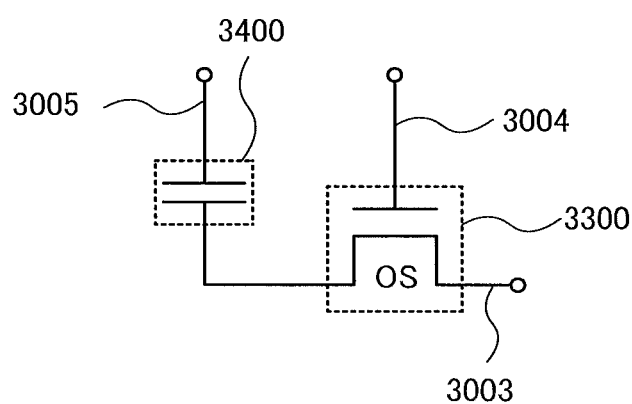

An example of a semiconductor device (memory device) which includes the transistor of one embodiment of the present invention, which can retain stored data even when not powered, and which has an unlimited number of write cycles is shown in FIGS. 28A to 28C.

The semiconductor device illustrated in FIG. 28A includes a transistor 3200 using a first semiconductor material, a transistor 3300 using a second semiconductor material, and a capacitor 3400. Note that any of the above-described transistors can be used as the transistor 3300.

FIG. 28B is a cross-sectional view of the semiconductor device illustrated in FIG. 28A. The semiconductor device in the cross-sectional view has a structure in which the transistor 3300 is provided with a back gate; however, a structure without a back gate may be employed.

The transistor 3300 is a transistor in which a channel is formed in a semiconductor layer including an oxide semiconductor. Since the off-state current of the transistor 3300 is small, stored data can be retained for a long period. In other words, power consumption can be sufficiently reduced because a semiconductor memory device in which refresh operation is unnecessary or the frequency of refresh operation is extremely low can be provided.

In FIG. 28A, a first wiring 3001 is electrically connected to a source electrode of the transistor 3200. A second wiring 3002 is electrically connected to a drain electrode of the transistor 3200. A third wiring 3003 is electrically connected to one of a source electrode and a drain electrode of the transistor 3300. A fourth wiring 3004 is electrically connected to a gate electrode of the transistor 3300. A gate electrode of the transistor 3200 is electrically connected to the other of the source electrode and the drain electrode of the transistor 3300 and one electrode of the capacitor 3400. A fifth wiring 3005 is electrically connected to the other electrode of the capacitor 3400.

The semiconductor device in FIG. 28A has a feature that the potential of the gate electrode of the transistor 3200 can be retained, and thus enables writing, retaining, and reading of data as follows.

Writing and retaining of data are described. First, the potential of the fourth wiring 3004 is set to a potential at which the transistor 3300 is turned on, so that the transistor 3300 is turned on. Accordingly, the potential of the third wiring 3003 is supplied to the gate electrode of the transistor 3200 and the capacitor 3400. That is, a predetermined charge is supplied to a gate of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is turned off, so that the transistor 3300 is turned off. Thus, the charge supplied to the gate of the transistor 3200 is held (retaining).

Since the off-state current of the transistor 3300 is extremely small, the charge of the gate of the transistor 3200 is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the gate of the transistor 3200. This is because in the case of using an n-channel transistor as the transistor 3200, an apparent threshold voltage $V_{th\_H}$ at the time when the high-level charge is given to the gate of the transistor 3200 is lower than an apparent threshold voltage $V_{th\_L}$ at the time when the low-level charge is given to the gate of the transistor 3200. Here, an apparent threshold voltage refers to the potential of the fifth wiring 3005 which is needed to turn on the transistor 3200. Thus, the potential of the fifth wiring 3005 is set to a potential $V_0$ which is between $V_{th\_H}$ and $V_{th\_L}$, whereby charge supplied to the gate of the transistor 3200 can be determined. For example, in the case where the high-level charge is supplied to the gate electrode of the transistor 3200 in writing and the potential of the fifth wiring 3005 is $V_0$ (>$V_{th\_H}$), the transistor 3200 is turned on. In the case where the low-level charge is supplied to the gate electrode of the transistor 3200 in writing, even when the potential of the fifth wiring 3005 is $V_0$ (<$V_{th\_L}$), the transistor 3200 remains off. Thus, the data retained in the gate electrode of the transistor 3200 can be read by determining the potential of the second wiring 3002.

Note that in the case where memory cells are arrayed to be used, it is necessary that only data of a desired memory cell be able to be read. In the case where such reading is not performed, the fifth wiring 3005 may be supplied with a potential at which the transistor 3200 is turned off regardless of the state of the gate, that is, a potential lower than $V_{th\_H}$. Alternatively, the fifth wiring 3005 may be supplied with a potential at which the transistor 3200 is turned on regardless of the state of the gate, that is, a potential higher than $V_{th\_L}$.

The semiconductor device illustrated in FIG. 28C is different from the semiconductor device illustrated in FIG. 28A in that the transistor 3200 is not provided. Also in this case, writing and retaining operation of data can be performed in a manner similar to the semiconductor device illustrated in FIG. 28A.

Next, reading of data is described. When the transistor 3300 is turned on, the third wiring 3003 which is in a floating state and the capacitor 3400 are electrically connected to each other, and the charge is redistributed between the third wiring 3003 and the capacitor 3400. As a result, the potential of the third wiring 3003 is changed. The amount of change in potential of the third wiring 3003 varies depending on the potential of the one electrode of the capacitor 3400 (or the charge accumulated in the capacitor 3400).

For example, the potential of the third wiring 3003 after the charge redistribution is $(C_B \times V_{B0} + C \times V)/(C_B + C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of retaining the potential $V_1$ (=$(C_B \times V_{B0} + C \times V_1)/(C_B + C)$) is higher than the potential of the third wiring 3003 in the case of retaining the potential $V_0$ (=$(C_B \times V_{B0} + C \times V_0)/(C_B + C)$).

Then, by comparing the potential of the third wiring 3003 with a predetermined potential, data can be read.

In this case, a transistor including the first semiconductor material may be used for a driver circuit for driving a memory cell, and a transistor including the second semiconductor material may be stacked over the driver circuit as the transistor 3300.

When including a transistor in which a channel formation region is formed using an oxide semiconductor and which has an extremely small off-state current, the semiconductor device described in this embodiment can retain stored data for an extremely long time. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Further, in the semiconductor device described in this embodiment, high voltage is not needed for writing data and there is no problem of deterioration of elements. Unlike in a conventional nonvolatile memory, for example, it is not necessary to inject and extract electrons into and from a floating gate; thus, a problem such as deterioration of a gate insulating film is not caused. That is, the semiconductor device of the disclosed invention does not have a limit on the number of times data can be rewritten, which is a problem of a conventional nonvolatile memory, and the reliability thereof is drastically improved. Furthermore, data is written depending on the state of the transistor (on or off), whereby high-speed operation can be easily achieved.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Further, in the case where a connection portion is disclosed in this specification and the like, it can be determined that one embodiment of the invention in which a connection portion is not specified is disclosed in this specification and the like, in some cases. In particular, in the case where there are several possible portions to which a terminal can be connected, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the present invention can be clear. Further, it can be determined that one embodiment of the present invention whose function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

Note that in this specification and the like, part of a diagram or a text described in one embodiment can be taken out to constitute one embodiment of the invention. Thus, in the case where a diagram or a text related to a certain part is described, a content taken out from the diagram or the text of the certain part is also disclosed as one embodiment of the invention and can constitute one embodiment of the invention. Therefore, for example, part of a diagram or a text including one or more of active elements (e.g., transistors or diodes), wirings, passive elements (e.g., capacitors or resistors), conductive layers, insulating layers, semiconductor layers, organic materials, inorganic materials, components, devices, operating methods, manufacturing methods, or the like can be taken out to constitute one embodiment of the invention. For example, M circuit elements (e.g., transistors or capacitors) (M is an integer) are picked up from a circuit diagram in which N circuit elements (e.g., transistors or capacitors) (N is an integer, where M<N) are provided, whereby one embodiment of the invention can be constituted. As another example, M layers (M is an integer) are picked up from a cross-sectional view in which N layers (N is an integer, where M<N) are provided, whereby one embodiment of the invention can be constituted. As another example, M elements (M is an integer) are picked up from a flow chart in which N elements (N is an integer, where M<N) are provided, whereby one embodiment of the invention can be constituted.

This embodiment can be combined as appropriate with any of the other embodiments and an example in this specification.

Embodiment 8

In this embodiment, an RF tag that includes the transistor described in the above embodiments or the memory device described in the above embodiment is described with reference to FIG. 29.

The RF tag of this embodiment includes a memory circuit, stores necessary data in the memory circuit, and transmits and receives data to/from the outside by using contactless means, for example, wireless communication. With these features, the RF tag can be used for an individual authentication system in which an object or the like is recognized by reading the individual information, for example. Note that the RF tag is required to have extremely high reliability in order to be used for this purpose.

A configuration of the RF tag will be described with reference to FIG. 29. FIG. 29 is a block diagram illustrating a configuration example of an RF tag.

Figure 29:
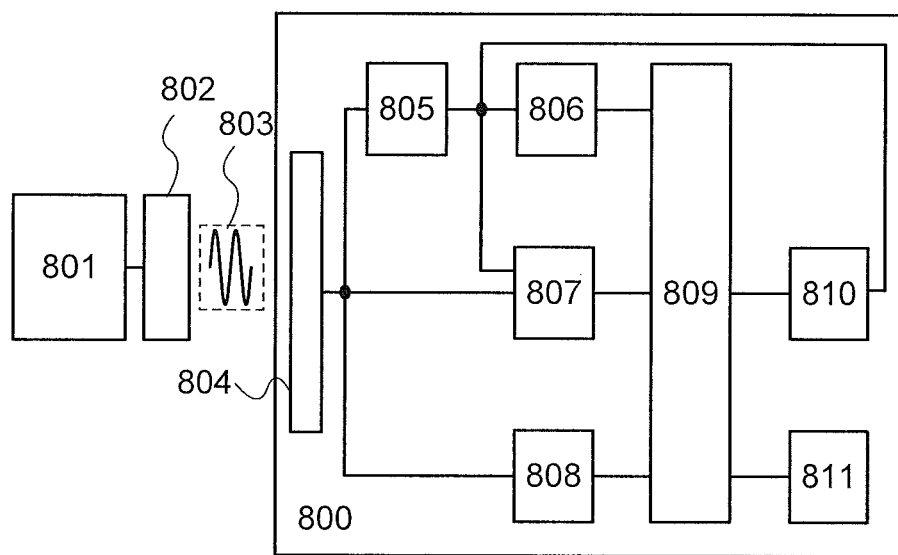
FIG. 29 illustrates a configuration example of an RF tag.

As shown in FIG. 29, an RF tag 800 includes an antenna 804 which receives a radio signal 803 that is transmitted from an antenna 802 connected to a communication device 801 (also referred to as an interrogator, a reader/writer, or the like). The RF tag 800 includes a rectifier circuit 805, a constant voltage circuit 806, a demodulation circuit 807, a modulation circuit 808, a logic circuit 809, a memory circuit 810, and a ROM 811. A transistor having a rectifying function included in the demodulation circuit 807 may be formed using a material which enables a reverse current to be small enough, for example, an oxide semiconductor. This can suppress the phenomenon of a rectifying function becoming weaker due to generation of a reverse current and prevent saturation of the output from the demodulation circuit. In other words, the input to the demodulation circuit and the output from the demodulation circuit can have a relation closer to a linear relation. Note that data transmission methods are roughly classified into the following three methods: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RF tag 800 described in this embodiment.

Next, the structure of each circuit will be described. The antenna 804 exchanges the radio signal 803 with the antenna 802 which is connected to the communication device 801. The rectifier circuit 805 generates an input potential by rectification, for example, half-wave voltage doubler rectification of an input alternating signal generated by reception of a radio signal at the antenna 804 and smoothing of the rectified signal with a capacitor provided in a later stage in the rectifier circuit 805. Note that a limiter circuit may be provided on an input side or an output side of the rectifier circuit 805. The limiter circuit controls electric power so that electric power which is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit which generates a reset signal of the logic circuit 809 by utilizing rise of the stable power supply voltage.

The demodulation circuit 807 demodulates the input alternating signal by envelope detection and generates the demodulated signal. Further, the modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. Further, the ROM 811 stores an identification number (ID) or the like and outputs it in accordance with processing.

Note that the decision whether each circuit described above is provided or not can be made as appropriate as needed.

Here, the memory device described in the above embodiment can be used as the memory circuit 810. Since the memory circuit of one embodiment of the present invention can retain data even when not powered, the memory circuit can be favorably used for an RF tag. Furthermore, the memory circuit of one embodiment of the present invention needs power (voltage) needed for data writing significantly lower than that needed in a conventional nonvolatile memory; thus, it is possible to prevent a difference between the maximum communication range in data reading and that in data writing. In addition, it is possible to suppress malfunction or incorrect writing which is caused by power shortage in data writing.

Since the memory circuit of one embodiment of the present invention can be used as a nonvolatile memory, it can also be used as the ROM 811. In this case, it is preferable that a manufacturer separately prepare a command for writing data to the ROM 811 so that a user cannot rewrite data freely. Since the manufacturer gives identification numbers before shipment and then starts shipment of products, instead of putting identification numbers to all the manufactured RF tags, it is possible to put identification numbers to only good products to be shipped. Thus, the identification numbers of the shipped products are in series and customer management corresponding to the shipped products is easily performed.

This embodiment can be combined as appropriate with any of the other embodiments and an example in this specification.

Embodiment 9

In this embodiment, a CPU that includes the memory device described in the above embodiment is described.

Figure 30:
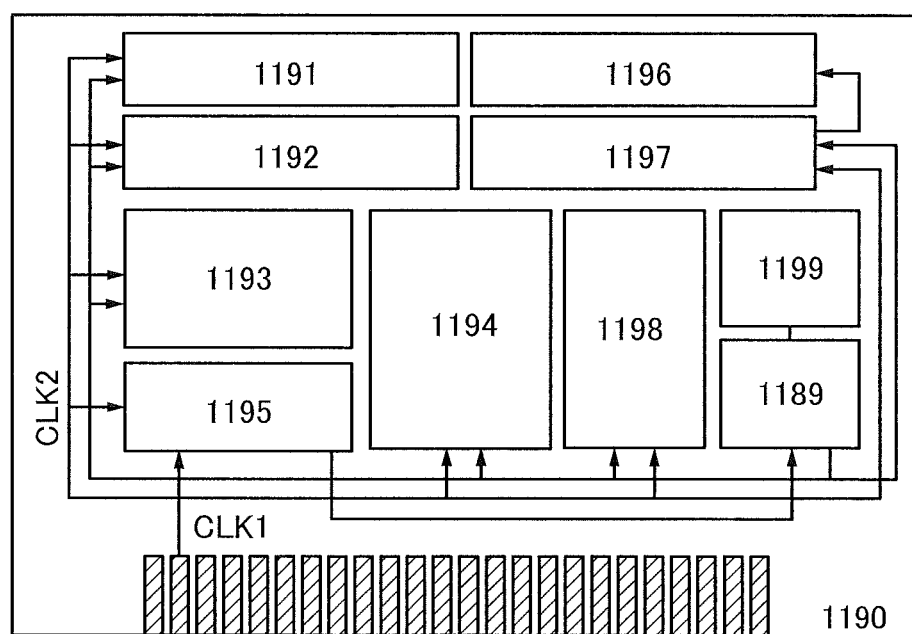
FIG. 30 illustrates a configuration example of a CPU.

FIG. 30 is a block diagram illustrating a configuration example of a CPU at least partly including any of the transistors described in the above embodiments as a component.

The CPU illustrated in FIG. 30 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 30 is just an example in which the configuration is simplified, and an actual CPU may have a variety of configurations depending on the application. For example, the CPU may have the following configuration: a structure including the CPU illustrated in FIG. 30 or an arithmetic circuit is considered as one core; a plurality of the cores is included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 30, a memory cell is provided in the register 1196. For the memory cell of the register 1196, any of the transistors described in the above embodiments can be used.

In the CPU illustrated in FIG. 30, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of power supply voltage to the memory cell in the register 1196 can be stopped.

Figure 31:
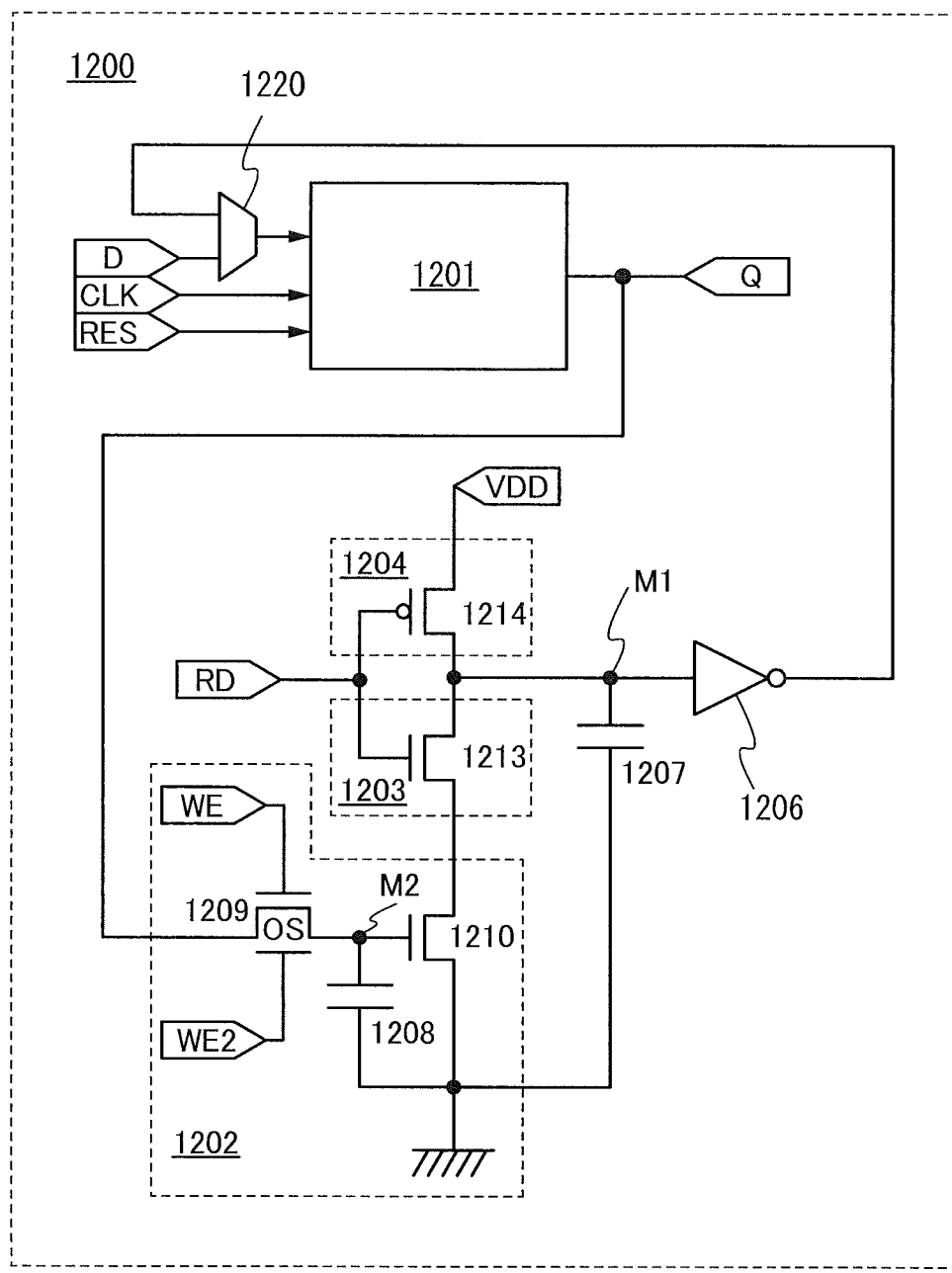
FIG. 31 is a circuit diagram of a memory element.

FIG. 31 is an example of a circuit diagram of a memory element that can be used as the register 1196. A memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the memory device described in the above embodiment can be used as the circuit 1202. When supply of a power supply voltage to the memory element 1200 is stopped, a ground potential (0 V) or a potential at which the transistor 1209 in the circuit 1202 is turned off continues to be input to a gate of the transistor 1209. For example, a first gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes of the capacitor 1208 can be supplied with a low power supply potential (e.g., GND) or a high power supply potential (e.g., VDD). The other of the pair of electrodes of the capacitor 1208 is electrically connected to the line which can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the first gate (first gate electrode) of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

Note that the transistor 1209 in FIG. 31 has a structure with a second gate (second gate electrode; back gate). The control signal WE can be input to the first gate and the control signal WE2 can be input to the second gate. The control signal WE2 is a signal having a constant potential. As the constant potential, for example, a ground potential GND or a potential lower than a source potential of the transistor 1209 is selected. The control signal WE2 is a potential signal for controlling the threshold voltage of the transistor 1209, and Icut of the transistor 1209 can be further reduced. The control signal WE2 may be a signal having the same potential as that of the control signal WE. Note that as the transistor 1209, a transistor without a second gate may be used.

A signal corresponding to data retained in the circuit 1201 is input to the other of the source and the drain of the transistor 1209. FIG. 31 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 31, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 31, the transistors included in the memory element 1200 except for the transistor 1209 can each be a transistor in which a channel is formed in a layer formed using a semiconductor other than an oxide semiconductor or in the substrate 1190. For example, the transistor can be a transistor whose channel is formed in a silicon layer or a silicon substrate. Alternatively, all the transistors in the memory element 1200 may be a transistor in which a channel is formed in an oxide semiconductor layer. Further alternatively, in the memory element 1200, a transistor in which a channel is formed in an oxide semiconductor layer can be included besides the transistor 1209, and a transistor in which a channel is formed in a layer or the substrate 1190 including a semiconductor other than an oxide semiconductor can be used for the rest of the transistors.

As the circuit 1201 in FIG. 31, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor layer is extremely small. For example, the off-state current of a transistor in which a channel is formed in an oxide semiconductor layer is significantly smaller than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although the memory element 1200 is used in a CPU in this embodiment, the memory element 1200 can also be used in an LSI such as a digital signal processor (DSP), a custom LSI, or a programmable logic device (PLD), and a radio frequency (RF) tag.

This embodiment can be combined as appropriate with any of the other embodiments and an example in this specification.

Embodiment 10

In this embodiment, configuration examples of a display device using a transistor of one embodiment of the present invention are described.

Configuration Example

Figure 32A:
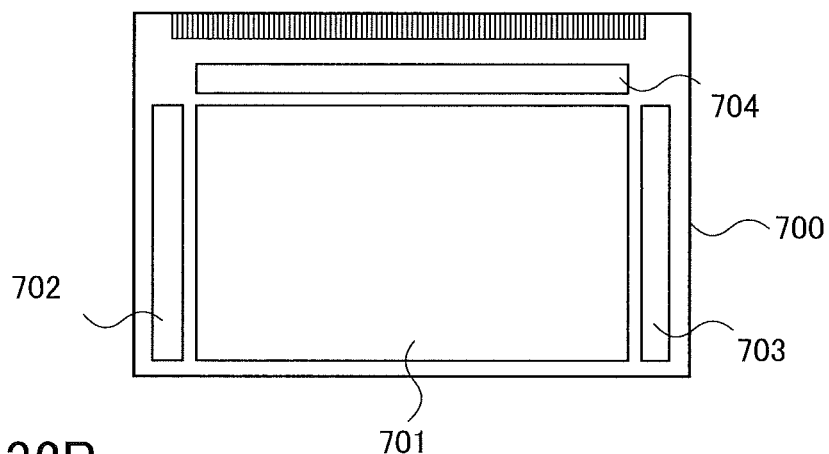
FIG. 32A illustrates a configuration example of a display device.
Figure 32B:
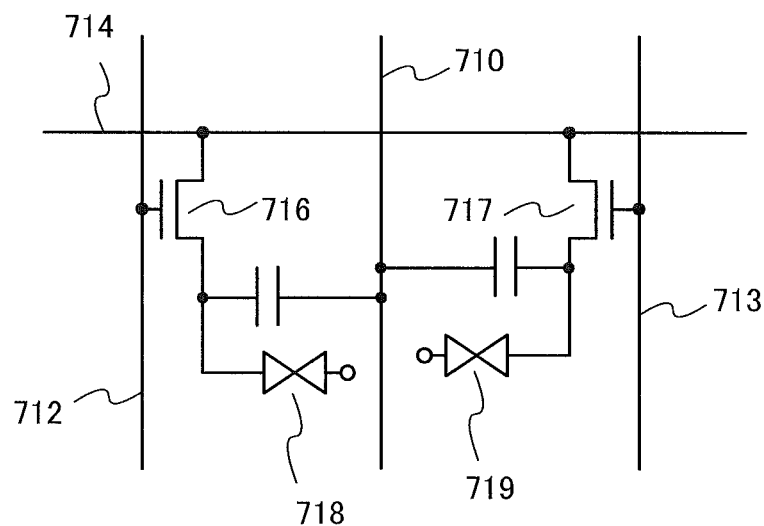
FIGS. 32B and 32C are circuit diagrams of pixels.
Figure 32C:
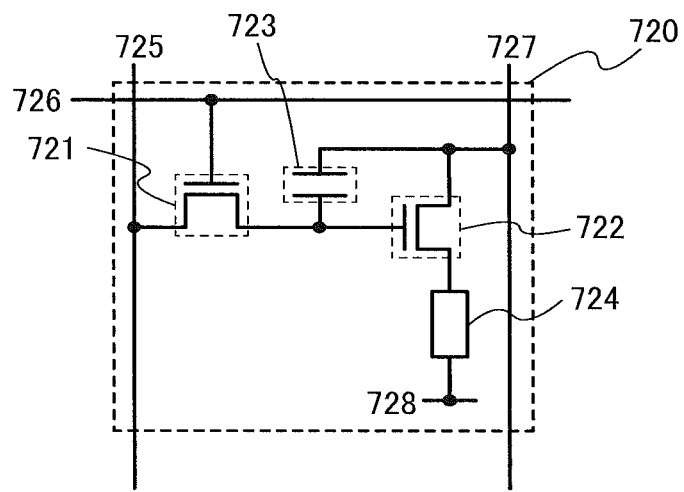

FIG. 32A is a top view of the display device of one embodiment of the present invention. FIG. 32B is a circuit diagram illustrating a pixel circuit that can be used in the case where a liquid crystal element is used in a pixel in the display device of one embodiment of the present invention. FIG. 32C is a circuit diagram illustrating a pixel circuit that can be used in the case where an organic EL element is used in a pixel in the display device of one embodiment of the present invention.

The transistor in the pixel portion can be formed in accordance with the above embodiment. The transistor can be easily formed as an n-channel transistor, and thus part of a driver circuit that can be formed using an n-channel transistor can be formed over the same substrate as the transistor of the pixel portion. With the use of any of the transistors described in the above embodiments for the pixel portion or the driver circuit in this manner, a highly reliable display device can be provided.

FIG. 32A illustrates an example of a top view of an active matrix display device. A pixel portion 701, a first scan line driver circuit 702, a second scan line driver circuit 703, and a signal line driver circuit 704 are formed over a substrate 700 of the display device. In the pixel portion 701, a plurality of signal lines extended from the signal line driver circuit 704 is arranged and a plurality of scan lines extended from the first scan line driver circuit 702 and the second scan line driver circuit 703 is arranged. Note that pixels which include display elements are provided in a matrix in respective regions where the scan lines and the signal lines intersect with each other. The substrate 700 of the display device is connected to a timing control circuit (also referred to as a controller or a controller IC) through a connection portion such as a flexible printed circuit (FPC).

In FIG. 32A, the first scan line driver circuit 702, the second scan line driver circuit 703, and the signal line driver circuit 704 are formed over the substrate 700 where the pixel portion 701 is formed. Accordingly, the number of components of a driver circuit and the like provided outside is reduced, so that a reduction in cost can be achieved. Furthermore, if the driver circuit is provided outside the substrate 700, wirings would need to be extended and the number of wiring connections would increase. When the driver circuit is provided over the substrate 700, the number of wiring connections can be reduced. Consequently, an improvement in reliability or yield can be achieved.

[Liquid Crystal Display Device]

FIG. 32B illustrates an example of a circuit configuration of the pixel. Here, a pixel circuit which is applicable to a pixel of a VA liquid crystal display device is illustrated as an example.

This pixel circuit can be applied to a structure in which one pixel includes a plurality of pixel electrode layers. The pixel electrode layers are connected to different transistors, and the transistors can be driven with different gate signals. Accordingly, signals applied to individual pixel electrode layers in a multi-domain pixel can be controlled independently.

A gate wiring 712 of a transistor 716 and a gate wiring 713 of a transistor 717 are separated so that different gate signals can be supplied thereto. In contrast, a data line 714 is shared by the transistors 716 and 717. The transistor described in any of the above embodiments can be used as appropriate as each of the transistors 716 and 717. Thus, a highly reliable liquid crystal display device can be provided.

The shapes of a first pixel electrode layer electrically connected to the transistor 716 and a second pixel electrode layer electrically connected to the transistor 717 are described. The first pixel electrode layer and the second pixel electrode layer are separated by a slit. The first pixel electrode layer has a V shape and the second pixel electrode layer is provided so as to surround the first pixel electrode layer.

A gate electrode of the transistor 716 is connected to the gate wiring 712, and a gate electrode of the transistor 717 is connected to the gate wiring 713. When different gate signals are supplied to the gate wiring 712 and the gate wiring 713, operation timings of the transistor 716 and the transistor 717 can be varied. As a result, alignment of liquid crystals can be controlled.

Further, a storage capacitor may be formed using a capacitor wiring 710, a gate insulating film functioning as a dielectric, and a capacitor electrode electrically connected to the first pixel electrode layer or the second pixel electrode layer.

The multi-domain pixel includes a first liquid crystal element 718 and a second liquid crystal element 719. The first liquid crystal element 718 includes the first pixel electrode layer, a counter electrode layer, and a liquid crystal layer therebetween. The second liquid crystal element 719 includes the second pixel electrode layer, a counter electrode layer, and a liquid crystal layer therebetween.

Note that a pixel circuit of the present invention is not limited to that shown in FIG. 32B. For example, a switch, a resistor, a capacitor, a transistor, a sensor, a logic circuit, or the like may be added to the pixel illustrated in FIG. 32B.

[Organic EL Display Device]

FIG. 32C illustrates another example of a circuit configuration of the pixel. Here, a pixel structure of a display device using an organic EL element is shown.

In an organic EL element, by application of voltage to a light-emitting element, electrons are injected from one of a pair of electrodes and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

FIG. 32C illustrates an applicable example of a pixel circuit. Here, one pixel includes two n-channel transistors. Note that a metal oxide film of one embodiment of the present invention can be used for channel formation regions of the n-channel transistors. Further, digital time grayscale driving can be employed for the pixel circuit.

The configuration of the applicable pixel circuit and operation of a pixel employing digital time grayscale driving are described.

A pixel 720 includes a switching transistor 721, a driver transistor 722, a light-emitting element 724, and a capacitor 723. A gate electrode layer of the switching transistor 721 is connected to a scan line 726, a first electrode (one of a source electrode layer and a drain electrode layer) of the switching transistor 721 is connected to a signal line 725, and a second electrode (the other of the source electrode layer and the drain electrode layer) of the switching transistor 721 is connected to a gate electrode layer of the driver transistor 722. The gate electrode layer of the driver transistor 722 is connected to a power supply line 727 through the capacitor 723, a first electrode of the driver transistor 722 is connected to the power supply line 727, and a second electrode of the driver transistor 722 is connected to a first electrode (a pixel electrode) of the light-emitting element 724. A second electrode of the light-emitting element 724 corresponds to a common electrode 728. The common electrode 728 is electrically connected to a common potential line formed over the same substrate as the common electrode 728.

As the switching transistor 721 and the driver transistor 722, the transistor described in any of the above embodiments can be used as appropriate. In this manner, a highly reliable organic EL display device can be provided.

The potential of the second electrode (the common electrode 728) of the light-emitting element 724 is set to be a low power supply potential. Note that the low power supply potential is lower than a high power supply potential supplied to the power supply line 727. For example, the low power supply potential can be GND, 0V, or the like. The high power supply potential and the low power supply potential are set to be higher than or equal to the forward threshold voltage of the light-emitting element 724, and the difference between the potentials is applied to the light-emitting element 724, whereby current is supplied to the light-emitting element 724, leading to light emission. The forward voltage of the light-emitting element 724 refers to a voltage at which a desired luminance is obtained, and includes at least a forward threshold voltage.

Note that gate capacitance of the driver transistor 722 may be used as a substitute for the capacitor 723, so that the capacitor 723 can be omitted. The gate capacitance of the driver transistor 722 may be formed between the channel formation region and the gate electrode layer.

Next, a signal input to the driver transistor 722 is described. In the case of a voltage-input voltage driving method, a video signal for sufficiently turning on or off the driver transistor 722 is input to the driver transistor 722. In order for the driver transistor 722 to operate in a linear region, voltage higher than the voltage of the power supply line 727 is applied to the gate electrode layer of the driver transistor 722. Note that voltage higher than or equal to voltage which is the sum of power supply line voltage and the threshold voltage Vth of the driver transistor 722 is applied to the signal line 725.

In the case of performing analog grayscale driving, voltage higher than or equal to voltage which is the sum of the forward voltage of the light-emitting element 724 and the threshold voltage Vth of the driver transistor 722 is applied to the gate electrode layer of the driver transistor 722. A video signal by which the driver transistor 722 operates in a saturation region is input, so that current is supplied to the light-emitting element 724. In order for the driver transistor 722 to operate in a saturation region, the potential of the power supply line 727 is set to be higher than the gate potential of the driver transistor 722. When an analog video signal is used, it is possible to supply current to the light-emitting element 724 in accordance with the video signal and perform analog grayscale driving.

Note that the configuration of the pixel circuit of the present invention is not limited to that shown in FIG. 32C. For example, a switch, a resistor, a capacitor, a sensor, a transistor, a logic circuit, or the like may be added to the pixel circuit illustrated in FIG. 32C.

In the case where the transistor shown in any of the above embodiments is used for the circuit shown in FIGS. 32A to 32C, the source electrode (the first electrode) is electrically connected to the low potential side and the drain electrode (the second electrode) is electrically connected to the high potential side. Furthermore, the potential of the first gate electrode may be controlled by a control circuit or the like and the potential described above as an example, e.g., a potential lower than the potential applied to the source electrode, may be input to the second gate electrode through a wiring that is not illustrated.

For example, in this specification and the like, a display element, a display device which is a device including a display element, a light-emitting element, and a light-emitting device which is a device including a light-emitting element can employ various modes or can include various elements. A display element, a display device, a light-emitting element, or a light-emitting device includes a display medium whose contrast, luminance, reflectance, transmittance, or the like is changed by electric or magnetic action. The display element, the display device, the light-emitting element, or the light-emitting device comprises at least one element such as an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a display element using micro electro mechanical system (MEMS), a digital micromirror device (DMD), a digital micro shutter (DMS), MIRASOL®, an interferometric modulator display (IMOD) element, a MEMS shutter display element, an optical-interference-type MEMS display element, an electrowetting element, a piezoelectric ceramic display, or a display element comprising a carbon nanotube. Note that examples of a display device including an EL element include an EL display. Examples of a display device including an electron emitter include a field emission display (FED) and an SED-type flat panel display (SED: surface-conduction electron-emitter display. Examples of a display device including a liquid crystal element include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, electronic liquid powder, or an electrophoretic element include electronic paper. In the case of a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

This embodiment can be combined as appropriate with any of the other embodiments and an example in this specification.

Embodiment 11

In this embodiment, a display module using a semiconductor device of one embodiment of the present invention is described with reference to FIG. 33.

Figure 33:
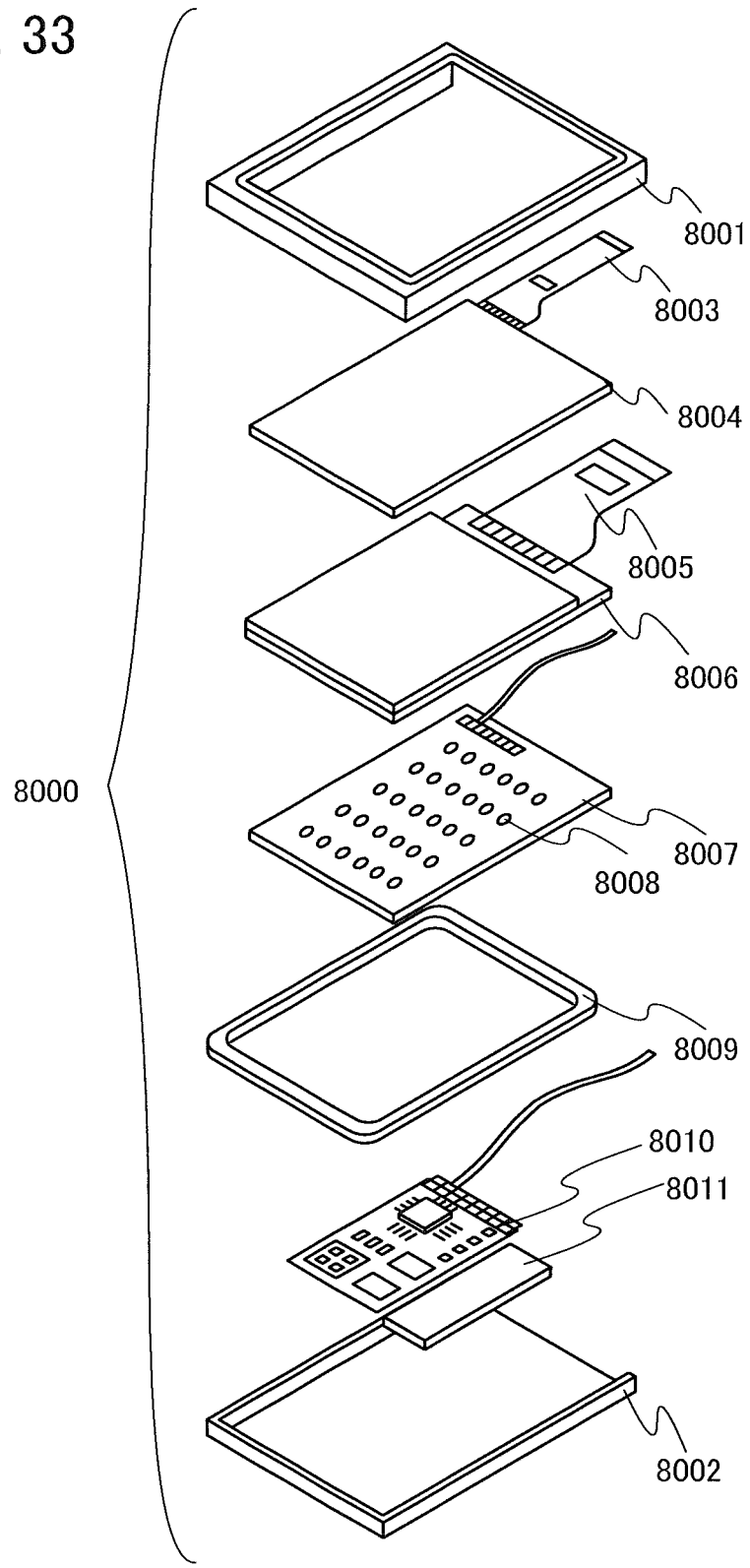
FIG. 33 illustrates a display module.

In a display module 8000 in FIG. 33, a touch panel 8004 connected to an FPC 8003, a display panel 8006 connected to an FPC 8005, a backlight unit 8007, a frame 8009, a printed board 8010, and a battery 8011 are provided between an upper cover 8001 and a lower cover 8002. Note that the backlight unit 8007, the battery 8011, the touch panel 8004, and the like are not provided in some cases.

The semiconductor device of one embodiment of the present invention can be used for the display panel 8006, for example.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and may be formed to overlap with the display panel 8006. A counter substrate (sealing substrate) of the display panel 8006 can have a touch panel function. A photosensor may be provided in each pixel of the display panel 8006 so that an optical touch panel is obtained. An electrode for a touch sensor may be provided in each pixel of the display panel 8006 so that a capacitive touch panel is obtained.

The backlight unit 8007 includes a light source 8008. The light source 8008 may be provided at an end portion of the backlight unit 8007 and a light diffusing plate may be used.

The frame 8009 protects the display panel 8006 and also functions as an electromagnetic shield for blocking electromagnetic waves generated by the operation of the printed board 8010. The frame 8009 may function as a radiator plate.

The printed board 8010 has a power supply circuit and a signal processing circuit for outputting a video signal and a clock signal. As a power source for supplying power to the power supply circuit, an external commercial power source or the battery 8011 provided separately may be used. Note that the battery 8011 is not necessary in the case where a commercial power source is used.

The display module 8000 can be additionally provided with a member such as a polarizing plate, a retardation plate, or a prism sheet.

This embodiment can be combined as appropriate with any of the other embodiments and an example in this specification.

Embodiment 12

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are mobile phones, game machines including portable game consoles, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 34A to 34F illustrate specific examples of these electronic devices.

Figure 34A:
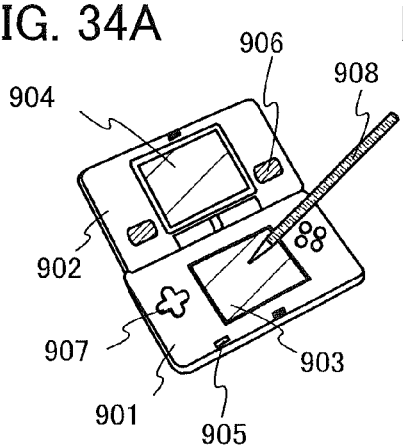
FIGS. 34A to 34F are diagrams illustrating electronic devices.

FIG. 34A illustrates a portable game console including a housing 901, a housing 902, a display portion 903, a display portion 904, a microphone 905, a speaker 906, an operation key 907, a stylus 908, and the like. Although the portable game machine in FIG. 34A has the two display portions 903 and 904, the number of display portions included in a portable game machine is not limited to this.

Figure 34B:
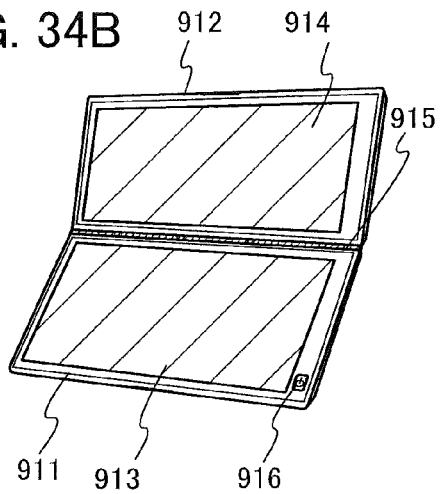

FIG. 34B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched depending on the angle between the first housing 911 and the second housing 912 at the joint 915. A display device with a position input function may be used as at least one of the first display portion 913 and the second display portion 914. Note that the position input function can be added by providing a touch panel in a display device.

Alternatively, the position input function can be added by provision of a photoelectric conversion element called a photosensor in a pixel portion of a display device.

Figure 34C:
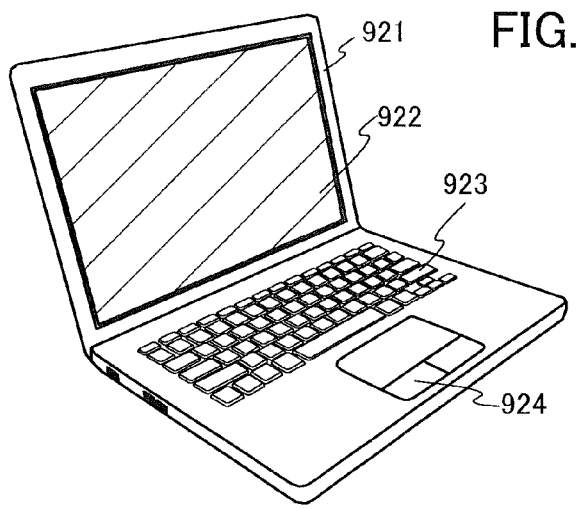

FIG. 34C illustrates a laptop personal computer, which includes a housing 921, a display portion 922, a keyboard 923, a pointing device 924, and the like.

Figure 34D:
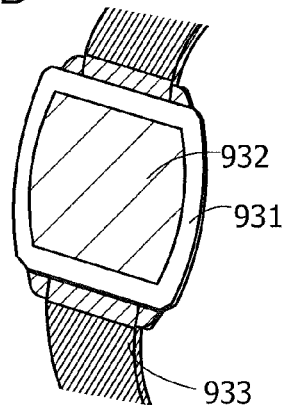

FIG. 34D illustrates a wrist-watch-type information terminal, which includes a housing 931, a display portion 932, a wristband 933, and the like. The display portion 932 may be a touch panel.

Figure 34E:
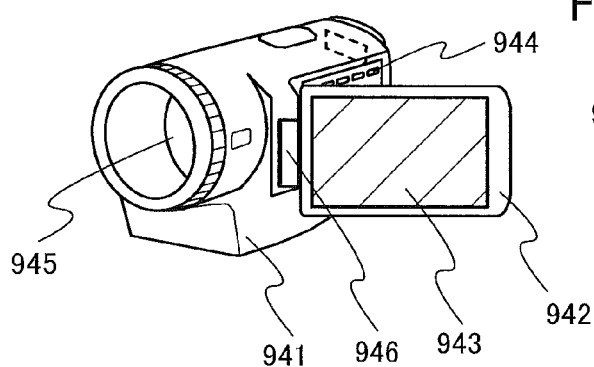

FIG. 34E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 34F:
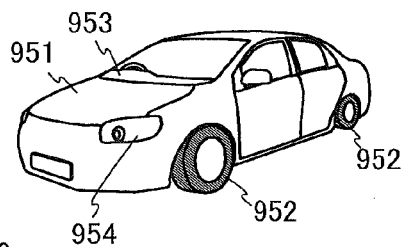
Figure 35A:
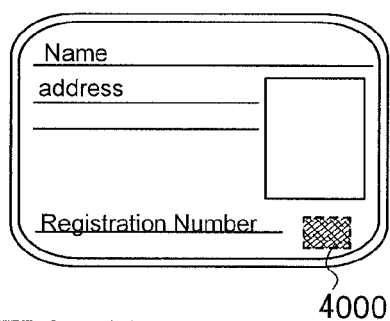
FIGS. 35A to 35F illustrate usage examples of an RF tag.
Figure 35B:
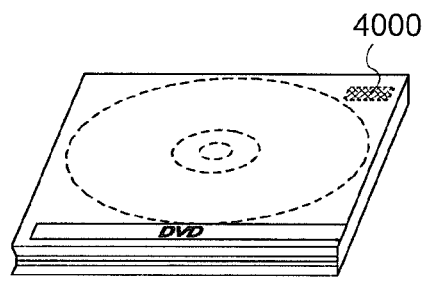
Figure 35C:
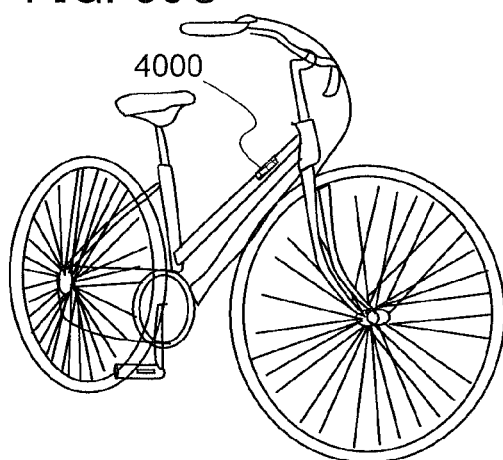
Figure 35D:
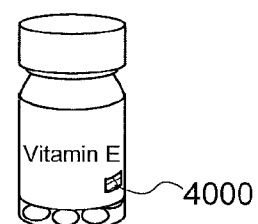
Figure 35E:
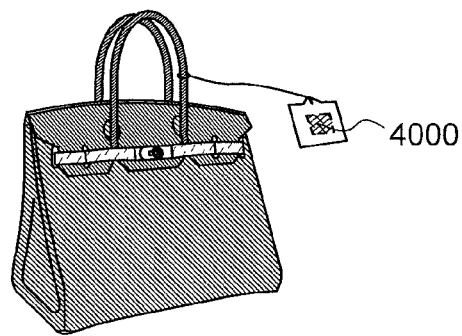
Figure 35F:
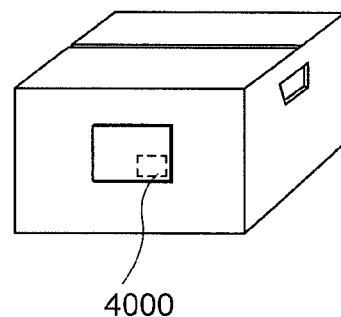

FIG. 34F illustrates an ordinary vehicle including a car body 951, wheels 952, a dashboard 953, lights 954, and the like.

This embodiment can be combined as appropriate with any of the other embodiments and an example in this specification.

Embodiment 13

In this embodiment, usage examples of an RF tag of one embodiment of the present invention will be described with reference to FIGS. 35A to 35F. The RF tag is widely used and can be provided for, for example, products such as bills, coins, securities, bearer bonds, documents (e.g., driver's licenses or resident's cards, see FIG. 35A), recording media (e.g., DVD or video tapes, see FIG. 35B), vehicles (e.g., bicycles, see FIG. 35C), packaging containers (e.g., wrapping paper or bottles, see FIG. 35D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 35E and 35F).

An RF tag 4000 of one embodiment of the present invention is fixed to a product by being attached to a surface thereof or embedded therein. For example, the RF tag 4000 is fixed to each product by being embedded in paper of a book, or embedded in an organic resin of a package. Since the RF tag 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF tag 4000 of one embodiment of the present invention, and the identification function can be utilized to prevent counterfeiting. Moreover, the efficiency of a system such as an inspection system can be improved by providing the RF tag of one embodiment of the present invention for packaging containers, recording media, personal belongings, foods, clothing, household goods, electronic devices, or the like. Vehicles can also have higher security against theft or the like by being provided with the RF tag of one embodiment of the present invention.

As described above, by using the RF tag of one embodiment of the present invention for each application described in this embodiment, power for operation such as writing or reading of data can be reduced, which results in an increase in the maximum communication distance. Moreover, data can be held for an extremely long period even in the state where power is not supplied; thus, the RF tag can be preferably used for application in which data is not frequently written or read.

This embodiment can be combined as appropriate with any of the other embodiments and an example in this specification.

Example

In this example, a transistor and samples for cross-sectional observation were fabricated and cross sections thereof were observed. The results are described below.

[Fabrication of Transistor and Sample]

The transistor and the samples each had the structure corresponding to the structure of the transistor 103 described in Embodiment 1. Note that each of the samples did not have the third oxide semiconductor layer 133 so that a layer corresponding to the second oxide semiconductor layer 132 was clearly observed. Samples 1 to 4 having different cross-sectional shapes in the channel width direction were fabricated.

A silicon wafer was used as a substrate. The silicon wafer was subjected to thermal oxidation, whereby a thermally oxidized film was formed. A silicon oxynitride film was faulted over the thermally oxidized film by a plasma CVD method.

Next, in the transistor, a first oxide semiconductor film having a thickness of approximately 10 nm and a second oxide semiconductor film having a thickness of approximately 40 nm were deposited in this order by a sputtering method. In each of the samples, a first oxide semiconductor film having a thickness of approximately 20 nm and a second oxide semiconductor film having a thickness of approximately 40 nm, 60 nm, or 90 nm were deposited in this order by a sputtering method. Note that the thicknesses were aimed values.

Then, a tungsten film and an organic resin were formed over the second oxide semiconductor film. A negative resist film was formed thereover, exposure was performed on the resist film by scanning of an electron beam, and then development treatment was performed. Thus, the resist film was patterned.

Then, the organic resin and the tungsten film were selectively etched using the resist film as a mask. An inductively coupled plasma dry etching apparatus was used for the etching.

Next, the resist film and the organic resin were removed by ashing. Then, the first oxide semiconductor film and the second oxide semiconductor film were selectively etched using the tungsten film as a mask, so that a stack including a first oxide semiconductor layer and a second oxide semiconductor layer was formed.

Next, the tungsten film was removed by etching treatment.

The samples were completed after this etching treatment. For observation, a carbon film and a platinum film were formed to cover the stack.

A method for fabricating the transistor is described below. After the etching treatment, a tungsten film was formed over the second oxide semiconductor film by a sputtering method. Then, a resist film pattern was formed over the tungsten film and a source electrode layer and a drain electrode layer were formed by selective etching.

Next, a third oxide semiconductor film having a thickness of 5 nm was formed over the stack including the first oxide semiconductor layer and the second oxide semiconductor layer by a sputtering method.

Next, a silicon oxynitride film to be a gate insulating film was formed over the third oxide semiconductor film by a plasma CVD method.

Then, a titanium nitride film and a tungsten film were successively formed by a sputtering method. After that, a resist film pattern was formed over the tungsten film.

Next, the titanium nitride film and the tungsten film were selectively etched with the use of the resist film, whereby a gate electrode layer was formed. In addition, the gate insulating film and the third oxide semiconductor film were etched with the use of the gate electrode layer as a mask; thus, a third oxide semiconductor layer was formed.

Next, an aluminum oxide film and a silicon oxynitride film were formed as insulating layers.

Through the above steps, the transistor and the samples 1 to 4 for cross-sectional observation were fabricated.

[Cross-Sectional Observation]

The cross sections of the fabricated transistor and samples 1 to 4 were observed with a scanning transmission electron microscope (STEM).

Figure 36:
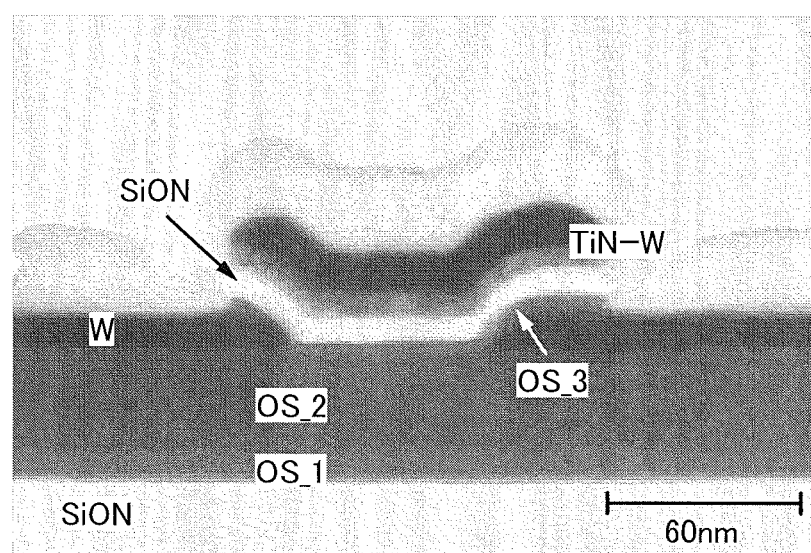
FIG. 36 is a cross-sectional TEM photograph of a transistor.

FIG. 36 shows a photograph of the cross section of the transistor (corresponding to the transistor 103) in the channel length direction. The photograph of the cross section corresponds to FIG. 8B.

FIGS. 37A to 37D are photographs of the cross sections of the samples 1 to 4 in the channel width direction. Each of the photographs of the cross sections corresponds to the cross-sectional view of FIG. 9A or the cross-sectional view of FIG. 9B. FIGS. 10A to 10D can be referred to for the detailed description of the cross-sectional shapes.

Figure 37A:
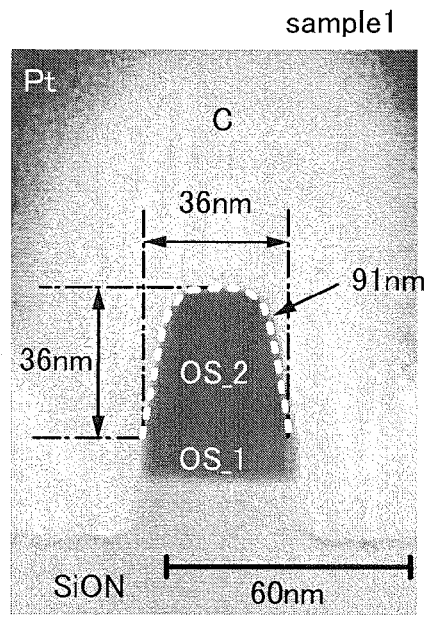
FIGS. 37A to 37D are cross-sectional TEM photographs of samples.

In the photograph of the cross section of the sample 1 shown in FIG. 37A, an approximately trapezoidal cross section is obtained by etching the second oxide semiconductor layer formed with an aimed thickness of 40 nm by the above method. The cross-sectional shape is close to the one in FIG. 10C.

In the photograph of the cross section, the length m of a region of the second oxide semiconductor layer, which is in contact with the first oxide semiconductor layer, is 36 nm, and the height n of the second oxide semiconductor layer is 36 nm. The length Q obtained by image processing of the photograph of the cross section of the sample 1 is 91 nm. Since the inequality 80.5 nm≤Q<108 nm and the inequality 80.5 nm≤Q≤92.2 nm are obtained from the formula (22) and the formula (23), respectively, the sample 1 has a shape suitable for a transistor of one embodiment of the present invention.

Figure 37B:
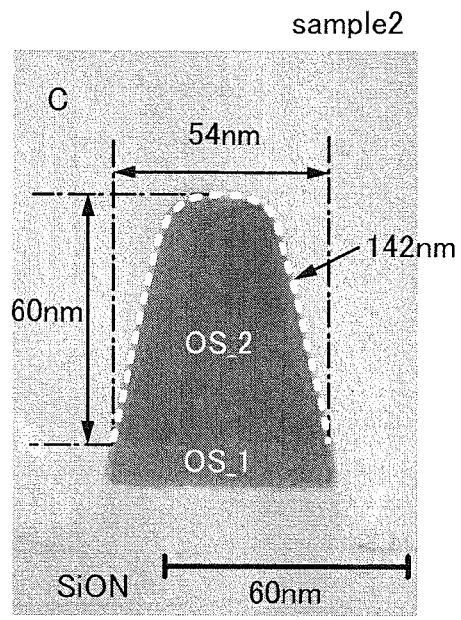

In the photograph of the cross section of the sample 2 shown in FIG. 37B, an approximately trapezoidal cross section is obtained by etching the second oxide semiconductor layer formed with an aimed thickness of 60 nm by the above method. The cross-sectional shape is close to the one in FIG. 10B.

In the photograph of the cross section, the length m of a region of the second oxide semiconductor layer, which is in contact with the first oxide semiconductor layer, is 54 nm, and the height n of the second oxide semiconductor layer is 60 nm. The length Q obtained by image processing of the photograph of the cross section of the sample 2 is 142 nm. Since the inequality 132 nm≤Q<153 nm and the inequality 132 nm≤Q≤145 nm are obtained from the formula (23) and the formula (24), respectively, the sample 2 has a shape suitable for a transistor of one embodiment of the present invention.

Figure 37C:
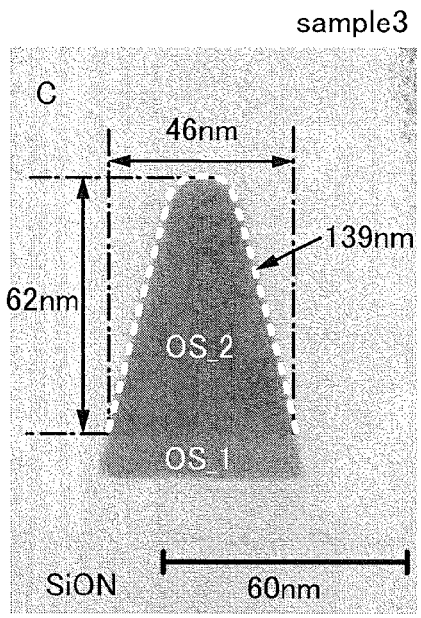

In the photograph of the cross section of the sample 3 shown in FIG. 37C, an approximately triangular cross section is obtained by etching the second oxide semiconductor layer formed with an aimed thickness of 60 nm by the above method. The cross-sectional shape is close to the one in FIG. 10A.

In the photograph of the cross section, the length in of a region of the second oxide semiconductor layer, which is in contact with the first oxide semiconductor layer, is 46 nm, and the height n of the second oxide semiconductor layer is 62 nm. The length Q obtained by image processing of the photograph of the cross section of the sample 3 is 139 nm. Since the inequality 132 nm≤Q≤143 nm is obtained from the formula (24), the sample 3 has a shape suitable for a transistor of one embodiment of the present invention.

Figure 37D:
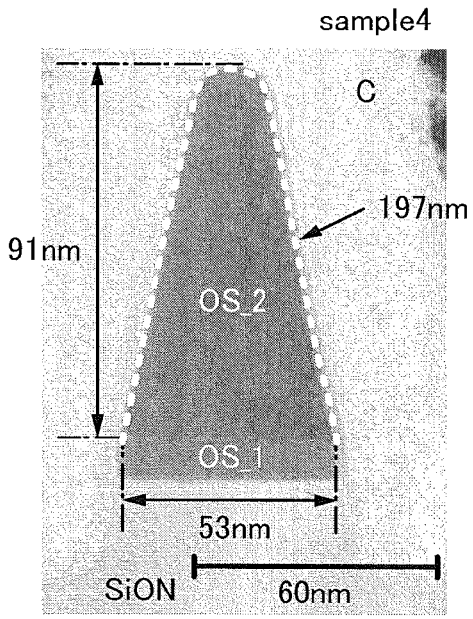

In the photograph of the cross section of the sample 4 shown in FIG. 37D, an approximately triangular cross section is obtained by etching the second oxide semiconductor layer formed with an aimed thickness of 90 nm by the above method. The cross-sectional shape is close to the one in FIG. 10A.

In the photograph of the cross section, the length m of a region of the second oxide semiconductor layer, which is in contact with the first oxide semiconductor layer, is 53 nm, and the height n of the second oxide semiconductor layer is 91 nm. The length Q obtained by image processing of the photograph of the cross section of the sample 4 is 197 nm. Since the inequality 189 nm≤Q≤203 nm is obtained from the formula (24), the sample 4 has a shape suitable for a transistor of one embodiment of the present invention.

The above results of this example prove that a transistor of one embodiment of the present invention can be actually fabricated.

This example can be combined as appropriate with any of the other embodiments in this specification.

This application is based on Japanese Patent Application serial no. 2013-261600 filed with Japan Patent Office on Dec. 18, 2013, the entire contents of which are hereby incorporated by reference.

What is claimed is:
1. A semiconductor device comprising:
an insulating layer;
an oxide semiconductor layer on the insulating layer;
a source electrode layer and a drain electrode layer on and in electrical contact with the oxide semiconductor layer;
a gate insulating film over the oxide semiconductor layer; and
a gate electrode layer over the oxide semiconductor layer, the gate insulating film being interposed between the gate electrode layer and the oxide semiconductor layer,
wherein, in a portion of the oxide semiconductor layer located between the source electrode layer and the drain electrode layer and overlapping with the gate electrode layer, a length D of a region where the oxide semiconductor layer and the gate insulating film are in contact with each other as seen in a cross section of the oxide semiconductor layer in a channel width direction is in a range expressed by the formula

$$2\sqrt{(a/2)^2+b^2} \leq D < a+2b,$$

wherein a is a length of a side of the oxide semiconductor layer in contact with the insulating layer as seen in the cross section of the oxide semiconductor layer in the channel width direction, wherein b is a height of the oxide semiconductor layer as seen in the cross section of the oxide semiconductor layer in the channel width direction, and wherein b is equal to or greater than a.

2. The semiconductor device according to claim 1, wherein the length a of the side of the oxide semiconductor layer in contact with the insulating layer is longer than 10 nm and shorter than or equal to 100 nm.

3. The semiconductor device according to claim 1, wherein the height b of the oxide semiconductor layer is greater than or equal to 10 nm and less than or equal to 200 nm.

4. The semiconductor device according to claim 1, wherein the oxide semiconductor layer is a c-axis aligned crystalline oxide semiconductor film.

5. A semiconductor device comprising:

an insulating layer;

a stack comprising a first oxide layer, a second oxide layer, and a third oxide layer formed in this order on the insulating layer, the third oxide layer being in contact with the second oxide layer;

a source electrode layer and a drain electrode layer on and in electrical contact with the second oxide layer;

a gate insulating film over the stack, the source electrode layer, and the drain electrode layer, the gate insulating film being in contact with the second oxide layer; and a gate electrode layer over the stack with the gate insulating film interposed between the gate electrode layer and the stack, wherein, in a portion of the stack located between the source electrode layer and the drain electrode layer and overlapping with the gate electrode layer, a length J of a region where the second oxide layer is in contact with the gate insulating film or the third oxide layer as seen in a cross section of the stack in a channel width direction is in a range expressed by the formula $$2\sqrt{(f/2)^2+g^2} < J < f + 2g,$$

wherein f is a length of a side of the second oxide layer in contact with the first oxide layer as seen in the cross section of the stack in the channel width direction, wherein g is a height of the second oxide layer as seen in the cross section of the stack in the channel width direction, and wherein g is equal to or greater than f, wherein the second oxide layer is a second oxide semiconductor layer.

6. The semiconductor device according to claim 5, wherein the length f of the side of the second oxide layer in contact with the first oxide layer is longer than 10 nm and shorter than or equal to 100 nm.

7. The semiconductor device according to claim 5, wherein the height g of the second oxide layer is greater than or equal to 10 nm and less than or equal to 200 nm.

8. The semiconductor device according to claim 5, wherein the first oxide layer and the third oxide layer are a first oxide semiconductor layer and a third oxide semiconductor layer, respectively.

9. The semiconductor device according to claim 5, wherein each of the first, the second, and the third oxide layers comprises an In-M-Zn oxide, wherein M is Al, Ti, Ga, Sn, Y, Zr, La, Ce, Nd, or Hf, and wherein an atomic ratio of M to In in each of the first and the third oxide layers is higher than an atomic ratio of M to In in the second oxide layer.

10. The semiconductor device according to claim 5, wherein each of the first, the second, and the third oxide layers is a c-axis aligned crystalline oxide semiconductor film.

11. A semiconductor device comprising:

an insulating layer;

a stack comprising a first oxide layer and a second oxide layer formed in this order on the insulating layer;

a source electrode layer and a drain electrode layer on and in electrical with the stack;

a third oxide layer over the stack, the source electrode layer, and the drain electrode layer, the third oxide layer being in contact with the second oxide layer; and a gate insulating film and a gate electrode layer each overlapping with the stack, wherein, in a portion of the stack overlapping with the gate electrode layer between the source electrode layer and the drain electrode layer, a length Q of a region where the second oxide layer and the third oxide layer are in contact with each other as seen in a cross section of the stack in a channel width direction is in a range expressed by the formula $$2\sqrt{(m/2)^2+n^2} \le Q < m+2n,$$

wherein m is a length of a side of the second oxide layer in contact with the first oxide layer as seen in the cross section of the stack in the channel width direction, wherein n is a height of the second oxide layer as seen in the cross section of the stack in the channel width direction, and wherein n is equal to or greater than m, wherein the second oxide layer is a second oxide semiconductor layer.

12. The semiconductor device according to claim 11, wherein the third oxide layer covers a top side and a side edge of the second oxide layer and a side edge of the first oxide layer.

13. The semiconductor device according to claim 11, wherein the length m of the side of the second oxide layer in contact with the first oxide layer is longer than 10 nm and shorter than or equal to 100 nm.

14. The semiconductor device according to claim 11, wherein the height n of the second oxide layer is greater than or equal to 10 nm and less than or equal to 200 nm.

15. The semiconductor device according to claim 11, wherein the first oxide layer and the third oxide layer are a first oxide semiconductor layer and a third oxide semiconductor layer, respectively.

16. The semiconductor device according to claim 11, wherein each of the first, the second, and the third oxide layers comprises an In-M-Zn oxide, wherein M is Al, Ti, Ga, Sn, Y, Zr, La, Ce, Nd, or Hf, and wherein an atomic ratio of M to In in each of the first and the third oxide layers is higher than an atomic ratio of M to In in the second oxide layer.

17. The semiconductor device according to claim 11, wherein each of the first, the second, and the third oxide layers is a c-axis aligned crystalline oxide semiconductor film.

18. A semiconductor device comprising:
a first gate electrode layer;
an insulating layer over the first gate electrode layer;
a semiconductor layer on the insulating layer;
a source electrode layer and a drain electrode layer in electrical contact with the semiconductor layer;
a gate insulating film over the semiconductor layer; and
a second gate electrode layer over the semiconductor layer, the gate insulating film being interposed between the second gate electrode layer and the semiconductor layer,
wherein the semiconductor layer and each of the source electrode layer and the drain electrode layer overlap with each other,
wherein, in a portion of the semiconductor layer located between the source electrode layer and the drain electrode layer and overlapping with the second gate electrode layer, a length D of a region where the semiconductor layer and the gate insulating film are in contact with each other as seen in a cross section of the semiconductor layer in a channel width direction is in a range expressed by the formula $$2\sqrt{(a/2)^2 + b^2} \leq D < a + 2b,$$

wherein a is a length of a side of the semiconductor layer in contact with the insulating layer as seen in the cross section of the semiconductor layer in the channel width direction,
wherein b is a height of the semiconductor layer as seen in the cross section of the semiconductor layer in the channel width direction, and
wherein b is equal to or greater than a.

19. The semiconductor device according to claim 18, wherein the semiconductor layer is an oxide semiconductor layer.

20. The semiconductor device according to claim 18, wherein the length a of the side of the semiconductor layer in contact with the insulating layer is longer than 10 nm and shorter than or equal to 100 nm.

21. The semiconductor device according to claim 18, wherein the height b of the semiconductor layer is greater than or equal to 10 nm and less than or equal to 200 nm.

22. The semiconductor device according to claim 18, wherein the semiconductor layer is a c-axis aligned crystalline oxide semiconductor film.

* * * * *